US006829269B2

(12) United States Patent
Goodhue et al.

(10) Patent No.: US 6,829,269 B2
(45) Date of Patent: Dec. 7, 2004

(54) SYSTEMS AND METHODS USING PHONON MEDIATED INTERSUBBAND LASER

(75) Inventors: William D. Goodhue, Chelmsford, MA (US); L. Ramdas Ram-Mohan, Northborough, MA (US); Aram Karakashian, Waltham, MA (US); Vinod Menon, Lawrenceville, NJ (US)

(73) Assignees: University of Massachusetts, Lowell, MA (US); Worcester Polytechnic Institute, Worcester, MA (US)

( * ) Notice: Subject to any disclaimer, the term of this patent is extended or adjusted under 35 U.S.C. 154(b) by 146 days.

(21) Appl. No.: 10/153,225

(22) Filed: May 21, 2002

(65) Prior Publication Data

US 2003/0219052 A1 Nov. 27, 2003

(51) Int. Cl.[7] ............................................... H01S 5/00
(52) U.S. Cl. ................................. 372/43; 372/33
(58) Field of Search ........................... 372/33, 43, 54, 372/45, 46

(56) References Cited

U.S. PATENT DOCUMENTS

| | | | |
|---|---|---|---|
| 3,624,553 A | 11/1971 | Van-Tran | 331/94.5 |
| 4,333,242 A | 6/1982 | Genho, Sr. | 33/227 |
| 4,571,727 A | 2/1986 | Nishizawa et al. | 372/4 |
| 5,101,414 A | 3/1992 | Schilling et al. | 372/50 |
| 5,105,248 A | 4/1992 | Burke et al. | 357/24 |
| 5,457,709 A | 10/1995 | Capasso et al. | 372/45 |

(List continued on next page.)

FOREIGN PATENT DOCUMENTS

| | | |
|---|---|---|
| EP | 1 107 044 A1 | 6/2001 |
| JP | 10321965 A | 12/1998 |
| JP | 11074608 A | 3/1999 |
| WO | WO 96/25767 | 8/1996 |
| WO | WO 99/57586 | 11/1999 |

OTHER PUBLICATIONS

Brown, E.R., et al., "Coherent millimeter–wave generation by heterodyne conversion in low–temperature–grown GaAs photoconductors," *J. Applied Physics*, 73:1480 (1993).
Faist, J., et al., "Quantum Cascade Laser," *Science* 264, 553, (1994).
Hovenier, J.N. et al., "Mode–locked operation of the copper–doped germanium terahertz laser," *Applied Physics Letters*, 77:3155 (2000).
Köhler, R., et al., "Design and simulation of terahertz quantum cascade lasers," *Applied Physics Letter*, 79(24):3920 (2001).

(List continued on next page.)

*Primary Examiner*—Don Wong
*Assistant Examiner*—Leith A Al-Nazer
(74) *Attorney, Agent, or Firm*—Bowditch & Dewey, LLP

(57) ABSTRACT

The present invention is directed to the development of compact, coherent sources emitting in the terahertz frequency region using interface phonons. In accordance with a preferred embodiment, a semiconductor heterostructure light emitting device includes a quantum cascade structure having at least an upper lasing level and a lower lasing level. The system uses heterostructure interface phonon bands to depopulate the lower lasing level of at least a three level semiconductor device. The device includes multiple coupled quantum well modules. In alternate preferred embodiments, the device includes quantum dot layers and/or, quantum wire structures, and/or mini-bands in a superlattice, for example, GaAs/AlGaAs superlattice. The phonons in the device improve efficiency, decrease the threshold current and result in system temperatures that are as high as room temperature. The semiconductor device provides emission of terahertz radiation. In a preferred embodiment the semiconductor device provides at least one emission in the terahertz radiation region and in a far infrared region of the electromagnetic spectrum. The emissions include a first emission having a first energy level and a second emission having a second energy level.

32 Claims, 55 Drawing Sheets

U.S. PATENT DOCUMENTS

| | | | | |
|---|---|---|---|---|
| 5,509,024 | A | | 4/1996 | Bour et al. ............. 372/45 |
| 5,535,232 | A | | 7/1996 | Bowman et al. ............. 372/70 |
| 5,570,386 | A | | 10/1996 | Capasso et al. ............. 372/46 |
| 5,627,383 | A | | 5/1997 | Cunningham et al. ......... 257/17 |
| 5,692,003 | A | | 11/1997 | Wingreen et al. ............. 372/50 |
| 5,745,576 | A | | 4/1998 | Abraham et al. ............. 380/25 |
| 5,784,397 | A | | 7/1998 | Kim et al. ............. 372/43 |
| 5,859,866 | A | | 1/1999 | Forrest et al. ............. 372/50 |
| 5,872,016 | A | | 2/1999 | Cunningham et al. ...... 437/107 |
| 5,904,492 | A | | 5/1999 | Min et al. ............. 438/42 |
| 5,936,989 | A | | 8/1999 | Capasso et al. ............. 372/45 |
| 5,953,356 | A | * | 9/1999 | Botez et al. ............. 372/45 |
| 5,963,571 | A | | 10/1999 | Wingreen ............. 372/45 |
| 5,978,397 | A | | 11/1999 | Capasso et al. ............. 372/45 |
| 6,011,810 | A | | 1/2000 | Haller et al. ............. 372/45 |
| 6,028,323 | A | | 2/2000 | Liu ............. 257/21 |
| 6,047,013 | A | | 4/2000 | Payne et al. ............. 372/41 |
| 6,055,257 | A | | 4/2000 | Baillargeon et al. ......... 372/46 |
| 6,108,360 | A | | 8/2000 | Razeghi ............. 372/45 |
| 6,130,466 | A | | 10/2000 | Schneider et al. ......... 257/440 |
| 6,137,817 | A | | 10/2000 | Baillargeon et al. ......... 372/45 |
| 6,141,365 | A | | 10/2000 | Bowler ............. 372/46 |
| 6,144,679 | A | * | 11/2000 | Herman et al. ............. 372/21 |
| 6,144,681 | A | | 11/2000 | Capasso et al. ............. 372/45 |
| 6,148,012 | A | | 11/2000 | Capasso et al. ............. 372/45 |
| 6,154,475 | A | * | 11/2000 | Soref et al. ............. 372/45 |
| 6,252,665 | B1 | | 6/2001 | Williams et al. ............. 356/450 |
| 6,301,282 | B1 | | 10/2001 | Capasso et al. ............. 372/46 |
| 6,472,683 | B1 | * | 10/2002 | Li ............. 257/25 |
| 6,621,841 | B1 | * | 9/2003 | Soref et al. ............. 372/43 |
| 2001/0053608 | A1 | | 12/2001 | Williams et al. ............. 438/706 |
| 2002/0009258 | A1 | | 1/2002 | Coldren et al. ............. 385/24 |

OTHER PUBLICATIONS

Koehler, R., et al., "THz Quantum Cascade Laser," Session M8 Abstract presented at *Focus Session: Terahertz Technologies for Sensing and Communication*, Wednesday morning, Mar. 20, Sagamore 7, Indiana Convention Center.

Massie, S. "Intersubband Quantum Ingrared Laser Development," (Grant No. 28355 SBIR) Quantum Epitaxial Designs, Inc. (Abstract).

Menon, V.M, et al., "Phonon mediated lifetimes in intersubband terahertz lasers," Journal of Applied Physics, 88(9):5262–5267, Nov. 1, 2000.

Rochat, M., et al., "Far–infrared ($\lambda=88\mu m$) electroluminescence in a quantum cascade structure," *Applied Physics Letter*, 73:3724 (1998).

Ulrich, J. et al., "Magnetic–field–enhanced quantum–cascade emission," *Applied Physics Letter*, 76:19(1999).

Unterrainer, K., et al., "Single Mode Operation of the p–Ge FIR Laser," *Infrared Physics*, 29:357 (1989).

Unterrainer, K., et al., "Inverse Bloch Oscillator: Strong Terahertz–Photocurrent Resonances at the Bloch Frequency," *Physics Rev. Letter*, 76:2973 (1996).

Urban, M., "Third harmonic generation of high power far ingrared radiation in semiconductors," (Report No. LRP–546/96) Ecole Polytechnique Federale Lausanne (Switzerland). Center of Recherches and Physique des Plasmas. (Abstract).

Williams, B.S., et al., "Narrow–linedwidth terahertz intersubband emission from three–level systems," *Applied Physics Letter*, 75:2927 (1999).

Williams, B., and Hu, Q., "Optimized energy separation for phonon scattering in three–level terahertz intersubband lasers," *J. of Applied Physics*, 90(11):5504 (2001).

Xu, B., et al., "Electrically pumped tunable terahertz emitter based on intersubband transition," *Applied Physics Letter*, 71(4):440 (1997).

\* cited by examiner

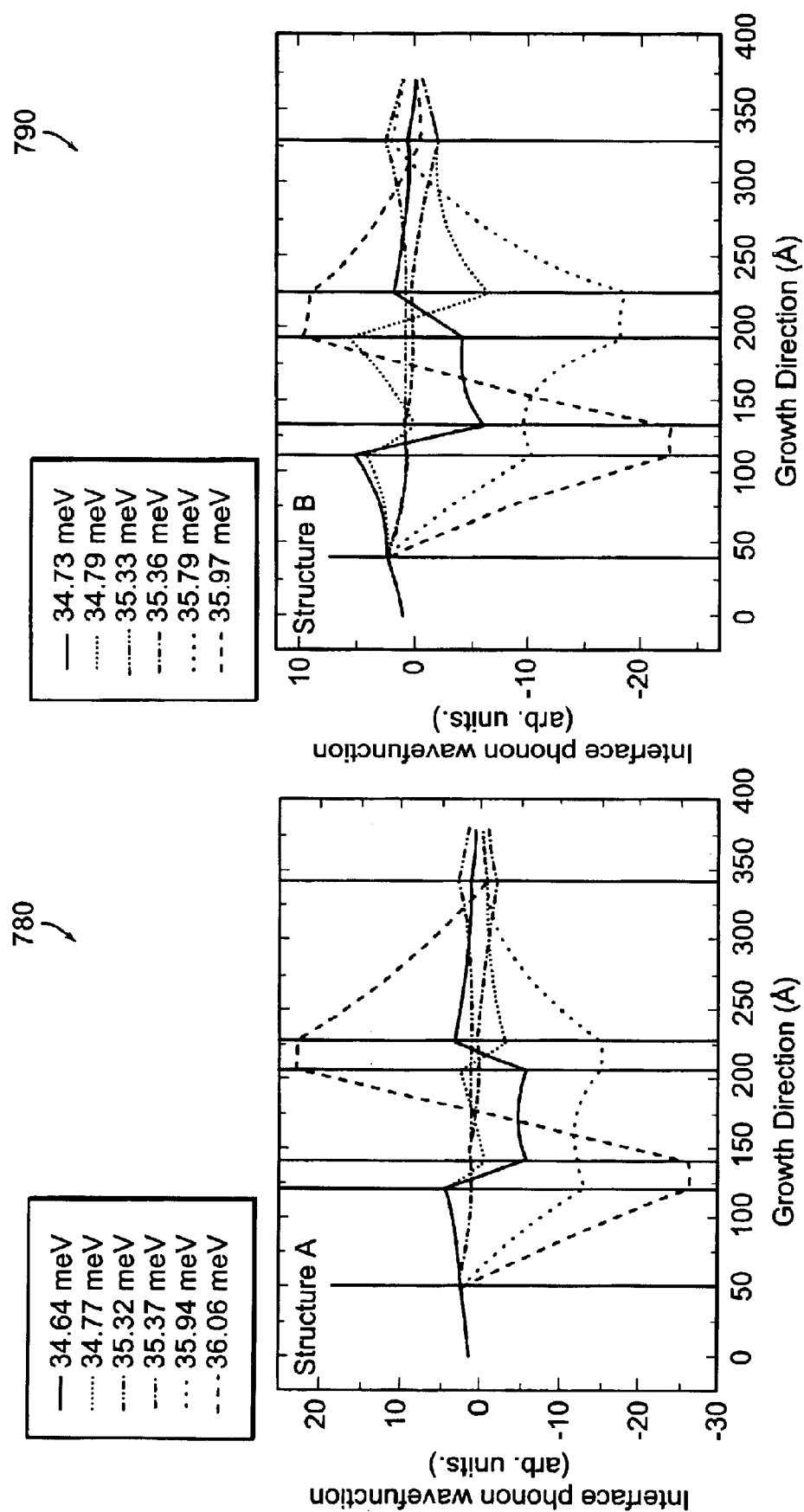

SYSTEMS AND METHODS USING PHONON MEDIATED INTERSUBBAND LASER

BACKGROUND OF THE INVENTION

The physics of low dimensional electronic systems, for example, up to two dimensions, has been an active area of research for the past 25 years. Broad interest in these systems has risen because of a wealth of fundamental scientific discoveries, which have been turned into technological applications. Several extremely successful optoelectronic and photonic devices such as the quantum well diode laser, quantum well detector and quantum well light emitting diodes (LED) are important examples of the research. The feasibility of fabricating such quantum heterostructures has been in part due to the advancement of Molecular Beam Epitaxy (MBE) technology, which enables control of semiconductor layer thickness formation to one atomic monolayer accuracy (~2.56 Å in GaAs).

Quantum cascade lasers (QCL) since their first experimental demonstration in 1994 have exemplified remarkable progress and have since then, instilled immense amount of research activity in that area. The QCLs have been successfully operated in the 5–24 $\mu$m range of the electromagnetic spectrum. However, there still remains the problem of extending the operating frequency of the cascade lasers into the terahertz (THz) range which is extremely challenging due to the highly efficient non-radiative electron-electron (e-e) scattering and large waveguide losses. As a first step towards the development of such an intersubband THz laser, THz electroluminescence from cascade structures has been observed.

Dual frequency lasing from cascade devices have been reported earlier using various schemes such as, tuning the oscillator strength of the radiative transition, using superlattice structures capable of emitting photons at two frequencies, and more recently using heterogeneous cascade structures. These have been in the mid infrared range of the spectrum.

Intersubband transition energies can vary anywhere between a few milli-electron volt (meV) to a few hundred meV depending on the choice of the material system, making them the most suitable candidates for developing devices all the way from near to far infrared (THz). The first experimental evidence of intersubband absorption in quantum wells was demonstrated by West and Eglash in a GaAs/AlGaAs material system. Following this, interest in intersubband transitions grew extensively both for developing detectors as well as emitters, for example, there are detectors referred to as Quantum Well Infrared Photodetector (QWIPs). The interest in emitters grew slowly but steadily until the first demonstration of the quantum cascade laser in 1994. This was the first evidence of electromagnetic emission based on intersubband transitions. Lasers for either extending the wavelength or for better operational characteristics have received a large degree of interest.

There still remains a need to provide emissions in the terahertz frequency range and for producing infrared radiation using compact coherent sources.

SUMMARY OF THE INVENTION

The present invention is directed to the development of compact, coherent sources emitting in the terahertz frequency region using interface phonons. In accordance with a preferred embodiment, a semiconductor heterostructure light emitting device includes a quantum cascade structure having at least an upper lasing level and a lower lasing level. The system uses heterostructure interface phonon bands to depopulate the lower lasing level of at least a three level semiconductor device. The device includes multiple coupled quantum well modules. In alternate preferred embodiments, the device includes quantum dot layers and/or, quantum wire structures, and/or mini-bands in a superlattice, for example, GaAs/AlGaAs superlattice. The phonons in the device improve efficiency, decrease the threshold current and result in system temperatures that are as high as room temperature. The semiconductor device provides emission of terahertz radiation.

In a preferred embodiment the semiconductor device provides at least one emission in the terahertz radiation region and in a far infrared region of the electromagnetic spectrum. The emissions include a first emission having a first energy level and a second emission having a second energy level.

In an alternate preferred embodiment, the semiconductor device includes quantum cascade emitters embedded in a structure having photonic crystals. The semiconductor device can include at least one plasma reflector to confine device emissions.

In preferred embodiments, the threshold current of the device ranges between 0.001 amps/cm$^2$ and 100,000 amps/cm$^2$. The device is portable and preferably weighs less than 5 pounds. The emitter weighs approximately less than one ounce and the support structure weighs less than 5 pounds.

The terahertz (THz) frequency range (1–10 THz or 30–300 $\mu$m wavelength or preferably wavelengths between 60–300 $\mu$m) has potential applications in spectroscopy, astronomy, biological imaging, exo-atmospheric radar systems, and free space communication. THz spectroscopic techniques may accurately identify chemical and biological substances agents.

In preferred embodiments, quantum cascade THz emitters are fabricated to provide emissions at 4.2 THz (17.5 meV) and 2.9 THz (12 meV) with Full Width at Half Maximum (FWHM) of 2.01 meV and 0.75 meV from two structures, respectively, at a temperature of T=10 K. Further, the corresponding applied biases agree well with the theoretically predicted values. Also dual wavelength emission is observed from one preferred embodiment.

In a preferred embodiment, the structures can be grown by solid source MBE such as, for example, in a RIBER 32 system. Post-growth fabrication includes photolithography, electron-beam deposition and rapid thermal annealing. Ni/Ge/Au gratings are deposited on the surface of the structure to couple the radiation out of the structure. These gratings also act as the top contact for the device.

The characterizations can be performed using a Bruker IFS 66 V FTIR spectrometer in the step scan mode. A Si bolometer may be used to detect the signal. The structures are placed in a variable temperature cryostat capable of going down to liquid He temperatures. Emission spectra are taken at different temperatures and bias voltages.

Intersubband absorption measurements are performed at room temperature on a multiple quantum well structure using the Brewster angle geometry. A Lorentzian fit to the absorption data indicates a full width at half maximum of 1.59 meV, which gives a lifetime of 0.83 ps. This is close to the phonon mediated lifetimes calculated theoretically for such a structure (0.75 ps).

In another preferred embodiment, resonator geometries are used, like a stadium shaped resonator or an elliptical resonator, to increase the emission.

In a preferred embodiment, absorption due to interface phonons is observed in two different structures at theoretically predicted frequencies. This result necessitates consideration of the effects of confinement on the phonon modes in layered heterostructures.

In a preferred embodiment, at THz frequencies, the dominant nonradiative mechanism is the electron-electron scattering at low temperatures. This rate is found to be proportional to the upper subband population and can become as high as 10 $ps^{-1}$ for realistic subband densities. A five-fold increase in the peak gain with lower injection current is observed using a preferred embodiment design. Wavefunction engineering and phonon wavefunction engineering are employed to enhance device performance in preferred embodiments.

In preferred embodiments, terahertz intersubband emission from GaAs/AlGaAs quantum cascade structures employing interface phonons for depopulation is observed. Emission is observed at 12.0 meV (2.9 THz) and 17.5 meV (4.2 THz) with full width at half maximum of 0.7 meV and 1.6 meV, respectively, at a temperature T=10 K from two different structures. The structures consisted of 40 periods of the quantum cascade module and rely on spatially diagonal (interwell) transition for the terahertz emission. In a preferred embodiment, the emission frequency can be tuned using the quantum confined Stark effect.

Semiconductor lasers emitting in the terahertz region of the electromagnetic spectrum can be used for gas sensors or chemical analysis. In this embodiment a detector system is used to collect radiation that is transmitted through or reflected from a medium being analyzed.

The foregoing and other features and advantages of the systems and methods for using phonon mediated intersubband laser will be apparent from the following more particular description of preferred embodiments of the system and method as illustrated in the accompanying drawings in which like reference characters refer to the same parts throughout the different views.

BRIEF DESCRIPTION OF THE DRAWINGS

FIGS. 23A and 23B graphically illustrate for structure A and structure B the upper GaAs-like IF phonon wavefunctions as a function of position in accordance with a preferred embodiment of the present invention.

The drawings are not necessarily to scale, emphasis instead being placed upon illustrating the principles of the invention.

DETAILED DESCRIPTION OF THE INVENTION

Figure 1:
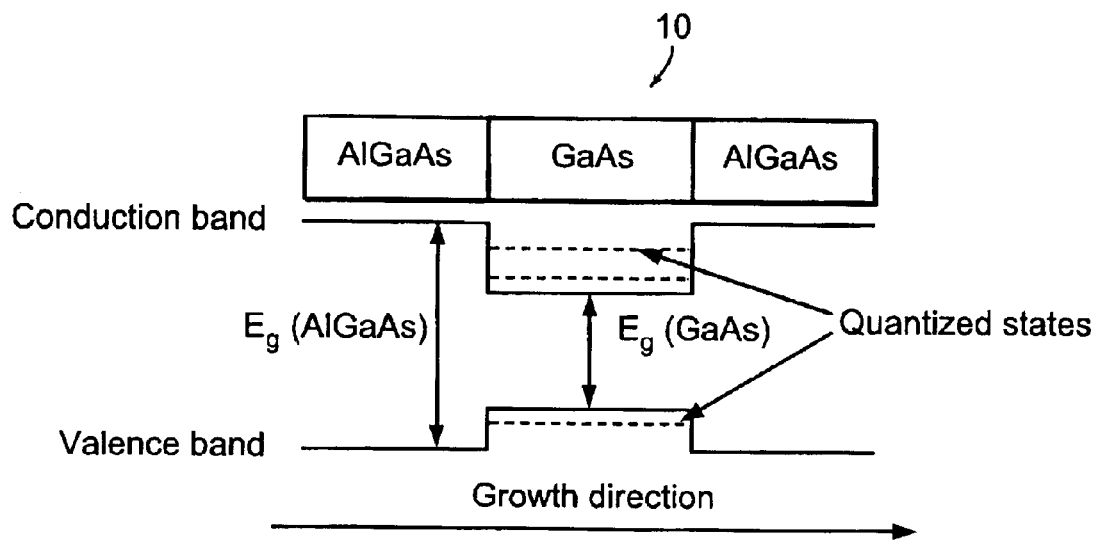
FIG. 1 is a schematic diagram of type I quantum well in a GaAs/AlGaAs material system, in accordance with a preferred embodiment of the present invention.

A quantum well is an example of a low dimensional system that provides confinement to the carriers along one dimension. A thin layer of a semiconductor material is sandwiched between two layers having a larger bandgap as shown in FIG. 1. The carriers in the quantized states in the conduction band are electrons and those in the valence bands are holes. A larger bandgap material, aluminum gallium arsenide (AlGaAs) is used to sandwich the smaller bandgap material, gallium arsenide (GaAs), creating conduction and valence band quantum wells in the GaAs layer when the GaAs layer thickness is less than ~50 nm. Thus, both electrons and holes can be confined along the growth direction depending on the relative band offsets of the two-semiconductor materials. Furthermore, the energy levels can be manipulated by varying the quantum well thickness as well as the barrier heights of the cladding layers, which depend on their material composition.

Intersubband transitions describe optical transitions between quantum confined energy levels within the same band (conduction or valence). FIG. 1 shows the quantized subband states within the conduction and valence band. Intersubband transitions can be either radiative or nonradiative. The dominant nonradiative mechanisms involved are longitudinal optic (LO) phonon, carrier-carrier, and acoustic phonons. The dominant mechanism that results in the transition depends on the subband energy spacing, temperature, and material composition.

A proposal to amplify intersubband transitions in quantum wells and thereby attain lasing was made by Kazarinov and Suris in 1971. Twenty-three years later, Capasso and coworkers at Bell Laboratories made the first prototype intersubband laser emitting in the mid-infrared (IR), which they called a quantum cascade laser (QCL). These lasers differ fundamentally from the usual semiconductor heterostructure laser in that these devices are unipolar, that is, they use only one type of carrier for lasing, namely electrons. The electrons undergo a series of quantum falls at each stage emitting photons with frequency corresponding to the intersubband energy level spacing. If the system is designed to have the same energy level spacing at each stage, then the result is the same electron emitting photons of the same energy at each fall. After undergoing a fall, the electron is collected in a reservoir and then injected into the next stage where it undergoes another fall. The cascading nature of the electrons in this device gives it the name quantum cascade laser.

Figure 2:
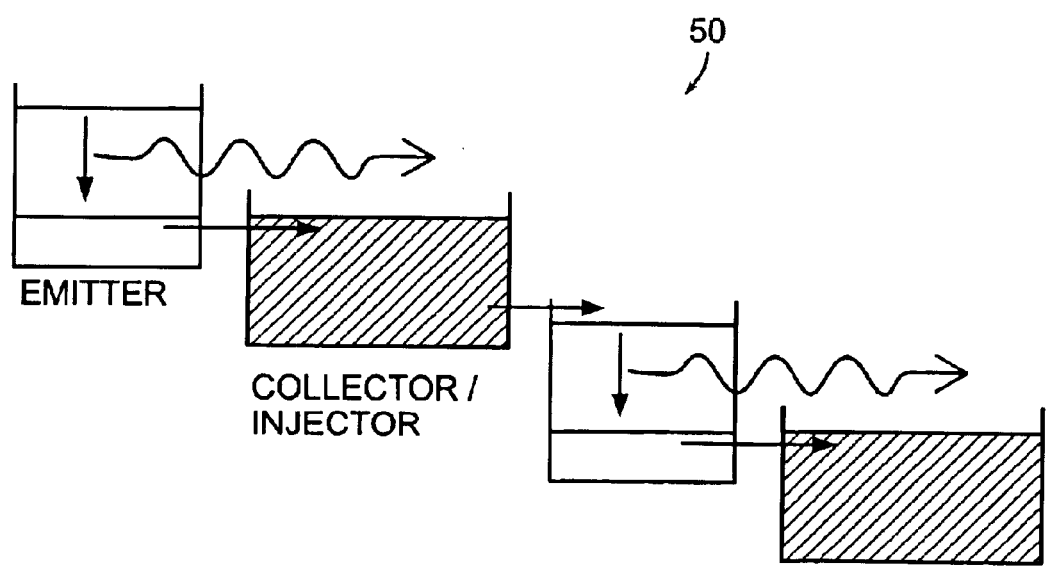
FIG. 2 is a schematic diagram illustrating the principle of operation of a quantum cascade laser in accordance with a preferred embodiment of the present invention.

FIG. 2 schematically illustrates the operating principle of a QCL. The carriers are injected into the emitter stage, where they undergo a radiative transition. After undergoing this transition, the carriers are siphoned out to the collector which in turn acts as the injector for the next stage. Several periods of the injector-emitter module are typically present in QCLs.

The primary advantage of such a device is the freedom from bandgap slavery. One can tailor the emission frequency based on the well width, barrier heights and applied bias. Hence, the device is not entirely dependent on the bandgap of the bulk material for the emission wavelength. Since the intersubband energy level spacing can be tuned all the way from a few meV to several hundred meV, these structures have the potential to be used for lasing from mid IR to far IR (THz). For building a laser, the cascade structure along with waveguide cladding layers is embedded in a Fabry-Perot cavity and hence only the photons that are in-phase survive thereby ensuring phase coherence.

The problem of extending the operating frequency of quantum cascade structures into the THz is partially due to the very small energy level spacing (~10–15 meV) and competing nonradiative mechanisms.

Figure 3:
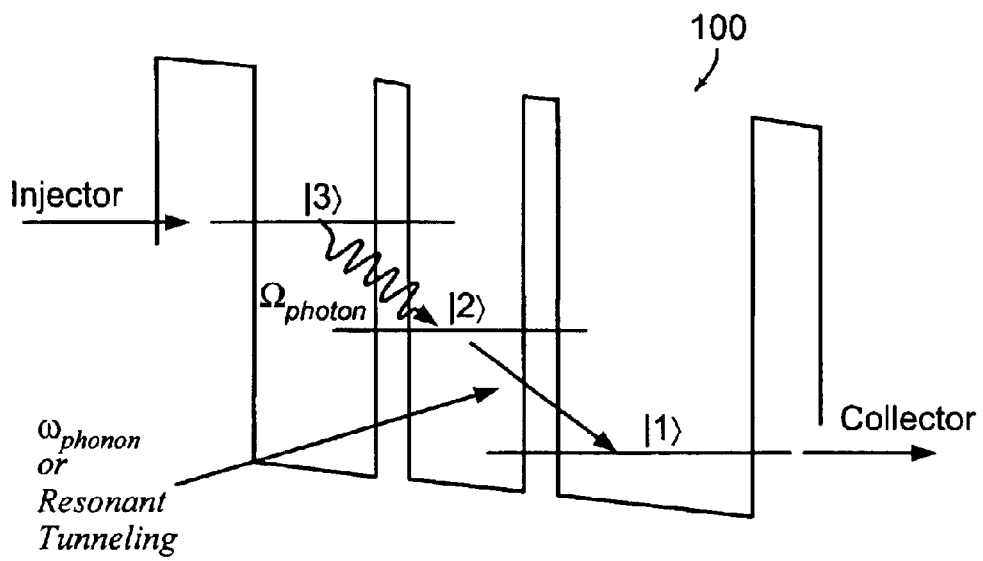
FIG. 3 is a schematic diagram of a quantum cascade laser designed for emission in the far-infrared in accordance with a preferred embodiment of the present invention.

FIG. 3 illustrates a schematic diagram of a QCL designed for emission in the far infrared region in accordance with a preferred embodiment of the present invention. The wavy line corresponds to a transition with the emission of a photon, and the solid line corresponds to a phonon-mediated transition or resonant tunneling. A phonon may be defined as a quantum of energy, the level of which is a function of the frequency of the wave. The energy of a phonon is typically less than 0.1 eV (electron-volt) and thus is one or two orders of magnitude less than that of a photon. The preferred embodiment of the THz QCL design, includes the lasing occurring between levels |3> and |2>. Under the appropriate bias, the electrons from level |3> relax radiatively to level |2>. The electrons from level |2> then have to be depopulated fast so as to maintain maximum population inversion between levels |3> and |2>. At frequencies below the LO phonon energy the primary nonradiative mechanism is the electron-electron interaction. In the case of electrically injected QCLs the rate of nonequilibrium electron-electron transition is on the order of 1–10 ps$^{-1}$. Such a fast nonradiative decay rate makes it almost impossible to attain population inversion. One way to circumvent this problem is to use a faster decay scheme to siphon out the electrons from level |2>. In a preferred embodiment, interface phonon mediated transitions are used rather than bulk phonons or resonant tunneling transitions. In this context, preferred methods of the present invention include engineering of interface phonon modes to optimize the scattering rates. Interface phonon modes are characterized by their decreasing amplitude away from a heterointerface. The frequency of these modes depends on the type of materials used in the heterostructure and the number of these modes depend on the number of interfaces in the structure. Confined phonon modes are assumed to be completely confined within a particular reaion (barrier or well).

Although the embodiment described hereinbefore includes three levels, other preferred embodiments include lasing occurring between four or more levels. Alternate preferred embodiments include lasing occurring between mini-bands or thinner layers in a superlattice structure such as GaAs/AlGaAs superlattice. Further, structures other than well structures are also used in preferred embodiments such as quantum dot structures and/or quantum wire structures.

Another major obstacle in developing a THz QCL is that of modal confinement at long wavelengths. Modal confinement is a necessary condition for lasing to occur. The typical scheme in mid IR QCLs is to use lattice matched materials of varying refractive indices for waveguides. At THz frequencies, this technique has the problem of modal penetration into the surface, which results in a lossy waveguide. The only way to attain waveguiding using the above technique is to use layers several tens of microns thick. This is because the penetration is proportional to the wavelength. Plasmon enhanced waveguides may be an answer to modal penetration as large refractive index offsets are attained by using varying doping concentrations.

The concept of wavefunction engineering used in preferred embodiments of the present invention is akin to a fundamental redesigning of semiconductor structures for optimized wavefunction localization, improved transition matrix elements, and optimized device design. One can represent the performance of the device using the basic knowledge of the material parameters. Also, such a detailed representation provides initial design parameters for fabrication of the device.

Figure 4:
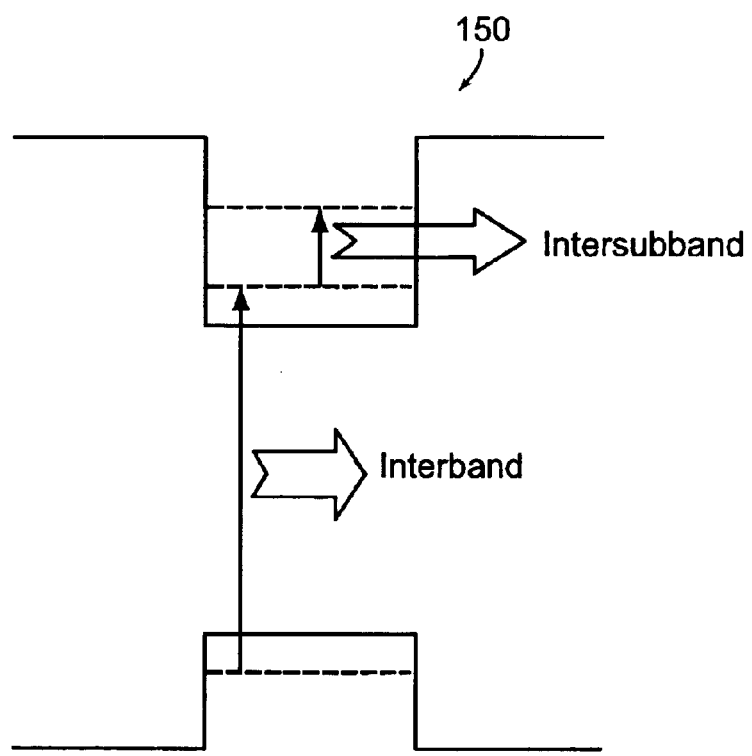
FIG. 4 is a schematic diagram of type I quantum well in accordance with a preferred embodiment of the present invention.

Intersubband transitions can be defined as those transitions occurring between quantum confined levels originating from the same band (conduction or valence) in a semiconductor heterostructure. The systems in accordance with a preferred embodiment include transitions occurring between conduction band states. In an alternate preferred embodiment, transitions occur between valence band states. In another preferred embodiment, transitions occur in combination in both valence and conduction bands. Staggered structures can include transitions occurring in both the valence and conduction bands. The fabrication of quantum-confined structures has been due to the advancement in thin film deposition techniques for molecular beam epitaxy (MBE) and metal organic chemical vapor deposition (MOCVD). Sandwiching a material of lower bandgap between two layers of higher bandgap material provides a one-dimensional potential well or a quantum well as shown in FIG. 4. The transitions that occur between the conduction band states and valence band states are referred to as interband transitions. FIG. 4 shows the band profile of a type I quantum well with the arrows indicating interband and intersubband transitions. Intersubband transitions (absorption) have been observed all the way from 200 μm in GaAs/AlGaAs superlattices to 1.5 μm in GaN/AlGaN quantum wells.

In considering an intersubband transition occurring between the ground state and the first exited state in a quantum well, the wavefunctions for the two states can be given as follows:

$$\psi_0 = U_0(\vec{r})\frac{e^{i\vec{k}_t \cdot \vec{\rho}}}{\sqrt{A}}\zeta_0(z) \quad (1)$$

$$\psi_1 = U_1(\vec{r})\frac{e^{i\vec{k}'_t \cdot \vec{\rho}}}{\sqrt{A}}\zeta_1(z) \quad (2)$$

where, the indices, 0 and 1 correspond to the ground state and first exited state, respectively, and U(r) is the periodic component of the Bloch function. $k_t$ and $k'_t$ are the transverse wavevectors and are given by $\vec{k}_t = k_x\hat{x} + k_y\hat{y}$, $\vec{k}'_t = k'_x\hat{x} + k'_y\hat{y}$ and the position vector along the in-plane direction is given by $\vec{\rho} = x\hat{x} + y\hat{y}$. The optical dipole moment is given by $$\vec{\mu}_{10} = \langle \psi_1 | e\vec{r} | \psi_0 \rangle \quad (3)$$

$$= \langle U_1 | U_0 \rangle \left\langle \frac{e^{i\vec{k}'_t \cdot \vec{\rho}}}{\sqrt{A}} \zeta_1 \middle| e\vec{r} \middle| \frac{e^{i\vec{k}_t \cdot \vec{\rho}}}{\sqrt{A}} \zeta_0 \right\rangle$$

$$= \delta_{kk'} \langle \zeta_1 | ez | \zeta_0 \rangle \hat{z}$$

For the conduction band states, $U_1 = U_0$, using the orthonormality condition of the wavefunctions, leading to the delta function for the in-plane wavevectors. It can be seen from Equation 3 that the optical dipole moment only has a component along the growth direction (z). This illustrates the TM-polarization of the radiation emitted or absorbed in intersubband transitions which causes the radiation to propagate along the plane of the quantum wells (the x y-plane). This property of intersubband transitions makes normal incidence absorption as well as surface emission impossible unless aided by a surface grating. There is an experimental basis for TE polarized intersubband transitions. This is due to the band mixing effects (between the conduction and valence bands) and is almost impossible in the III-V material system. In some material systems like HgCdTe the admixture of hole-like components into the conduction band wavefunctions give rise to non-negligible TE-polarized intersubband dipole matrix elements. In such systems a one-band picture for the intersubband transitions does not suffice. It is important to wavefunction engineer the entire structure to fabricate the semiconductor heterostructure light emitting device in accordance with preferred embodiments of the present invention.

It is useful to define the oscillator strength, $f_{ij}$ which is a measure of the transition strength as follows:

$$f_{ij} = \frac{2m^* \Delta E}{\hbar^2} |\langle \zeta_i | z | \zeta_j \rangle|^2 \quad (4)$$

where, $m^*$ is the effective mass, $\Delta E$ is the intersubband energy level spacing, and $\zeta_i$ and $\zeta_j$ are the envelope functions corresponding to the initial and final electronic states along the growth direction. Such a dimensionless oscillator strength facilitates the comparison of transition probabilities in various physical systems and is a useful tool in spectroscopy. The value of oscillator strength is a direct measure of the probability of radiative transition.

A theoretical formalism to design intersubband emitters is based on the cascade model. A preferred embodiment comprises a terahertz (THz) source, but the invention can relate to any cascade structure having multiple levels or mini-bands in a semiconductor superlattice such as GaAs/AlGaAs without limitation, for example, quantum well, quantum wire, quantum dot structure or mini-bands in a superlattice. The fundamental structure of the quantum cascade device consists of multiple quantum wells, which under an applied bias forms a staircase-like energy level structure. These structures are repeated several times between 10 to 100, and due to their translational symmetry, the energy level spacings stay the same and hence emission of photons of the same energy from each of these periods is obtained. As described above, FIG. 3 illustrated the basic design of a single period of the quantum cascade structure. The depopulation of level $|2\rangle$ can be either via LO phonon emission or through resonant tunneling. The photon emission occurs between levels $|3\rangle$ and $|2\rangle$.

The first step involved in the design is to solve the Schroedinger equation for the system of multiple quantum wells with applied bias. This problem is not solvable analytically, and hence one has to employ one of the several numerical techniques available. In a preferred embodiment, the Transfer Matrix Method (TMM), can be used to solve for the energy eigenvalues of the multiple quantum well system in the presence of an external electric field.

Figure 5:
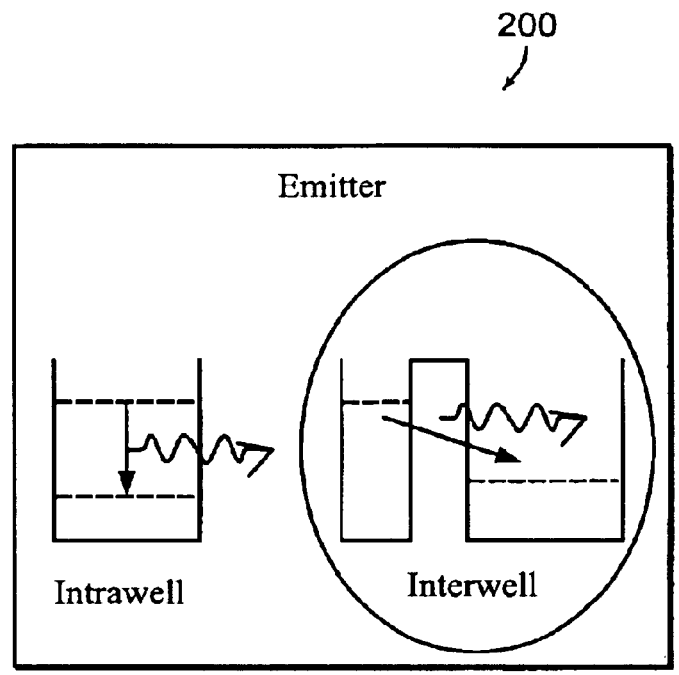
FIG. 5 is a schematic diagram illustrating the two kinds of emitter designs (intrawell and interwell) in accordance with a preferred embodiment of the present invention.
Figure 6:
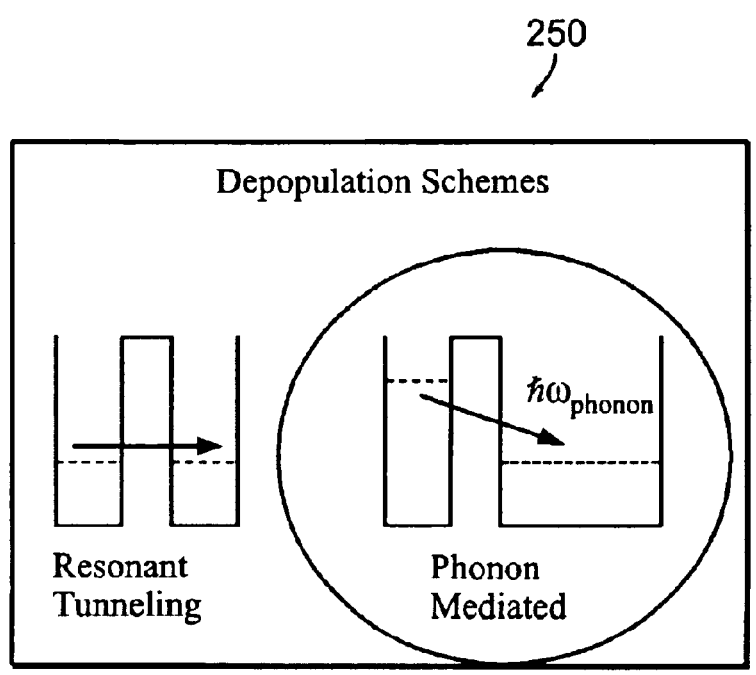
FIG. 6 is a schematic diagram illustrating the two possibilities of depopulation mechanisms in accordance with a preferred embodiment of the present invention.

There are two kinds of emitter structures as well as depopulation methods that one can choose before embarking on the design of the active region of a quantum cascade structure. These alternatives are illustrated in FIGS. 5 and 6.

The interwell emitter structure as well as the phonon mediated depopulation scheme have been circled to indicate the preferred embodiment in the design of THz quantum cascade structures. For THz quantum cascade structures the requirements for design and fabrication are even more demanding than the mid infrared (IR) designs due to the small energy level spacing (5–20 meV) as well as the highly competing non-radiative mechanisms (e-e scattering) between the lasing levels. The preferred embodiments include an interwell emitter design which offers more flexibility and degrees of freedom in terms of manipulation of the wavefunction localization and hence a better chance for device optimization. Further, the phonon mediated depopulation mechanism is more forgiving to layer thickness fluctuations in comparison to a resonant tunneling scheme. This embodiment can also be advantageous at higher operational temperatures because the phonon mechanism only gets stronger at higher temperatures. Also, the resonant tunneling suffers from level broadening at higher temperatures, which leads to lower tunneling efficiency.

The energy eigenvalues are solved for the quantum well system for varying bias. The material parameters used in the calculations are as follows:

TABLE 1

| Effective mass | Electron |
|---|---|
| | GaAs = 0.067 $m_0$ |
| | $Al_xGa_{1-x}As$ = (0.067 + 0.083 x) $m_0$ |
| | Heavy Hole[interpolation] |
| | GaAs = 0.050 $m_0$ |
| | $Al_xGa_{1-x}As$ = (0.050 + 0.29 x) $m_0$ |
| | Light Hole |
| | GaAs = 0.087 $m_0$ |
| | $Al_xGa_{1-x}As$ = (0.087 + 0.063 x) $m_0$ |
| where, $m_0$ = 9.1095 × $10^{-31}$ kg is the free electron mass. | |
| Band Gap | GaAs = 1.424 (T = 300K) |
| | = 1.508 (T = 77K) |

TABLE 1-continued

| | | | | |
|---|---|---|---|---|
| | | = 1.519 | (T = 0K) | |
| | $Al_xGa_{1-x}As$ | = 1.424 + 1.247x eV | (0 < x < 0.45) | (T = 300 K) |
| | | = 1.508 + 1.247x eV | (0 < x < 0.45) | (T = 77K) |
| | | = 1.519 + 1.447x − 0.15 $x^2$ | (0 < x < 0.45) | (T = 0K) |
| Band Offsets in GaAs/AlGaAs | Conduction Band | = 0.67 ($E_g$ AlGaAs − $E_g$GaAs) | | |
| | Valence Band | = 0.33 ($E_g$ AlGaAs − $E_g$GaAs) | | |
| Static Dielectric Constants | GaAs | = 13.18 | | |
| | $Al_xGa_{1-x}As$ | = 13.18 − 3.12x | | |
| High Frequency Dielectric Constant | GaAs | = 10.89 | | |
| | $Al_xGa_{1-x}As$ | = 10.89 − 2.73x | | |
| Refractive Index | $\lambda$ = 77 $\mu$m | | | |
| (n, k) | | | | |
| | GaAs | = (3.681, 1.84 × $10^{-3}$) | | |
| | $Al_{0.18}Ga_{0.82}As$ | = (3.625, 2.62 × $10^{-2}$) | | |
| | $\lambda$ = 105 $\mu$m | | | |
| | GaAs | = (3.650, 3.60 × $10^{-3}$) | | |
| | $Al_{0.18}Ga_{0.82}As$ | = (3.561, 204 × $10^{-2}$) | | |

Figure 7:
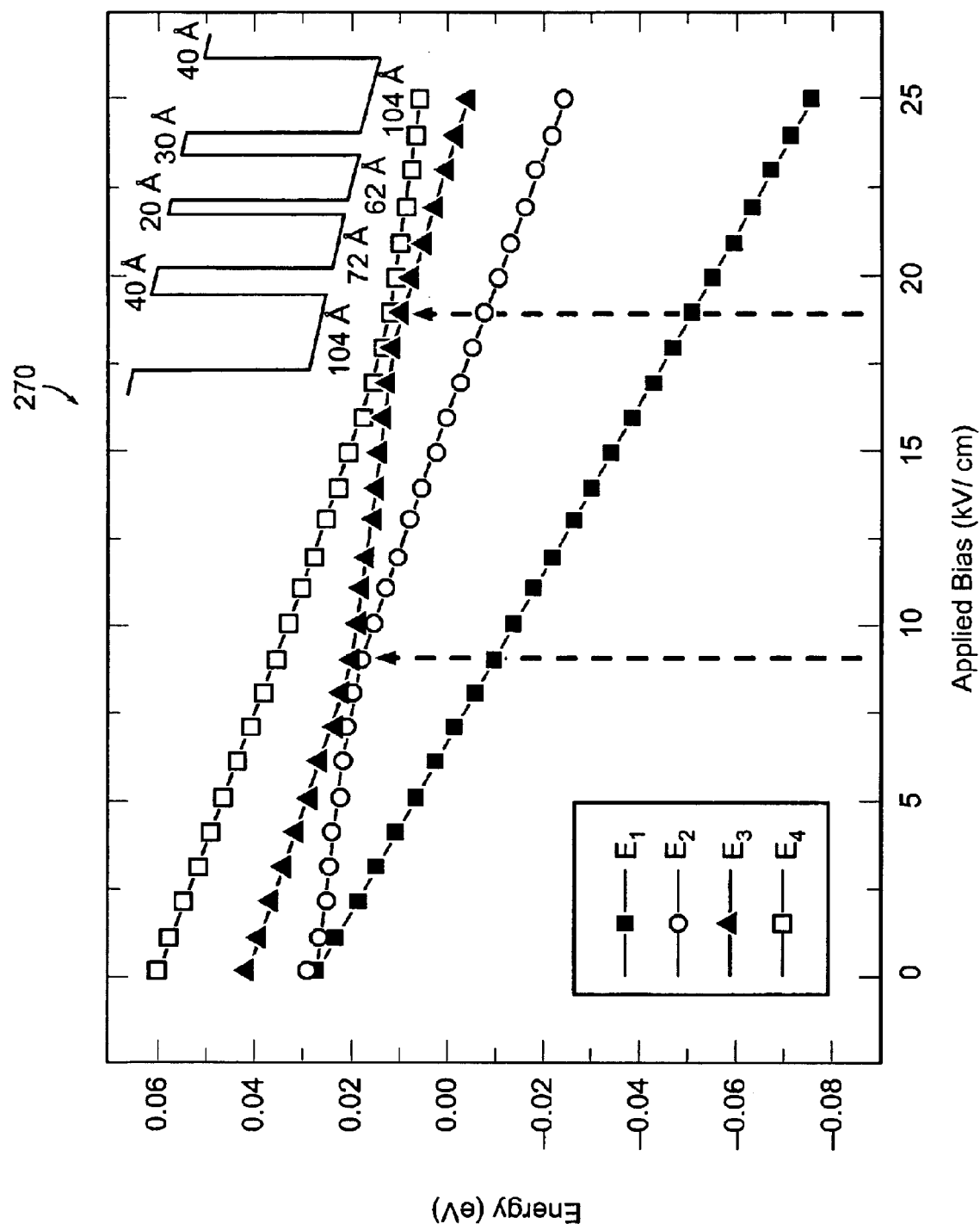
FIG. 7 is a graphical representation of the variation of calculated energy levels with applied bias for a four-quantum well system comprising of GaAs quantum wells and $Al_{0.25}Ga_{0.75}As$ barriers in accordance with a preferred embodiment of the present invention.

The energy levels have to be such that, levels |3> and |2> are separated by an energy corresponding to THz frequencies. Also the wavefunctions corresponding to levels |3> and |2> have to be localized in wells 1 and 2, respectively. The level spacing between |2> and |1> has to be equal to the phonon energy. Having ensured the above features, the optimal bias is found when the lowest energy level of one module coincides with the upper level of the next stage. This occurs at what is called the anticrossing region. The structure is a three quantum well active region. FIG. 7 shows the variation of energy levels for a four quantum well structure comprising GaAs quantum wells and $Al_{0.25}Ga_{0.75}As$ barriers. The thickness of the layers and the conduction band profile are given in the inset. The dashed arrows indicate the location of anticrossing points. The optimal device operation is close to 20 kV/cm where, level $E_4$ and $E_3$ anticross, $E_3$ and $E_2$ are separated by 15 meV and $E_2$ and $E_1$ by 46 meV, corresponding to the interface phonon energy in such a system. For biases above the second anticrossing, $E_4$ corresponds to the lowest energy level of previous period. The zero of the energy scale corresponds to the conduction band minimum in the absence of applied bias. The first well is same as the last well, i.e. the last layer of the previous period has been included in the simulation. This is done to ensure that the lowest level of the previous period anticrosses with the upper level of the next. Dashed arrows show the locations of anticrossing.

Figure 8:
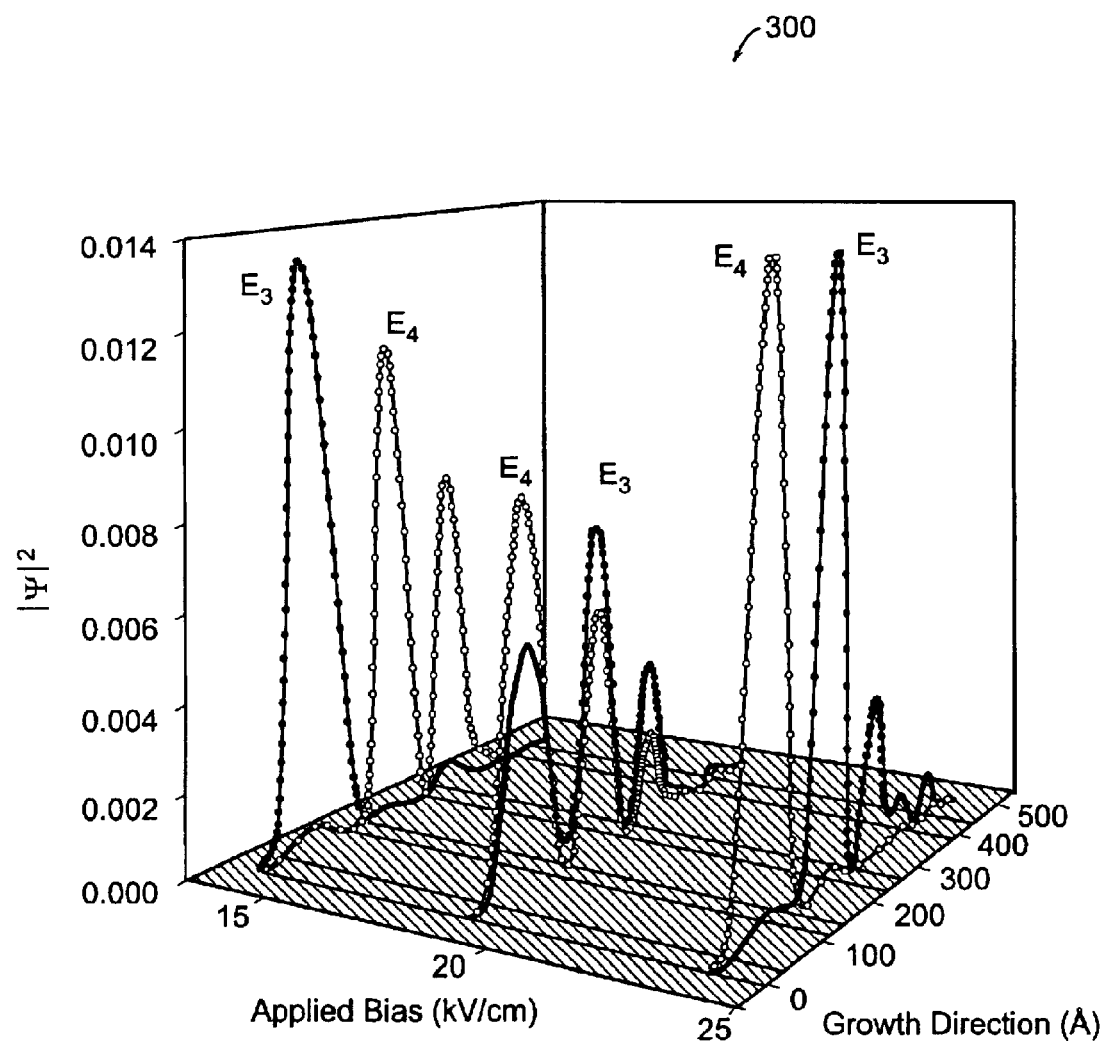
FIG. 8 is graphical representation of the wavefunctions corresponding to levels $E_3$ and $E_4$ that are shown for varying applied bias in accordance with a preferred embodiment of the present invention.

The concept of anticrossing is again illustrated by FIG. 8. The well (bold) and the barrier widths starting from the zero of the growth axis in Å are 30/104/40/72/20/62/30. It can be seen that maximum overlap between the corresponding wavefunctions occurs at the bias where anticrossing of the energy levels happens. As one goes through the anticrossing bias (19 kV/cm in this embodiment), the localization of the wavefunctions shift from one well to the other, and also the energy difference between the states goes through a minimum. Hence, the bias applied determines the location of the carriers as well as the energy difference. At the anticrossing point the two wavefunctions have the maximum overlap. This is a necessary condition to obtain maximum injection efficiency. Good injection efficiency is required to pass on the electrons from one period to the next, thereby obtaining more than one photon from a single electron.

Thus the energy levels and wavefunctions for a preferred embodiment of the layered system which satisfies all the requirements for THz cascade emission, namely, levels $E_4$ and $E_3$ anticross, $E_3$ and $E_2$ are separated by ~15 meV and $E_2$ and $E_1$ by ~46 meV which correspond to the interface phonon energy in such a system. Having obtained the layer structure, energy levels, and corresponding wavefunctions, the next stage involves the study of carrier kinetics within the subbands. The temporal variations of electron density in the three subbands involved in the lasing process can be described by a simple rate equation model. Under steady state condition, current continuity requires that the current going into the active region is equal to the current coming out. Therefore:

$$\frac{dn_3}{dt} = \frac{J}{e} - \frac{n_3}{\tau_{32}} - \frac{n_3}{\tau_{31}} - \bar{g}S \quad (5)$$

$$\frac{dn_2}{dt} = \frac{n_3}{\tau_{32}} - \frac{n_2}{\tau_{21}} + \bar{g}S \quad (6)$$

$$\frac{dn_1}{dt} = \frac{n_3}{\tau_{31}} + \frac{n_2}{\tau_{21}} - \frac{J}{e} \quad (7)$$

where J is the current density, e is the electronic charge, $n_i$ corresponds to the electron density in subband i (i=1,2,3), $\bar{g}$ is the intersubband gain in the active region and S is the photon density per unit area. In the case of THz QCL designs, where $\Delta E_{32}$ is less than the optical phonon energy it follows:

$$\frac{1}{\tau_{32}} = \left(\frac{1}{\tau_{32_{rad}}}\right) + \left(\frac{1}{\tau_{32_{ac}}}\right) + \left(\frac{1}{\tau_{32_{e-e}}}\right) \quad (8)$$

where $(\tau_{32})_{rad}$ is in the $\mu$s range for the structures under consideration, while the acoustic phonon mediated lifetime, $(\tau_{32})_{ac}$ is of the order of ~100 ps. It has been shown both theoretically and experimentally that for electron sheet densities greater than ~$10^8$ $cm^{-2}$, electron-electron (e-e) scattering is an efficient scattering mechanism and $\tau_{e-e}$ is of the order of ~10–40 ps. Hence ($1/\tau_{32}$) is dominated by electron-electron scattering. Furthermore, $\tau_{31}$ and $\tau_{21}$ are both phonon-mediated lifetimes and can be tailored and modified by optimized layer design. Under a steady state condition, the population inversion between levels |3> and |2> is $$n_3 - n_2 = \left(\frac{\tau_3}{\tau_{32}}\right)(\tau_{32} - \tau_{21})\left[\frac{J}{e} - \bar{g}S\left(1 + \frac{\tau_{21}}{\left(\frac{\tau_3}{\tau_{32}}\right)(\tau_{32} - \tau_{21})}\right)\right] \quad (9)$$

where $1/\tau_3 = 1/\tau_{31} + 1/\tau_{32}$. Population inversion between levels 3 and 2 can occur only if $\tau_{32}$ is greater than $\tau_{21}$. This condition can barely be satisfied in the THz QCLs due to the highly efficient electron-electron scattering between levels 3 and 2. Hence to maximize the population inversion one has to minimize the electron-electron scattering rate between the lasing levels and also maximize the phonon scattering rate out of level |2>. Above the lasing threshold the photon flux arising from the stimulated emission reduces the population inversion. Hence for increasing currents above threshold, population inversion keeps increasing with a smaller slope. By minimizing the electron-electron scattering rate and maximizing the phonon scattering rate one can attain the necessary population inversion to achieve gain with a lower injection current, thereby reducing the threshold current density.

Two different embodiments include structures that are designed for emission in the THz region of the spectrum. Both structures utilize interface phonon modes for depopulation. The conduction band profile along with the squared moduli of the wavefunctions for the two structures are shown in FIGS. 9A, 9B and FIGS. 10A and 10B. The variation in energy level spacing with applied bias for the two structures is also shown.

Figure 9A:
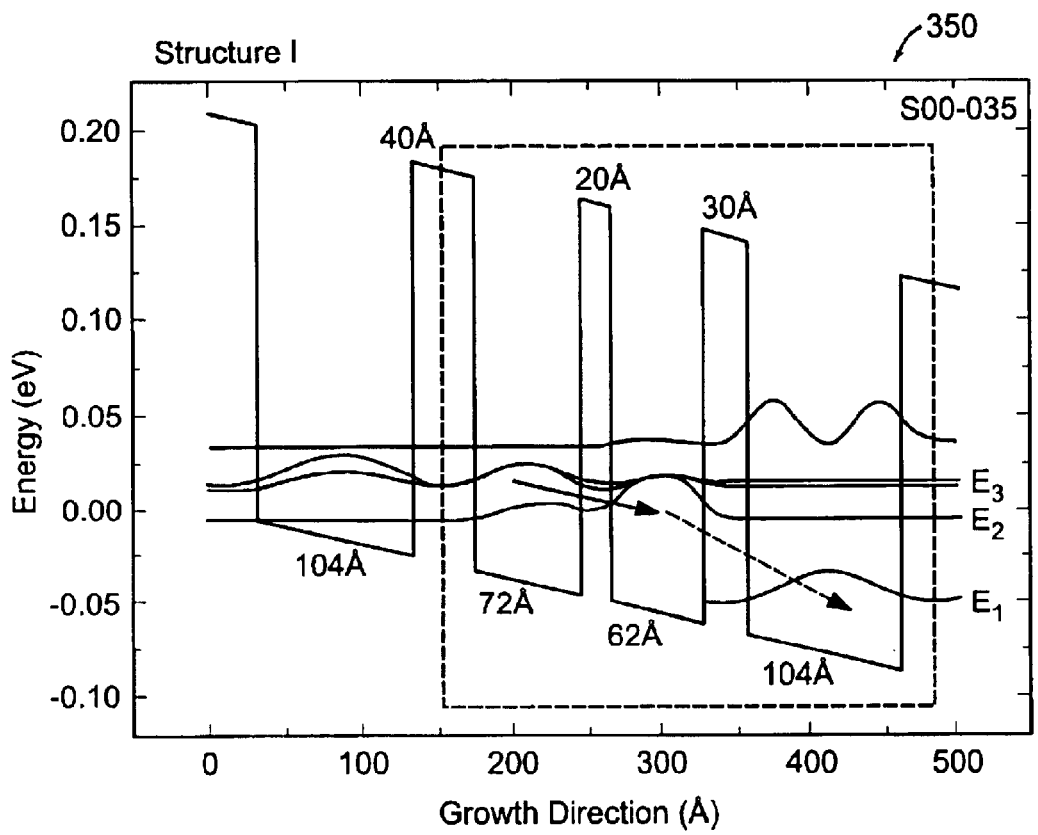
FIGS. 9A and 9B are graphical plots of energy as a function of applied bias, in particular (A) the conduction band profile for a first structure along with the calculated energy levels and squared moduli of the wavefunctions under an applied bias of 19 kV/cm and (B) is the variation of intersubband energy level spacing as a function of applied bias in accordance with a preferred embodiment of the present invention.

FIG. 9A illustrates the conduction band profile for a first structure along with the calculated energy levels and squared moduli of the wavefunctions under an applied bias of 19 kV/cm. The bold arrow indicates the radiative transition and the dashed arrow corresponds to the interface phonon mediated transition. The region within the dashed box corresponds to one period of the structure. The structure consists of GaAs quantum wells and $Al_{0.25}Ga_{0.75}As$ barriers with 40 repeated periods. Under the appropriate bias, $\Delta E_{32} = 16$ meV (78 μm) and $\Delta E_{21} = 46$ meV.

Figure 9B:
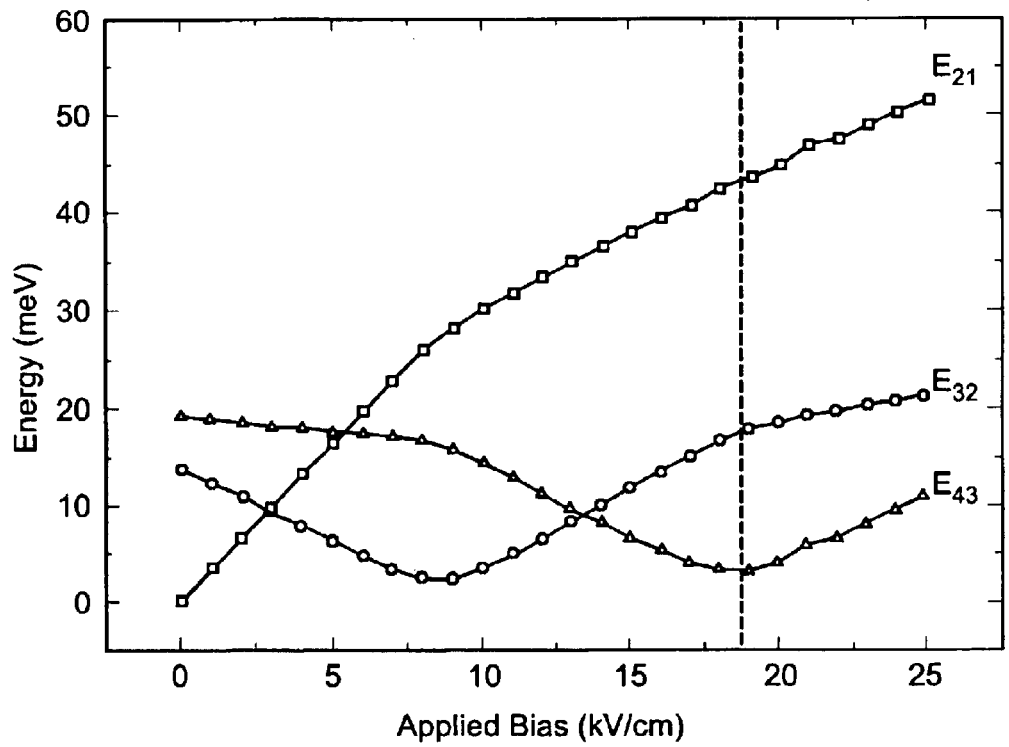

FIG. 9B illustrates the variation of intersubband energy level spacing as a function of applied bias. The dashed line indicates the optimal bias under which $E_{21}$ is close to interface phonon energy and $E_{43}$ is minimum. $E_4$ corresponds to the lowest energy level of the previous state.

Figure 10A:
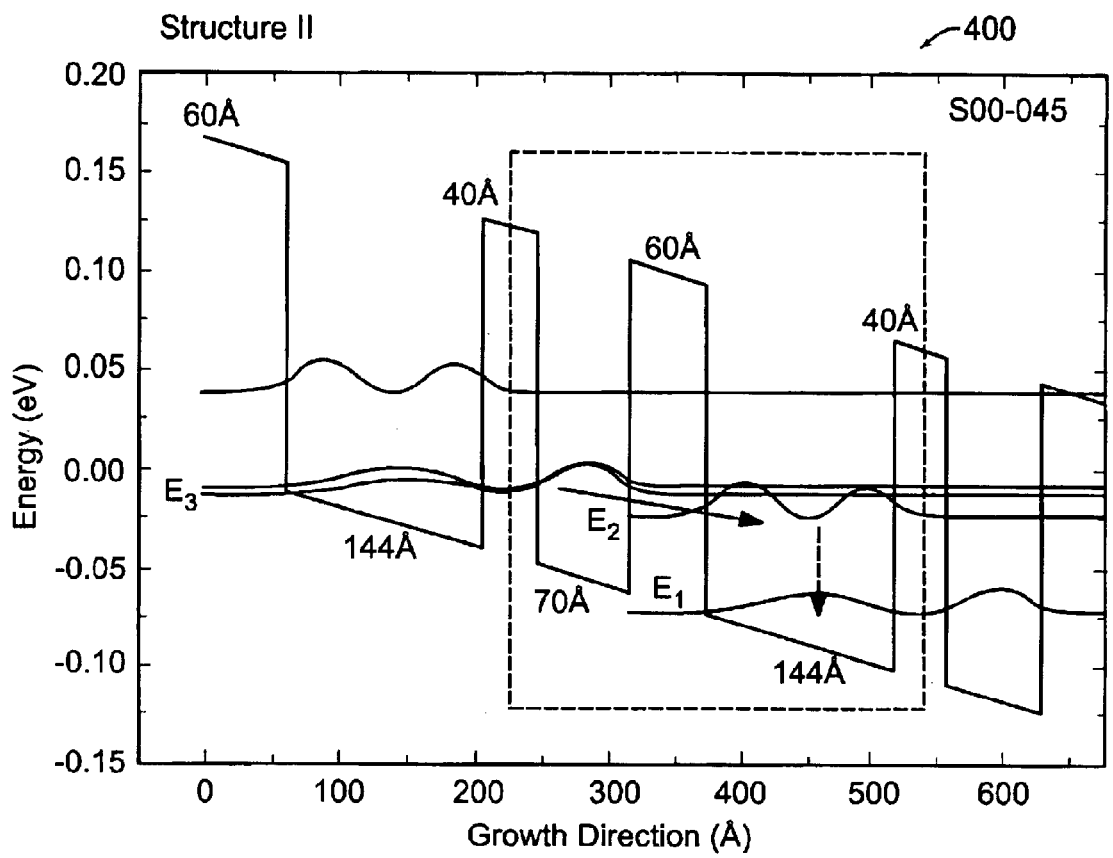
FIGS. 10A and 10B are graphical plots of energy as a function of applied bias, in particular (A) the conduction band profile for a second structure along with the calculated energy levels and squared moduli of the wavefunctions under an applied bias of 20 kV/cm and (B) is the variation of intersubband energy level spacing as a function of applied bias in accordance with a preferred embodiment of the present invention.

FIG. 10A illustrates the conduction band profile for a second structure along with the calculated levels and squared moduli of the waveforms under an applied bias of 20 kV/cm. The bold arrow indicates the radiative transition and the dashed arrow corresponds to the interface phonon mediated transition. The region within the dashed box corresponds to one period of the structure. The structure consists of GaAs quantum wells and $Al_{0.2}Ga_{0.8}As$ barriers with 40 repeated periods. Under the appropriate bias, $\Delta E_{32} = 11.8$ meV(105 μm) and $\Delta E_{21} = 47.5$ meV.

Figure 10B:
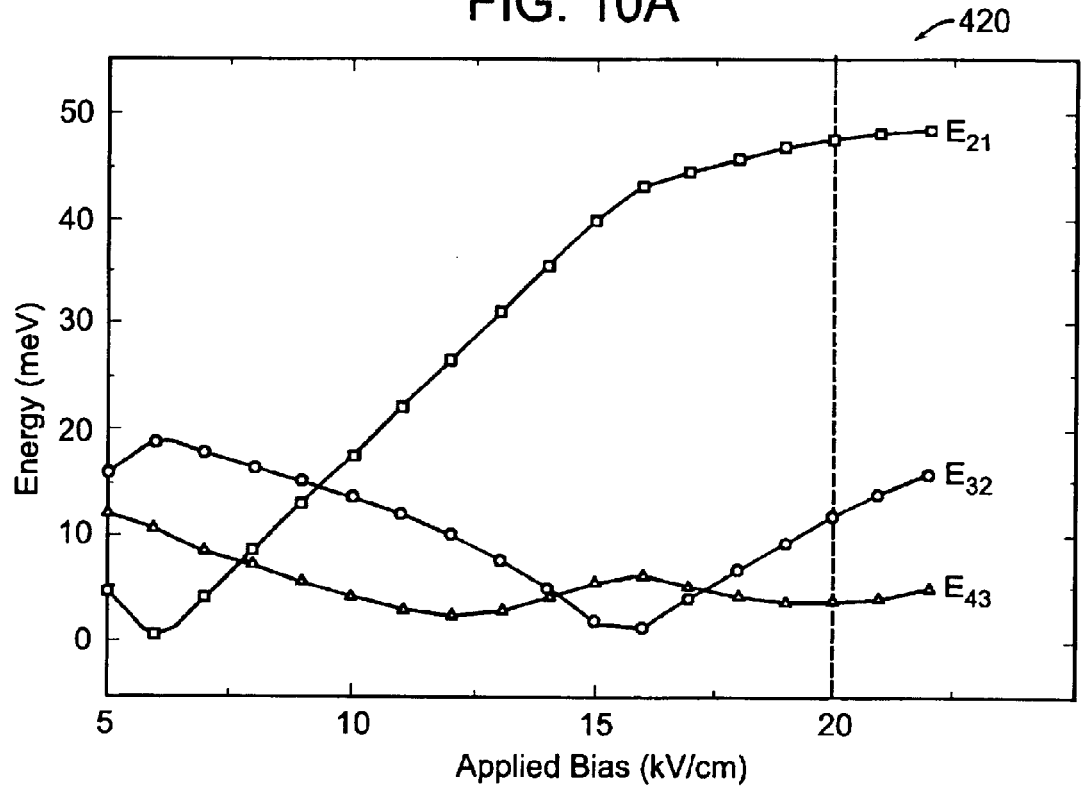

FIG. 10B illustrates the variation of intersubband energy level spacing as a function of applied bias. The dashed line indicates the optimal bias under which, $E_{21}$ is close to interface phonon energy and $E_{43}$ is minimum. Here $E_4$ corresponds to the lowest energy level of the previous stage.

The electron-electron scattering and electron-phonon scattering are used in accordance with a preferred embodiment of the present invention to enhance device performance. When the intersubband energy level spacing is below the LO phonon energy (36 meV in GaAs), e-e scattering is the most dominant nonradiative mechanism, resulting in lifetimes on the order of 0.1–10 ps. This is much shorter than the acoustic phonon mediated lifetimes, which are typically 100–200 ps. The highly efficient e-e scattering process is considered to be one of the biggest hurdles in realizing population inversion in a quantum cascade structure designed to emit in the THz range (10–20 meV). In a preferred embodiment e-e scattering rates are controlled using wavefunction engineering. Also, the dependence of the e-e scattering rate on subband population, temperature and initial wavevector of the electron is examined.

Figures 11A, 11B, 11C:
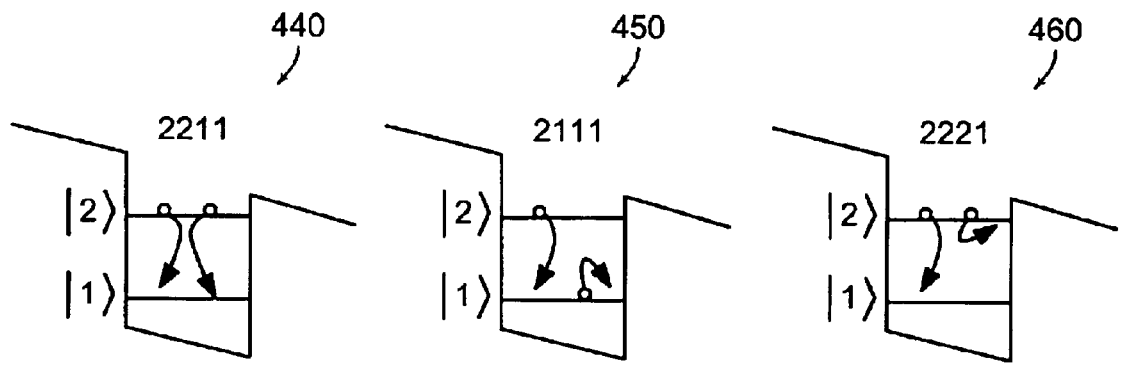
FIGS. 11A–11C illustrate various electron-electron (e-e) scattering processes involved in asymmetric quantum well systems in accordance with a preferred embodiment of the present invention.

In an asymmetric quantum well there may be three kinds of intersubband e-e scattering processes possible, and they are shown schematically in FIGS. 11A–11C for two energy levels. As shown, the first two indices refer to the initial subband and the last two indices to the final subband. The rates due to the different scattering processes are computed to identify the order of importance of these processes. While the effects of screening have been neglected in the present calculation, it has been shown that where the subband densities are low ($10^{10}$–$10^{11}$ cm$^{-2}$), the scattering rate is not reduced.

Figure 12:
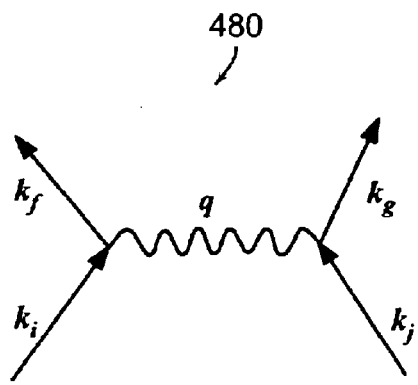
FIG. 12 is a Feynman diagram representing the e-e scattering process being calculated in accordance with a preferred embodiment of the present invention.

An electron in subband i with in-plane momentum $k_i$ scattering from another electron in subband j with in-plane momentum $k_j$ to final subbands $f$ and $g$ with in-plane momenta, $k_f$ and $k_g$, is considered, respectively. Using the Feynman diagram representation in FIG. 12, this scattering process can be shown.

Figure 13:
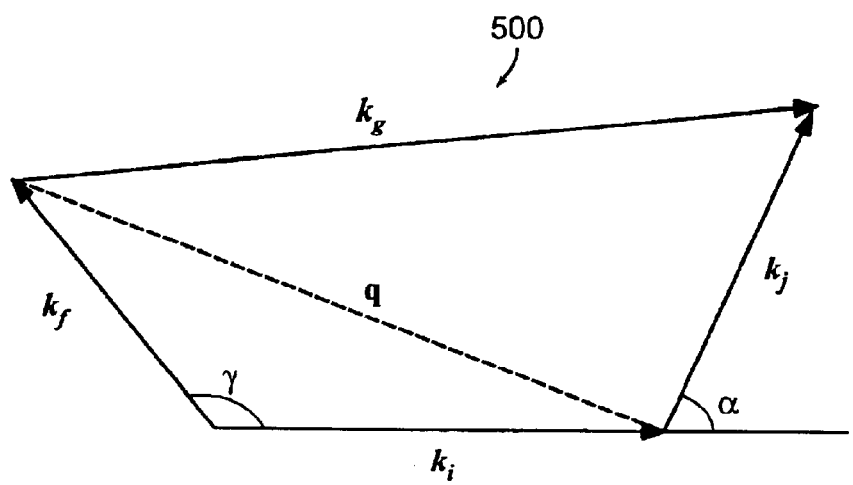
FIG. 13 is a schematic diagram of the initial and final electron momentum in accordance with a preferred embodiment of the present invention.

To compute the exact numerical value of the in-plane momenta, the vector diagram shown in FIG. 13 is used. $k_i$ and $k_j$ are the momenta of the initial electrons in the final state. Here, $\alpha$ is the angle between $k_i$ and $k_j$ and $\gamma$ is the angle between $k_i$ and $k_f$.

The interaction Hamiltonian for the e-e scattering can be given by $$H_{i,j \to f,g}^{ee}(k_i, k_j, k_f, k_g) = \frac{e^2}{\varepsilon_r \varepsilon_0} \int_{-\infty}^{\infty} dz \int_{-\infty}^{\infty} dz' \int d^2\vec{r}_\perp \int d^2\vec{r}'_\perp \quad (10)$$
$$\Psi_i(z)\Psi_f^*(z)\Psi_j(z')\Psi_g^*(z') \times \frac{e^{-i\left[\left(\vec{k}_i \cdot \vec{r}_\perp + \vec{k}_j \cdot \vec{r}'_\perp\right) - \left(\vec{k}_f \cdot \vec{r}_\perp + \vec{k}_g \cdot \vec{r}'_\perp\right)\right]}}{[(z-z')^2 + |r-r'|^2]^{1/2}}$$

Introducing the two dimensional Fourier Transform of the Coulomb potential, the Hamiltonian becomes $$H_{i,j \to f,g}^{ee}(\vec{k}_i, \vec{k}_j, \vec{k}_f, \vec{k}_g) = \frac{2\pi e^2}{S_{xy}\varepsilon_r\varepsilon_0} \delta(\vec{k}_f + \vec{k}_g - \vec{k}_i - \vec{k}_j) A_{i,j \to f,g}(q) \quad (11)$$

where, e is the electronic charge, $S_{xy}$ is the area along the in-plane direction, $\epsilon_r$ is the relative permittivity of the material and $\epsilon_0$ is the permittivity of free space. $A_{i,j \to f,g}$ is the e-e interaction form factor and is given by $$A_{i,j \to f,g}(q_\perp) = \int_{-\infty}^{\infty} dz \int_{-\infty}^{\infty} dz' \Psi_i(z)\Psi_f^*(z)\Psi_j(z')\Psi_g^*(z') e^{-q_\perp|z-z'|} \quad (12)$$

and $$q_{1gs} = |\vec{k}_f - \vec{k}_i| \quad (13)$$

The total e-e scattering rate of an electron initially in state $|i,k_i\rangle$ is then $$W_{i,j \to f,g}(\vec{k}_i) = \frac{e^4}{2\pi \hbar \varepsilon_r^2 \varepsilon_0^2} \quad (14)$$

-continued $$\int d^2\vec{k}_j \int d^2\vec{k}_f \int d^2\vec{k}_g \frac{|A_{i,j\to f,g}(q_\perp)|^2}{q_\perp^2} \times f_j(\vec{k}_j)(1-f_f(\vec{k}_f))$$

$$(1-f_g(\vec{k}_g)) \times \delta(E_f(\vec{k}_f)+E_g(\vec{k}_g)-E_i(\vec{k}_i)-E_j(\vec{k}_j)) \times$$

$$\delta(\vec{k}_f+\vec{k}_g-\vec{k}_i-\vec{k}_j)$$

The Fermi Dirac distribution functions for the carriers in each subband are included to account for the Pauli blocking effects. The two delta functions correspond to the energy conserving delta function and momentum conserving delta function, respectively. The integral over $k_g$ is eliminated using the momentum conservation, $$\vec{k}_i+\vec{k}_j=\vec{k}_f+\vec{k}_g \quad (15)$$

Now, substituting the above relation in the energy conserving equation, one can eliminate $k_g$ and solve for the value of $k_f$ in terms of $k_i$, $k_j$, $\alpha$ and $\gamma$ using $$E_i + \frac{\hbar^2 \vec{k}_j \cdot \vec{k}_j}{2m^*} + E_j + \frac{\hbar^2 \vec{k}_j \cdot \vec{k}_j}{2m^*} = E_f + \frac{\hbar^2 \vec{k}_j \cdot \vec{k}_j}{2m^*} + E_g + \frac{\hbar^2 \vec{k}_g \cdot \vec{k}_g}{2m^*} \quad (16)$$

Solving the resulting quadratic equation, $$|\vec{k}_f| = [k_i\cos(\gamma) + k_j\cos(\gamma-\alpha)] \pm \quad (17)$$
$$\frac{1}{2}[(k_i\cos(\gamma)+k_j\cos(\gamma-\alpha))^2 - 4(k_ik_j\cos(\alpha)-\Delta^2)]^{1/2}$$

where $\Delta^2=(m^*/\hbar^2)(E_i+E_j-E_f-E_g)$. Having calculated the value of $k_f$ one can calculate the value of $k_g$ from the vector diagram in FIG. 13.

$$|\vec{k}_g|=\{[|k_i|+|k_j|\cos(\alpha)-|k_f|\cos(\gamma)]^2+[|k_f|\sin(\gamma)-|k_j|\sin(\alpha)]^2\}^{1/2} \quad (18)$$

Now the integral over $k_f$ can be written as the following:

$$\int d^2\vec{k}_f = \int k_f dk_f \int d\gamma = \frac{m^*}{\hbar^2}\int dE_f \int d\lambda \quad (19)$$

Using the above relation, the final expression for the scattering rate is given by the following:

$$W = \frac{m*e^4}{2\pi\hbar^3 \varepsilon_r^2 \varepsilon_0^2} \quad (20)$$

$$\int k_j dk_j \int_0^{2\pi} d\alpha \int_0^{2\pi} d\gamma \frac{|A_{1,j\to f,g}|^2}{q^2} f(k_j)(1-f(\vec{k}_f))(1-f(\vec{k}_g))$$

Before computing the scattering rate itself, the form factor, $|A_{i,j\to f,g}|^2$ involved in e-e scattering can be considered. The form factor can be computed as a function of the bias applied across the quantum well structure for, both single quantum well (intrawell) and coupled quantum well (interwell) systems. These systems comprise the emitter region of the THz quantum cascade structure in accordance with the preferred embodiment. The oscillator strength, which is a direct measure of the probability of radiative transition, can also be computed as a function of the applied bias.

Figure 14:
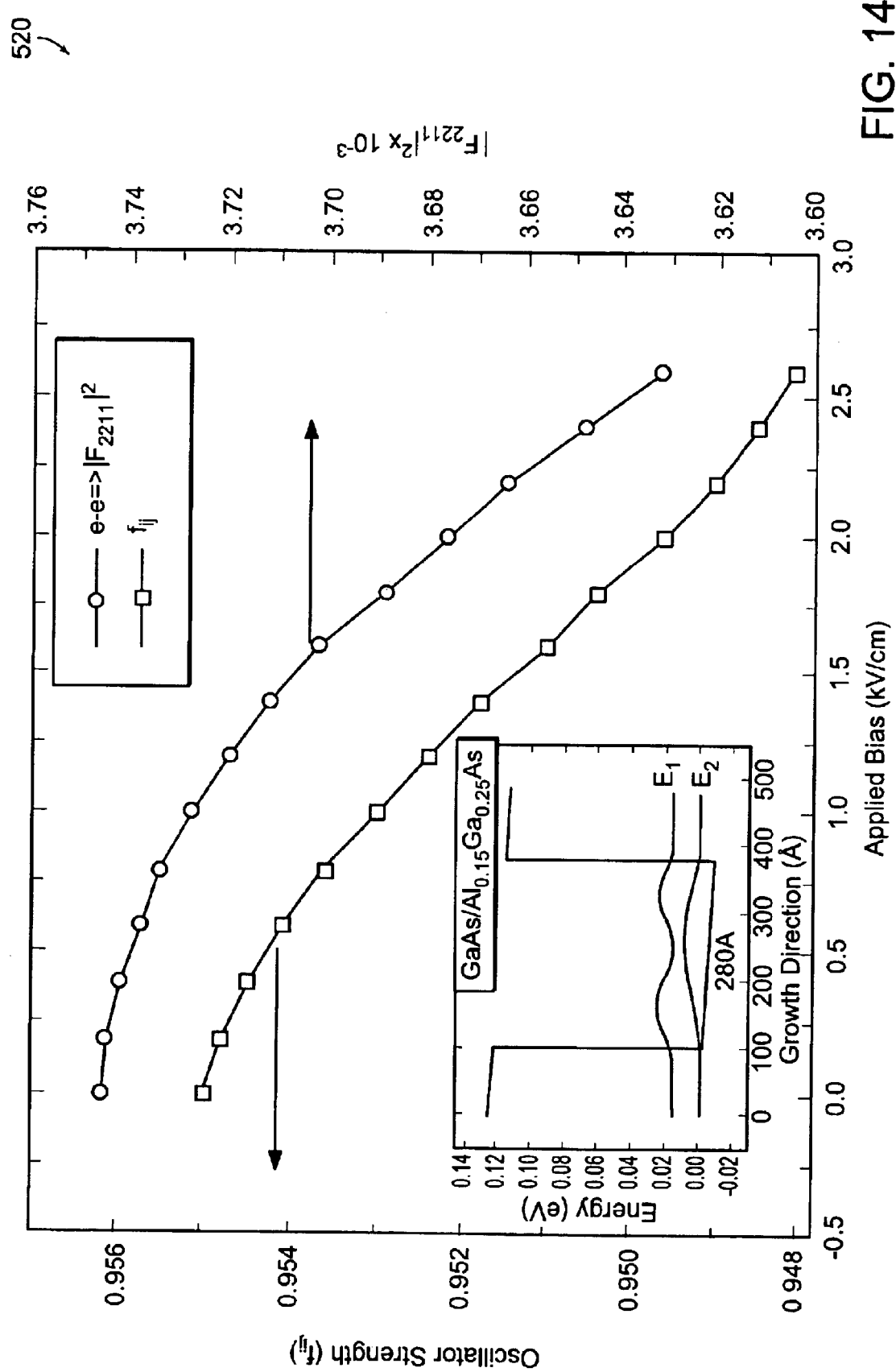
FIG. 14 is a graphical illustration of the e-e form factor and the oscillator strength shown as a function of the applied bias for a single quantum well system in accordance with a preferred embodiment of the present invention.
Figure 15:
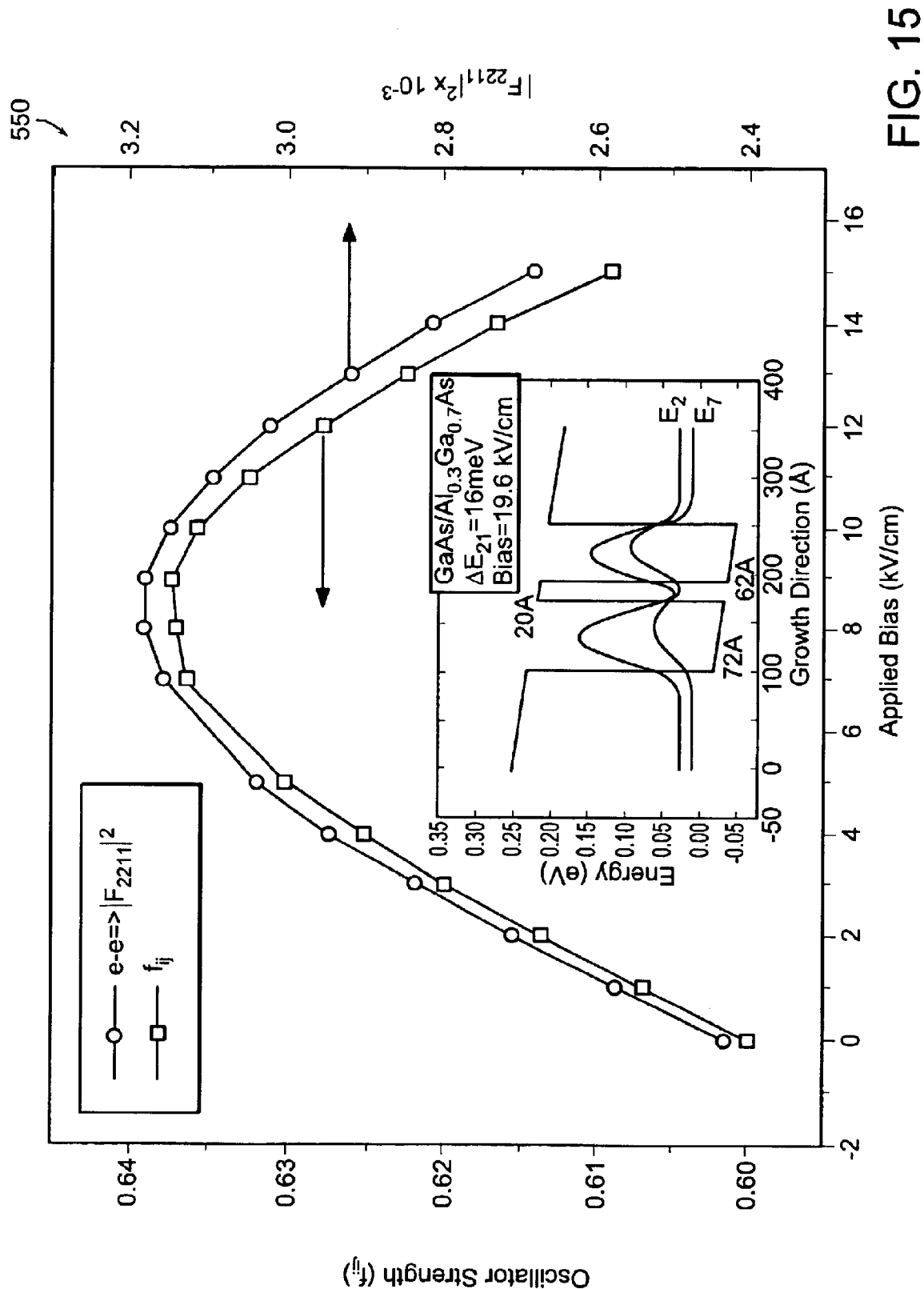
FIG. 15 is a graphical illustration of the e-e form factor and the oscillator strength shown as a function of applied bias for a coupled quantum well system in accordance with a preferred embodiment of the present invention.

FIG. 14 is a graphical illustration of the e-e form factor and the oscillator strength as a function of the applied bias for a single quantum well system that emits in the far infrared region of the spectrum in accordance with a preferred embodiment. The inset shows the single quantum well system structure for interwell THz emission. FIG. 15 is a graphical illustration of the e-e form factor and the oscillator strength as a function of applied bias for a preferred embodiment coupled quantum well system designed for emission in the THz region of the spectrum. The inset shows the coupled well system at a bias of 19.6 kV/cm. It can be seen from FIG. 14 and FIG. 15 that the e-e form factor tracks the oscillator strength. This tracking behavior can be explained on the following basis. As the bias increases, the symmetry of the quantum well is lost and the overlap between levels 1 and 2 decreases. Since both the e-e form factor as well as the oscillator strength depends strongly on the nature of localization of wavefunctions, also, the tracking behavior is observed.

Similar behavior is exhibited by the coupled well system as one increases the bias, the energy levels get closer and anticross. This corresponds to the position where maximum overlap occurs. On increasing the bias further, the spatial separation between the wavefunctions increases, hence the oscillator strength as well as the e-e form factor decreases.

For the intrawell system as well as the interwell system, the e-e form factor tracks the oscillator strength. This indicates that there is no possibility of maximizing the oscillator strength while minimizing the scattering rate. The device performance in a particular embodiment depends on the net intersubband gain where the oscillator strength and the e-e scattering rate enter in a more complex way.

Figure 16:
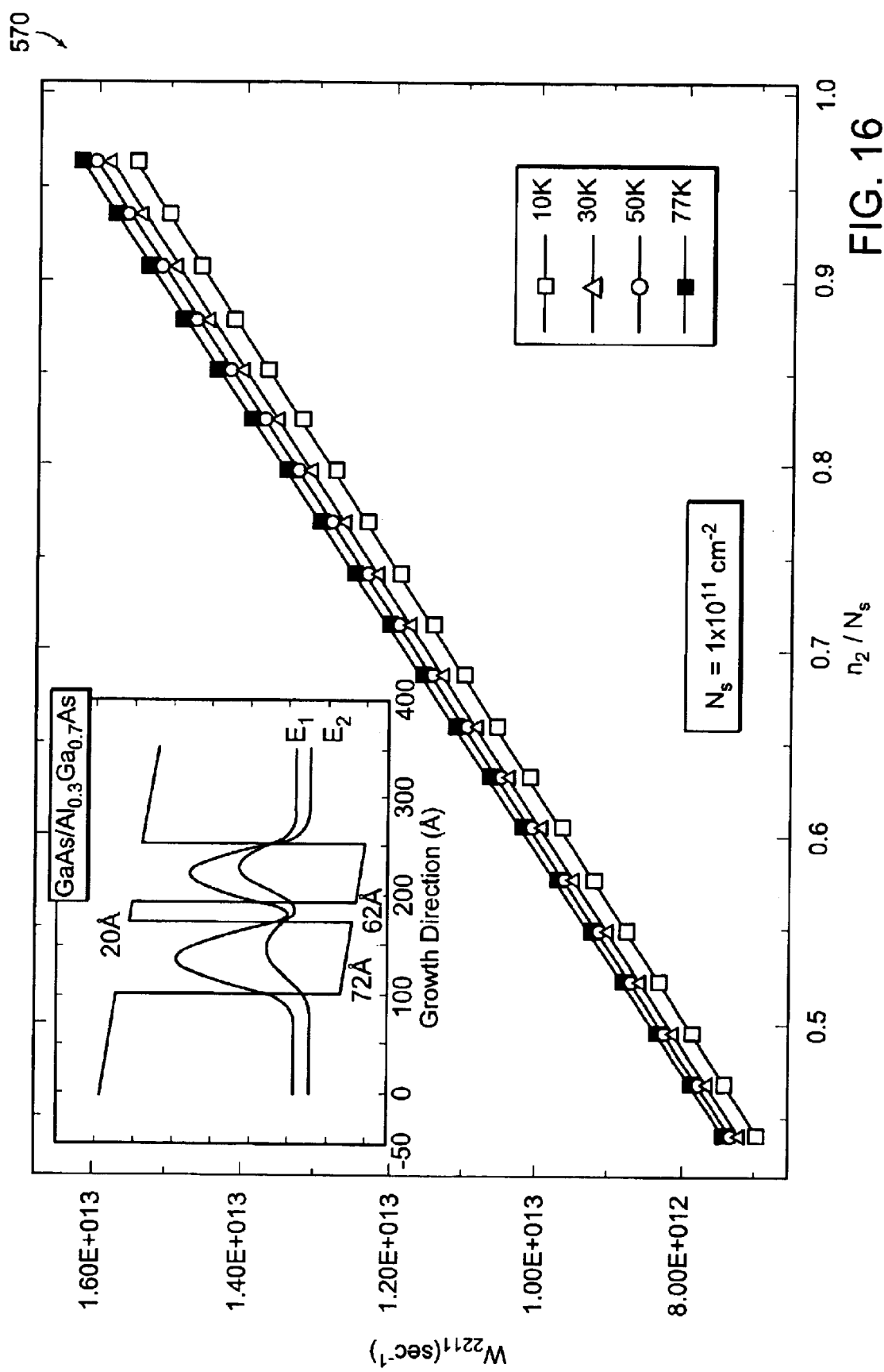
FIG. 16 is a graphical illustration of the e-e scattering rate for the 2211 process as a function of upper subband population for different operating temperatures in accordance with a preferred embodiment of the present invention.

The variation of the e-e scattering rate for the coupled quantum well system with upper subband population and different temperatures is considered. FIG. 16 shows that the e-e scattering rate is proportional to the upper subband density. Also, there is a slight increase in the e-e scattering rate with temperature. The e-e scattering rate for the 2211 process as a function of upper subband population for different operating temperatures is shown. The coupled quantum well system for which the rates are computed is shown in the inset.

Figure 17:
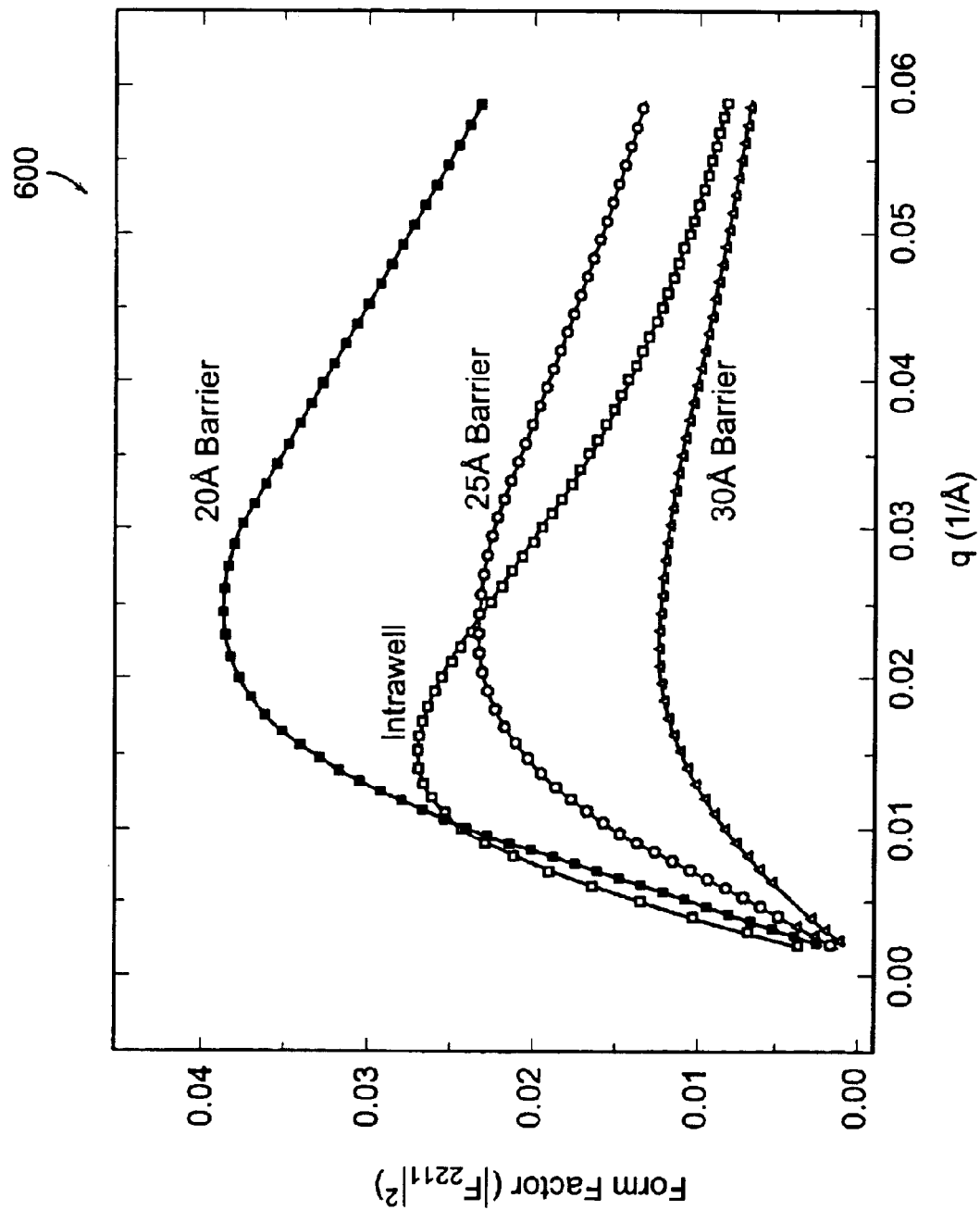
FIG. 17 is graphical representation of the e-e form factor as a function of relative wavevector in accordance with a preferred embodiment of the present invention.

To determine if there is any advantage in using the interwell system over the intrawell system, an analysis of the e-e form factor as well as the scattering rate for the two systems is conducted in accordance with a preferred embodiment of the present invention. FIG. 17 shows the form factor for different barrier widths as a function of in-plane wavevector (q). The e-e form factor as a function of relative wavevector of the initial and final electrons for different barrier widths is illustrated. The intrawell embodiment is plotted in open squares. As can be seen from FIG. 17, the relative merit of the interwell to intrawell system depends on the particular structure. The interwell system with the 30 Å barrier can be seen to have a lower form factor than the intrawell embodiment for all values of in-plane wavevector.

Figures 18A, 18B:
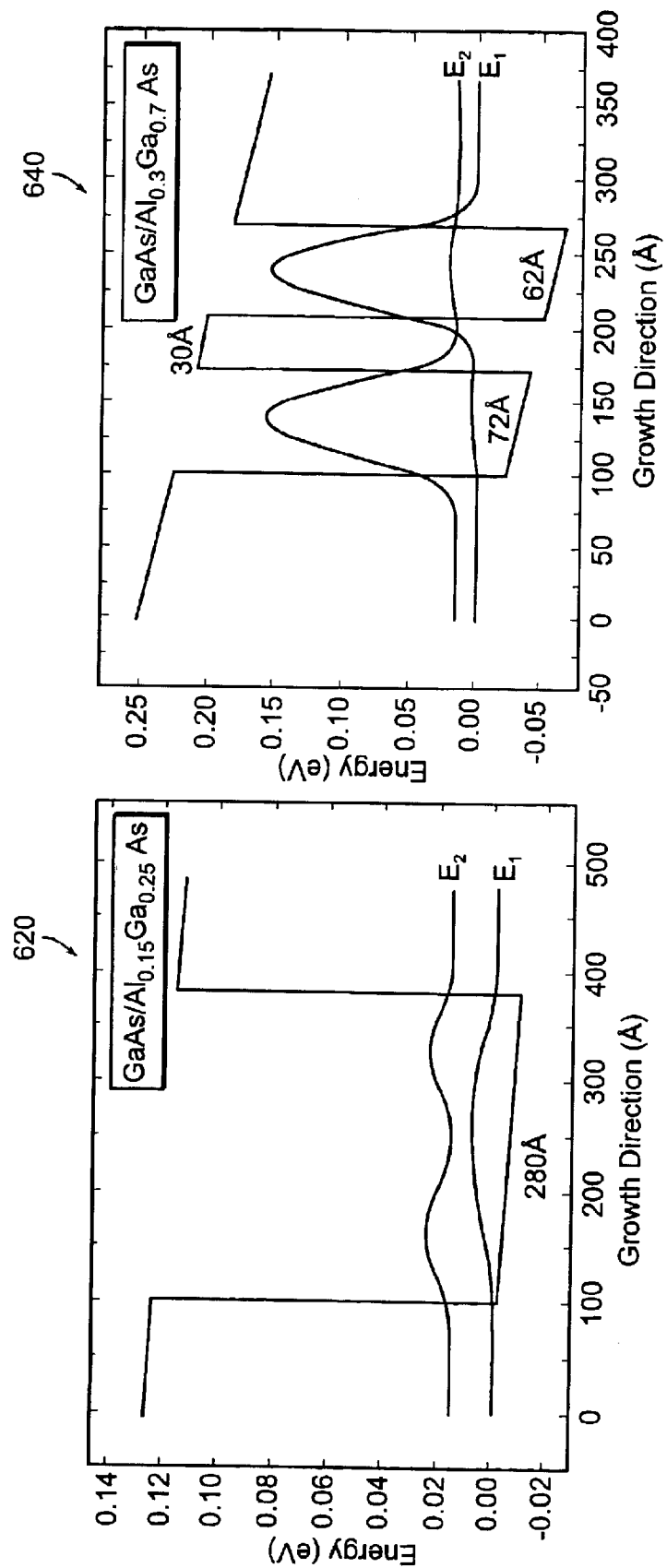
FIGS. 18A and 18B are conduction band profiles along with the squared moduli of the wavefunctions for the intrawell and interwell quantum well systems, respectively, in accordance with a preferred embodiment of the present invention.

The scattering rates can now be evaluated explicitly to verify the merit of the interwell system over the intrawell system. The conduction band profile of the two structures in accordance with preferred embodiments is shown in FIGS. 18A and 18B along with the squared moduli of the wavefunctions. The intrawell and interwell quantum well systems that operate for emissions at λ=78 μm are illustrated.

Figure 19:
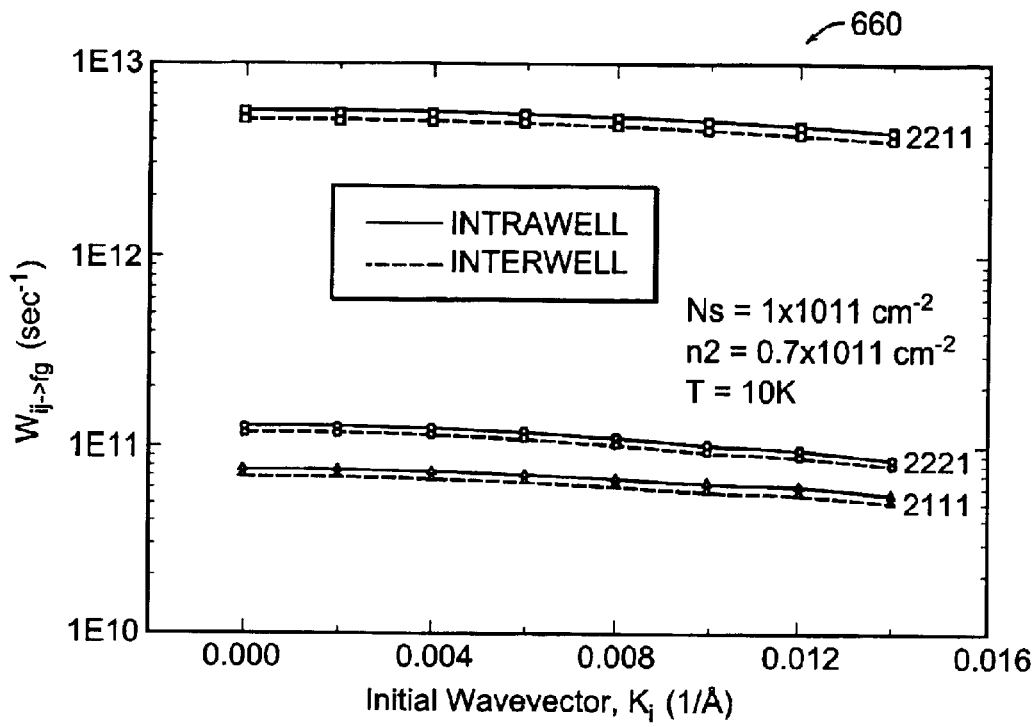
FIG. 19 is a graphical illustration of the e-e scattering rate for interwell and intrawell systems in accordance with a preferred embodiment of the present invention.

The scattering rates for the various e-e scattering processes like the 2211, 2221 and 2111 are computed for the above structures and compared. The results of this analysis are shown in the FIG. 19 which illustrates the e-e scattering rate for interwell and intrawell systems for different processes as a function of initial wavevectors. It can be seen from FIG. 19 that the interwell embodiment has a lower scattering rate than the intrawell embodiment. Efficient wavefunction engineering can further enhance this advantage. Also, it is seen that the 2211 process is the most dominant intrasubband e-e scattering mechanism.

Figure 20:
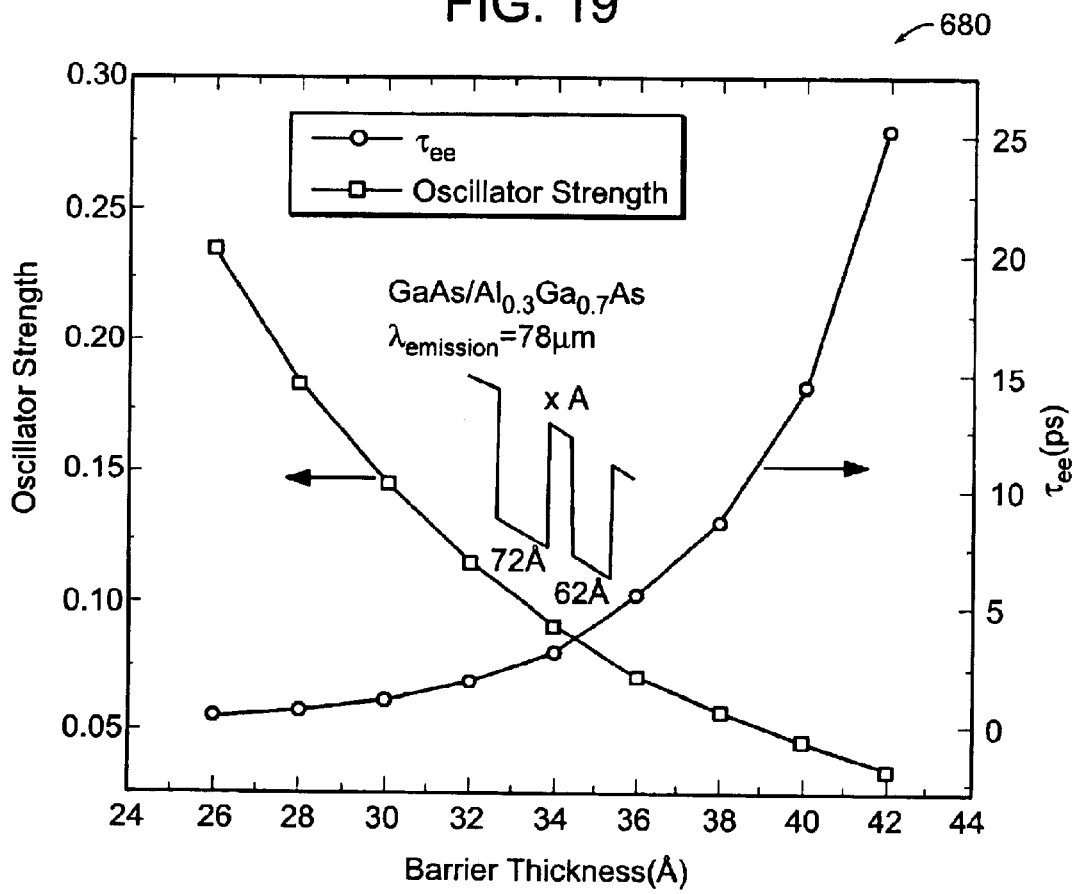
FIG. 20 graphically illustrates the e-e scattering lifetime for a coupled quantum well system as a function of barrier width in accordance with a preferred embodiment of the present invention.

Having established the advantage of the interwell system over the intrawell system, the variation of the e-e scattering lifetime as a function of barrier thickness for a coupled quantum well system can be examined. The emission wavelength (intersubband energy spacing), quantum well widths and material composition are kept fixed. The results of this analysis are shown in FIG. 20. Also plotted is the oscillator strength. The material and structural parameters are given in the inset. It can be seen that the e-e lifetime increases with barrier thickness, but at the same time the oscillator strength falls. The peak gain for each of these structures provides an understanding for the preferred structure. The analysis indicates that the intersubband e-e scattering rate is proportional to the upper subband population and there is no appreciable temperature dependence. The 2211 process is the most efficient scattering mechanism in the embodiment and the rates can be as high as 10 ps$^{-1}$. The interwell scheme thus can increase the e-e lifetime, which helps in attaining population inversion, although this can be at the expense of oscillator strength.

The electron-phonon scattering rate is considered along with an analysis of the electron-LO phonon interaction in a triple quantum well structure, which acts as the active region in an intersubband THz emitter. The phonon modes of the heterostructure are calculated using a transfer matrix method within the framework of the dielectric continuum model. Unlike calculations that approximate phonon scattering rates using bulk-like phonon modes, the presence of specific interface and layer-confined phonon modes are exploited. The electronic levels are selected to be in resonance with one of the phonon modes for optimizing phonon-scattering rates and to enhance device performance. The analysis indicates that it is beneficial to utilize the higher energy interface (IF) phonon modes rather than the confined phonon modes for faster depopulation in a three-level lasing system. Scattering rates for two different structures are computed to establish the result.

The effects of confinement and localization of optical phonon modes in heterostructures have been discussed widely over the last several years using different models. It is only recently that the importance of these effects on the device performance has been addressed. Most designs for far IR QCLs presented in the past used the bulk LO phonon modes in their device simulation.

The phonon modes, after including confinement effects are analyzed, and used to evaluate the intersubband electron-LO phonon scattering rates in a GaAs/Al$_{0.3}$Ga$_{0.7}$As triple quantum well system, which acts as the active region in a THz intersubband source. As referenced hereinbefore, the electron-electron scattering rates in these devices are on the order of 1–10 ps$^{-1}$. To attain population inversion between the lasing levels (levels |3> and |2>), electrons have to be depopulated from the lower lasing level (level |2>) at a rate faster than that of the down transition from the upper level. A natural scheme for this depopulation is to use LO-phonon emission to extract electrons from level |2> to level |1>. Hence, the lowest level (level |1>) of the active region is located exactly one bulk LO phonon energy below level |2>, requiring $\Delta E_{21}$=36.25 meV in GaAs, for example.

For energy ranges in the far IR, where $\Delta E_{32} \cong$ 10–15 meV the above choice of the depopulation mechanism leads to a value of $\Delta E_{31} \cong$ 45–50 meV which coincides with the AlAs-like IF phonon frequency. This introduces another undesired channel of non-radiative relaxation for level |3>. If a system is selected, such that $\Delta E_{21}$ is in resonance with one of the higher energy IF phonon modes (AlAs-like modes), then such an energy level configuration ensures that $\Delta E_{31}$ is not at all in resonance with any of the phonon modes, thus making $\Delta E_{31}$ large. For a resonant phonon-assisted depopulation process, it is desirable to tailor the phonon frequencies and wavefunctions. Hence, it is important to perform an accurate analysis of the electron-LO phonon scattering rates, taking into account both the confined and the interface phonon modes. A general transfer matrix method (TMM) under the framework of the microscopic dielectric continuum model (DCM) is used in accordance with a preferred embodiment.

Figures 21A, 21B:
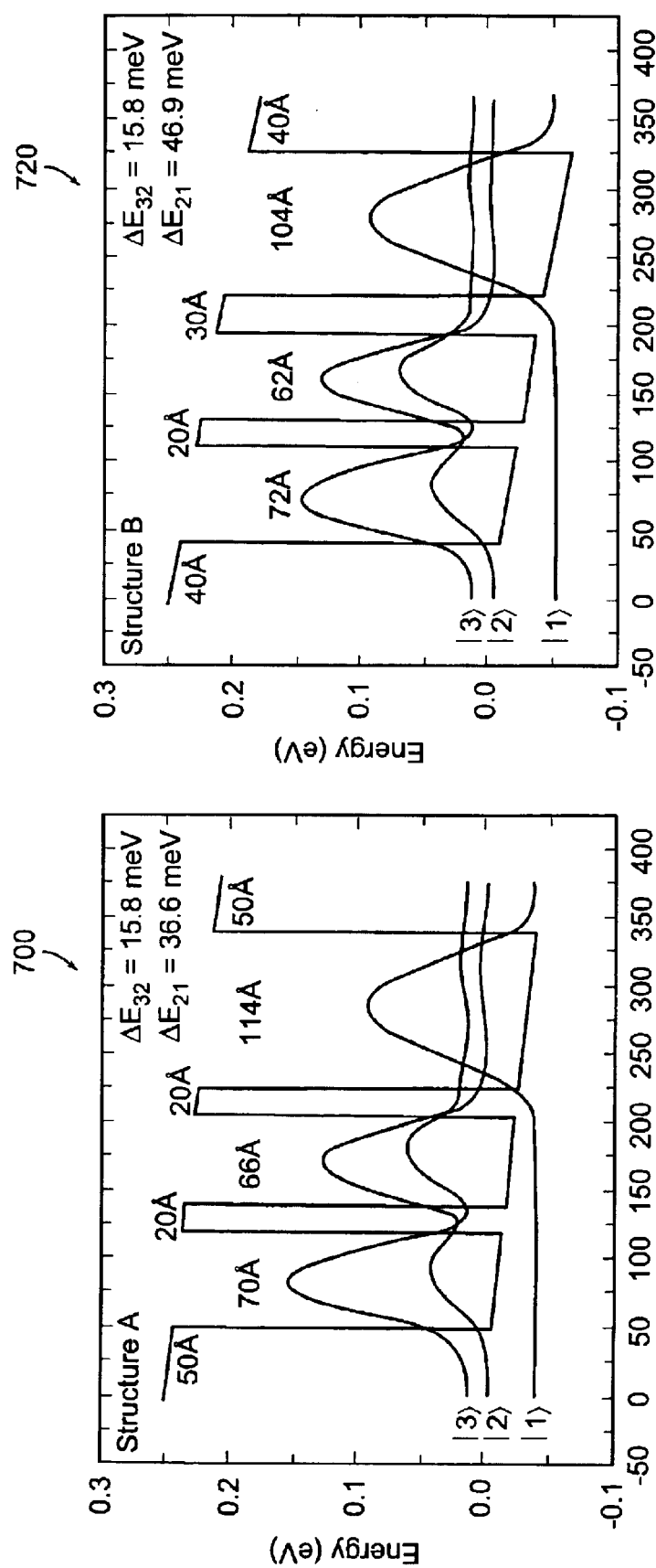
FIGS. 21A and 21B are graphical illustrations of conduction band profile along with the squared magnitude of wavefunctions of the active region of an intersubband THz laser wherein FIG. 21A structure A uses the bulk phonon modes for depopulation and in FIG. 21B structure B uses the interface phonon modes in accordance with a preferred embodiment of the present invention.

In preferred embodiments, two structures are considered, where the first structure uses the bulk modes for depopulation, and the second structure uses IF modes for depopulation. The phonon mediated lifetimes for the two structures are then compared to establish the advantage of the second structure relative to the first structure. The first and second structures are shown in FIGS. 21A and 21B, respectively, along with the corresponding energy levels and squared moduli of the wavefunctions. Both structures have GaAs quantum wells separated by Al$_{0.3}$Ga$_{0.7}$As barriers and are selected for an emission wavelength of 78 μm.

The electron-phonon interaction Hamiltonian is given by $$H_{e-ph} = \sum_q -e\Phi(q,z)e^{iq\cdot r}\left[\frac{\hbar}{2\omega}\right](\hat{a}_q + \hat{a}_q^+) \quad (21)$$

where $\Phi$ is the phonon wavefunction along the growth direction, $\alpha_q$ and $\alpha_q^+$ are the phonon annihilation and creation operators. The values of the dielectric constants as well as the phonon frequencies for the materials used are given in Table 2.

TABLE 2

Dielectric constants and the LO and TO phonon frequencies in meV for a GaAs/AlGaAs material system.

| | GaAs | Al$_x$Ga$_{1-x}$As |
|---|---|---|
| $\epsilon_\infty$ | 10.89 | 10.89 − 2.73 x |
| h $\omega_{LO}$ (GaAs-like) (meV) | 36.25 | 36.25 − 6.55 x + 1.79 x$^2$ |
| h $\omega_{TO}$ (GaAs-like) (meV) | 33.29 | 33.29 − 0.64 x − 1.16 x$^2$ |
| h $\omega_{LO}$ (AlAs-like) (meV) | | 44.63 + 8.78 x − 3.32 x$^2$ |
| h $\omega_{TO}$ (AlAs-like) (meV) | | 44.63 + 0.55 x − 0.30 x$^2$ |

Confined phonon modes are assumed to be completely confined within a particular region (barrier or well). The form of the confined phonon modes along the growth direction can be expressed as:

$$\Phi_{conf} = \sqrt{\frac{2}{L_w}} \sin[q_z z], \; q_z = \frac{n\pi}{L_w}, \; n = 1, 2, 3 \ldots \quad (22)$$

Figures 22A, 22B:
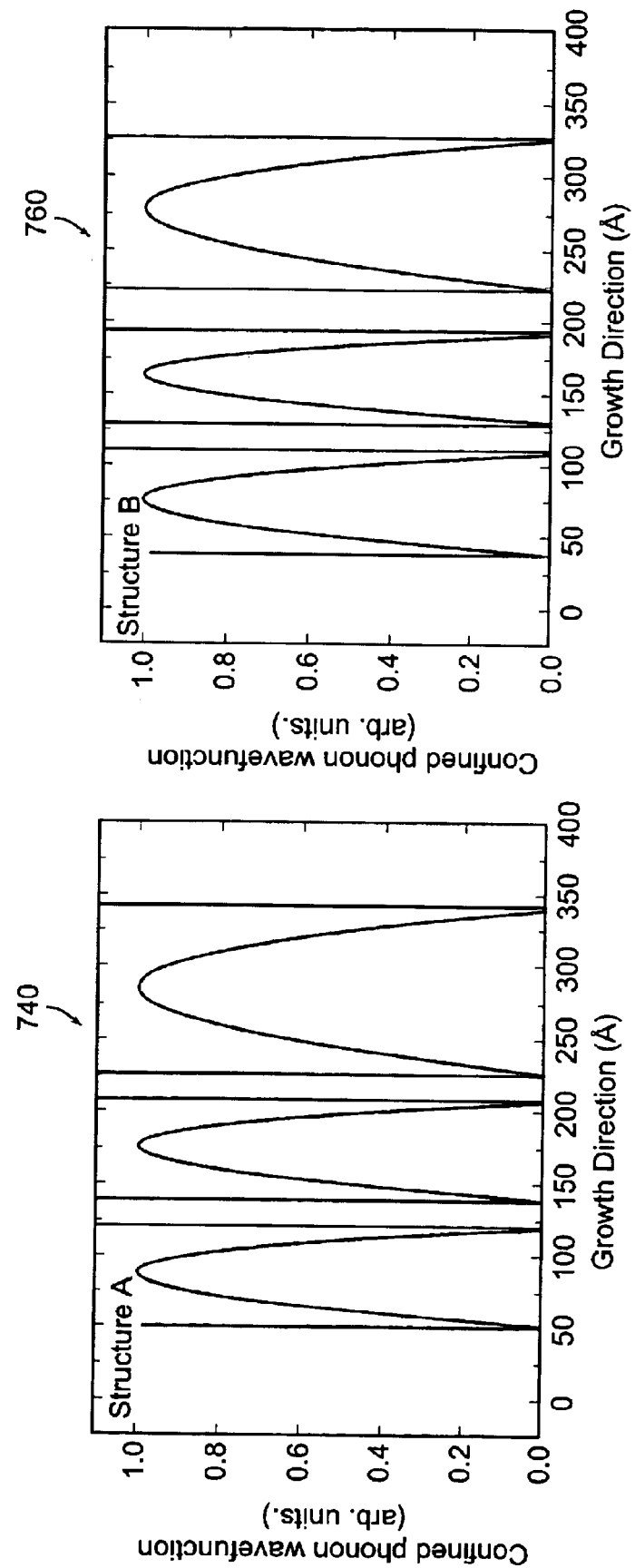
FIGS. 22A and 22B graphically illustrate for structure A and structure B the confined phonon wavefunctions as a function of position in accordance with a preferred embodiment of the present invention.

The frequency of the confined phonon mode in the quantum well is equal to the LO phonon frequency of the well material. Hence in the GaAs quantum well, the confined phonon frequency is 36.25 meV. FIGS. 22A and 22B show the confined phonon modes present in the quantum wells for the two structures. The confined modes of the barriers have not been included because the barriers are extremely thin and hence their coupling to the electronic wavefunctions is very weak.

Interface phonon modes are characterized by their decreasing amplitude away from a heterointerface. The frequencies of these modes depend on the type of materials used in the heterostructure (binary or ternary) and the number of these modes depends on the number of interfaces in the structure. The dielectric function for any particular layer is given by the generalized Lyddane-Sachs-Teller relation:

$$\text{Binary material: } \varepsilon_i(\omega) = \varepsilon_i(\infty)\left[\frac{\omega^2 - \omega_{LO}^2}{\omega^2 - \omega_{TO}^2}\right] \quad (23)$$

$$\text{Ternary material: } \varepsilon_i(\omega) = \varepsilon_i(\infty)\left[\frac{\omega^2 - \omega_{LOA}^2}{\omega^2 - \omega_{TOA}^2}\right]\left[\frac{\omega^2 - \omega_{LOB}^2}{\omega^2 - \omega_{TOB}^2}\right] \quad (24)$$

where $\omega_{LO}$ and $\omega_{TO}$ correspond to the longitudinal and transverse optical phonon frequencies, and the subscripts A and B denote the two binary materials that make up the ternary. For example, in an AlGaAs-like ternary system, $\omega_{LOA}$ and $\omega_{TOA}$ correspond to GaAs and $\omega_{LOB}$ and $\omega_{TOB}$ correspond to AlAs. For an 'n' layered system of only binary materials there will be 2n IF modes. If there are n interfaces of alternating binary and ternary materials (as in the structures exemplified herein), there will be 3n IF modes due to the two binary-like modes of the ternary material. The form of the IF phonon mode along the growth direction in any given layer can be expressed as $$\Phi_i(q,z) = A_i e^{-q|z|} + B_i e^{+q|z|} \quad (25)$$

where $q_\parallel$ is the phonon wave vector in the in-plane direction and is given by $$q_\parallel = \sqrt{k_i^2 + k_f^2 - 2k_i k_f \cos\theta} \quad (26)$$

$$k_f^2 = k_i^2 + (2m^*/\hbar^2)(E_i - E_f \pm \hbar\omega_{ph})$$

$k_i$ and $k_f$ are the initial and final wavevectors of the electrons involved in the emission or absorption of a phonon of frequency $\hbar\omega_{ph}$. In accordance with the electrostatic boundary conditions of the DCM, the phonon potential as well as the tangential component of the electric field have to be continuous across each heterointerface. Hence, between the $i^{th}$ and $i+1^{th}$ layers, it follows, $$\Phi_i(q,z_i) = \Phi_{i+1}(q,z_i) \quad (27)$$

$$\varepsilon_i \frac{\partial}{\partial z}\Phi_i(q, z_i) = \varepsilon_{i+1}\frac{\partial}{\partial z}\Phi_{i+1}(q, z_i) \quad (28)$$

A TMM is used to compute the phonon frequencies as well as the form of the phonon modes. All computations and analysis are performed for an embodiment where the initial electron wavevector $k_i=0$, in which case the phonon wave vector $q_\parallel$ is equal to $k_f$. Applying the boundary conditions, one can relate the coefficients of layer i+1 with that of i. It follows that $$A_{i+1} = \frac{1}{2}[(1+\eta_i)A_i e^{-q_\parallel d_i} + (1-\eta_i)B_i] \quad (29)$$

$$B_{i+1} = \frac{1}{2}[(1+\eta_i)A_i e^{-q_\parallel(d_i - d_{i+1})} + (1-\eta_i)B_i e^{q_\parallel d_{i+1}}]$$

where $\eta_i = \varepsilon_i/\varepsilon_{i+1}$ and $d_i = z_{i+1} - z_i$. The above relations can be written in a matrix notation using 2×2 transfer matrices for each layer in the form $$\begin{pmatrix} A_{N+1} \\ B_{N+1} \end{pmatrix} = \begin{bmatrix} m_{11} & m_{12} \\ m_{21} & m_{22} \end{bmatrix}_N \begin{bmatrix} m_{11} & m_{12} \\ m_{21} & m_{22} \end{bmatrix}_{N-1} \cdots \begin{bmatrix} m_{11} & m_{12} \\ m_{21} & m_{22} \end{bmatrix}_1 \begin{pmatrix} A_1 \\ B_1 \end{pmatrix} \quad (30)$$

The above matrix equation can be written in a compact notation as shown in Equation 31, where M corresponds to the product of all the matrices.

$$\begin{pmatrix} A_{N+1} \\ b_{N+1} \end{pmatrix} = \begin{bmatrix} M_{11} & M_{12} \\ M_{21} & M_{22} \end{bmatrix}\begin{pmatrix} A_1 \\ B_1 \end{pmatrix} \quad (31)$$

The phonon frequencies along with the corresponding phonon wavevectors are obtained by requiring $A_1=0$ and $B_{N+1}=0$. These conditions lead to exponentially damped solutions as z tends to $\pm\infty$. implementing the above conditions require the $M_{22}$ element of the transfer matrix to be equal to zero. The normalization condition for the IF phonon mode is given by $$\frac{\hbar}{2\omega} = \sum_i \frac{\varepsilon_0}{2\omega}\frac{\partial\varepsilon_i(\omega)}{\partial\omega}\int_{Layer(i)} dz\left(q_\parallel^2|\Phi_i(q,z)^2| + \left|\frac{\partial\Phi_i(q,z)}{\partial z}\right|^2\right) \quad (32)$$

Having found the IF phonon frequencies, wavevectors and normalization constants, the form of the phonon wavefunctions is then reconstructed. Only the lowest three electronic energy levels of the triple quantum well structure are used. The solutions of the TMM for the IF phonon frequencies for the two different transitions, $|3\rangle \to |1\rangle$ and $|2\rangle \to |1\rangle$ in the two structures are shown in Table 3. Here $|3\rangle \to |2\rangle$ is not considered because the corresponding energy separation is lower than the LO phonon frequencies for the emitter designs in accordance with the present invention.

TABLE 3

Allowed interface phonon frequencies for the two structures

| | | First Structure | | Second Structure | |
|---|---|---|---|---|---|
| Mode type | | $E_2 - E_1$ (36.66 meV) | $E_3 - E_1$ (52.54 meV) | $E_2 - E_1$ (46.97 meV) | $E_3 - E_1$ (62.79 meV) |
| Phonon frequencies (meV) | Lower GaAs like | 32.99 | 33.01 | 33.00 | 33.02 |
| | | 33.03 | 33.02 | 33.02 | 33.04 |
| | | 33.07 | 33.08 | 33.08 | 33.08 |
| | | 33.11 | 33.09 | 33.09 | 33.09 |
| | | 33.24 | 33.19 | 33.19 | 33.16 |
| | | 33.27 | 33.22 | 33.23 | 33.20 |
| | Upper GaAs like | 34.48 | 34.64 | 34.61 | 34.73 |
| | | 34.54 | 34.77 | 34.78 | 34.79 |
| | | 35.09 | 35.32 | 35.29 | 35.33 |
| | | 35.68 | 35.37 | 35.40 | 35.36 |
| | | 36.22 | 35.94 | 35.93 | 35.79 |
| | | 36.24 | 36.06 | 36.10 | 35.97 |
| | AlAs like | — | 44.89 | 44.81 | 45.03 |
| | | — | 45.03 | 44.91 | 45.26 |
| | | — | 45.81 | 45.54 | 45.87 |
| | | — | 46.01 | 46.44 | 45.95 |
| | | — | 46.70 | 46.90 | 46.54 |
| | | — | 46.88 | 46.96 | 46.75 |

In the first structure, since the $\Delta E_{21}$ is only 36.6 meV, only twelve of the 18 IF phonon frequencies can influence electron relaxation via emission at $k_i=0$, whereas the energy difference $\Delta E_{31}$, which equals 52.54 meV, allows transitions employing all 18 IF modes. For the second structure, due to its larger energy separation, $\Delta E_{21}=46.98$ meV and $\Delta E_{31}=62.78$ meV, allows all the 18 IF modes for both the transitions. FIGS. 23A and 23B show the upper GaAs-like IF modes for first and second structures, respectively. Shapes of the other modes (lower GaAs-like and AlAs-like modes) are similar to the upper GaAs-like modes shown in FIGS. 23A and 23B.

Having determined the electronic wavefunctions, electron-phonon interaction Hamiltonian and the phonon wavefunctions, the electron-phonon scattering rate is derived using the Fermi rule. The scattering rate for the situation corresponding to an electron in initial state $k_i$ going to a final state $k_f$ by emitting a phonon of frequency $\omega$ is given by the following:

$$W_{if} = \frac{m^* e^2}{2\pi \hbar^2 \varepsilon_0 C(\omega)}(n+1)\int_0^{2\pi} G_{if}\, d\theta = \left(\frac{1}{\tau_{if}}\right)_{LO} \quad (33)$$

where m* and e are the effective mass and charge of the electron, respectively, $C(\omega)$ is the electron-phonon coupling coefficient, n+1 corresponds to emission of phonon and $G_{if}$ is the form factor which depends on the type of phonon mode (confined or interface) and also on the heterostructure.

To determine the confined phonon scattering rate, the coupling coefficient and the form factor for scattering via confined phonons are as follows $$(C(\omega))^{-1} = \left(\frac{\omega}{2}\right)\left(\frac{1}{\varepsilon_\infty} - \frac{1}{\varepsilon(0)}\right) \quad (34)$$

$$G_{if}^{conf} = \frac{\left|\int_L \psi_f \Phi^c \psi_i\, dz\right|^2}{q_\parallel^2 + q_z^2} \quad (35)$$

where $\omega$ is the LO phonon frequency of the quantum well material, $\varepsilon_\infty$ and $\varepsilon(0)$ are the optical and static dielectric constants, $\psi_i$ and $\psi_f$ are the z dependent wavefunctions of the initial and final electronic states and $\Phi^c$ is the confined phonon potential. The confined phonon scattering rates between the three electronic states for the two different structures are given in Table 4.

TABLE 4

Confined phonon scattering rates between the various energy levels for the two structures

|  | First Structure | Second Structure |
| --- | --- | --- |
| $(W^C)_{2\to 1}$ (ps$^{-1}$) | 1.920 | 0.305 |
| $(W^C)_{3\to 1}$ (ps$^{-1}$) | 0.455 | 0.094 |

To determine the interface phonon scattering rate, the coupling coefficient and form factor for a preferred embodiment is given by the following:

$$(C(\omega))^{-1} = \left(\frac{\partial \varepsilon_i}{\partial \omega}\right)^{-1} \quad (36)$$

$$G_{if}^{IF} = \frac{\left|\int_L \psi_f \Phi^{IF} \psi_i\, dz\right|^2}{q_\parallel} \quad (37)$$

respectively, where $\varepsilon_i$ is given by Equations 23 and 24 and $\Phi^{IF}$ is the interface phonon potential. Scattering rates between the three electronic states for the two different structures are given in Table 5.

TABLE 5

Interface phonon scattering rates between the various energy levels for the two structures

|  | First Structure | Second Structure |
| --- | --- | --- |
| $(W^{IF})_{2\to 1}$ (ps$^{-1}$) | 6.067 | 16.868 |
| $(W^{IF})_{3\to 1}$ (ps$^{-1}$) | 22.901 | 4.975 |

The total scattering rate is given by the sum of the scattering rates due to all the confined and interface modes existing between the two specified energy levels.

$$W^{tot} = W^C + W^{IF} \quad (38)$$

The calculated total scattering rates for each of the two different structures are given in Table 6. It can be seen from Table 6 that in the first structure, the calculated lifetimes indicate that it is not possible to achieve population inversion between levels |3> and |2> since the phonon assisted scattering rate for |3>→|1> is greater than that of |2>→|1>, i.e., $\tau_{31} < \tau_{21}$. The second structure, on the contrary, offers a higher scattering rate for |2>→|1> than for |3>→|1> i.e. $\tau_{31} > \tau_{21}$, which was the condition derived from the rate equation for optimization of the population inversion.

TABLE 6

Total Scattering rate between the various energy levels for the two structures

|  | First Structure | Second Structure |
| --- | --- | --- |
| $(W^{tot})_{2\to 1}$ (ps$^{-1}$) | 7.980 | 17.163 |
| $(W^{tot})_{3\to 1}$ (ps$^{-1}$) | 23.38 | 5.069 |

The results indicate that one can tailor the phonon limited lifetimes in the unipolar lasers by designing heterostructures which exploit the IF phonon transitions as desired. For a GaAs/AlGaAs system having the energy separation between the two lower states (in a three level lasing system) to be in resonance with the AlAs-like interface modes is a better system for sustaining population inversion. Increasing the depopulation rate is of importance in far IR lasers due to highly competing nonradiative mechanisms between the lasing levels, which substantially raise the threshold current needed for lasing to take place. In a preferred embodiment, the threshold current is lowered. Further, one can increase the depopulation rate and thereby increase the population inversion by efficient phonon wavefunction engineering and utilization of the faster IF phonon modes.

In a preferred embodiment, the device performance parameters can be selected to improve the intersubband gain characteristics, population inversion and current densities of devices.

It can be assumed that at low temperatures (T<40 K), the main scattering mechanism that contributes to the broadening of the intersubband transition is due to electron-electron scattering. The gain between the upper two levels (level |3> and level |2>) for the three level lasing system can be given by $$g(\lambda) = \frac{\Delta N}{L_p} \frac{\lambda^2}{4\pi n^2 \tau_{spon}} \left(\frac{T_3}{1 + 4\pi^2 c^2 (\lambda^{-1} - \lambda_0^{-1})^2 T_3^2}\right) \quad (39)$$

where, $\lambda_0 = 2\pi \hbar c/\Delta E_{32}$ is the wavelength at resonance, $\Delta E_{32}$ is the intersubband energy level spacing, $T_3$ is the intersubband scattering time from level |3>, which in a particular embodiment is dominated by electron-electron scattering, ΔN is the population inversion, which depends on the injection current and the lifetimes of the energy levels. $L_p$ is the length of one period of the cascade structure, and n is the average refractive index of the well and barrier material. $\tau_{spon}$ is the spontaneous radiative lifetime and is given by the following:

$$\frac{1}{\tau_{spon}} = \left(\frac{ne^2 2\pi}{m^* \varepsilon_0 \lambda^2 c}\right) f_{ij} \quad (40)$$

where m is the effective mass of electron, $\varepsilon_0$ is the dielectric permittivity of vacuum, e is the electronic charge. $f_{ij}$ is the oscillator strength defined by the following:

$$f_{ij} = \frac{2m^* \Delta E}{\hbar^2} |\langle \psi_j | z | \psi_i \rangle|^2 \quad (41)$$

where $\Delta E$ is the subband energy spacing, and $\psi_i$ and $\psi_j$ are the initial and final electronic states. The lifetime of level |3> can be calculated using the following equation:

$$\frac{1}{\tau_3} = \frac{1}{\tau_{ac}} + \frac{1}{\tau_{ee}} + \frac{1}{\tau_{rad}} \quad (42)$$

where, $\tau_{ac}$ corresponds to the acoustic phonon mediated lifetime which is on the order of ~100 ps, $\tau_{ee}$ is the electron-electron scattering limited lifetime which in a particular embodiment is calculated and found to be on the order ~0.5 ps and $\tau_{rad}$ is the radiative lifetime which is on the order of microseconds as can be seen using Equation 40. Thus it can be inferred that the lifetime of level 3 is primarily limited by the carrier-carrier scattering mechanism.

The population inversion derived using a rate equation may be given as:

$$n_3 - n_2 = \left(\frac{\tau_3}{\tau_{32}}\right)(\tau_{32} - \tau_{21})\left[\frac{J}{e} - \overline{g}S\left(1 + \frac{\tau_{21}}{\left(\frac{\tau_3}{\tau_{32}}\right)(\tau_{32} - \tau_{21})}\right)\right] \quad (43)$$

The effect of the photon flux on the subband carrier density becomes important only above the lasing threshold. For the emitters in accordance with preferred embodiments of the present invention, this effect can be neglected and hence the population inversion is as follows:

$$n_3 - n_2 = \left(\frac{\tau_3}{\tau_{32}}\right)(\tau_{32} - \tau_{21})\frac{J}{e}. \quad (44)$$

The device performance of the two designs given in FIGS. 9A, 9B, 10A and 10B can be determined. Table 7 gives the values of lifetimes of the different energy levels along with the oscillator strength for the radiative transition. It is seen that the second structure (Structure II), has a much longer electron-electron limited lifetime, but this is attained at the expense of the oscillator strength.

TABLE 7

Calculated lifetimes of different energy levels and the oscillator strength for the two structures designed for THz emission

|  | Structure I | Structure II |
|---|---|---|
| $\tau_{32}$ (electron-electron) (ps) | 0.1 | 15.0 |
| $\tau_{21}$ (electron-phonon) (ps) | 0.06 | 0.05 |
| $\tau_{31}$ (electron-phonon) (ps) | 0.2 | 20.0 |
| $f_{32}$ (Oscillator Strength) | 0.45 | 0.003 |

Using the above set of data, the intersubband gain characteristics for the two structures can be determined. The two structures are analyzed using the same injection current ~40 kA/cm². The longer lifetime of level |3> in structure II allows greater population inversion in comparison to structure I for the same injection current.

Figure 24A:
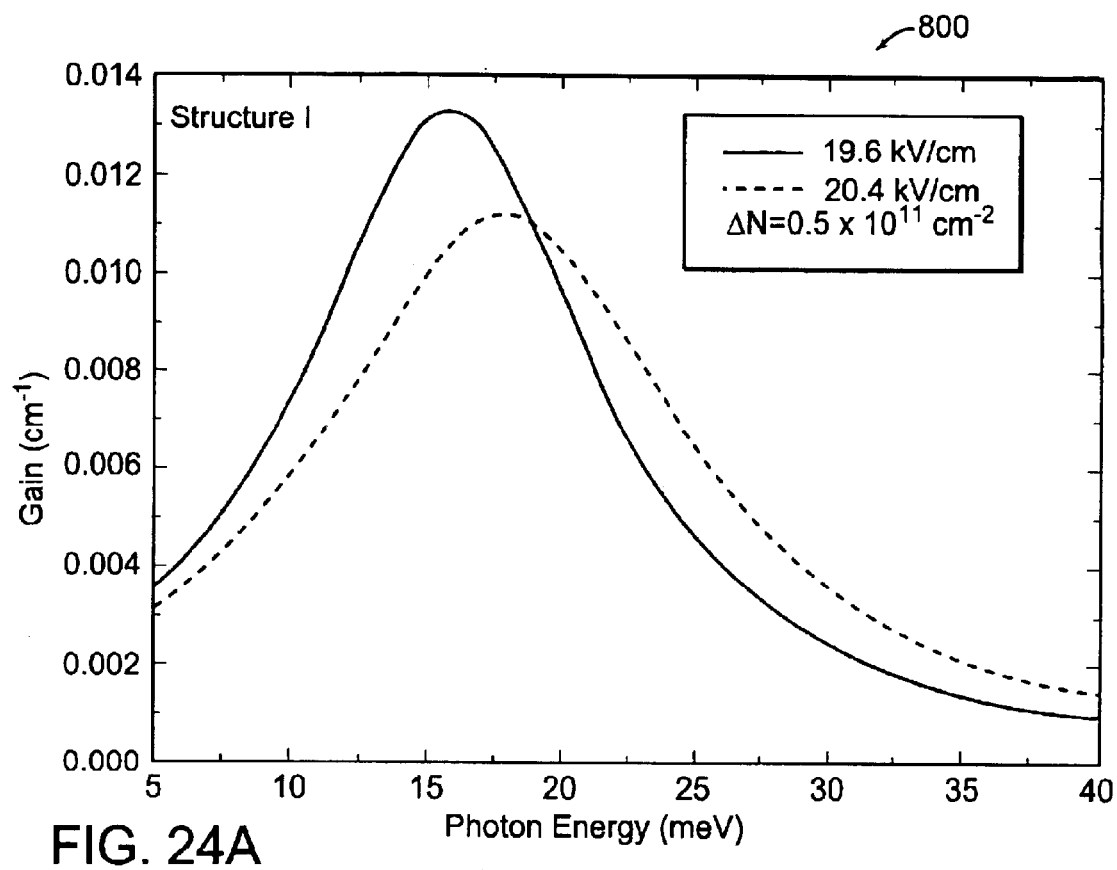
FIGS. 24A and 24B graphically illustrate the theoretical gain spectra for (a) Structure I and (b) Structure II in accordance with a preferred embodiment of the present invention.
Figure 24B:
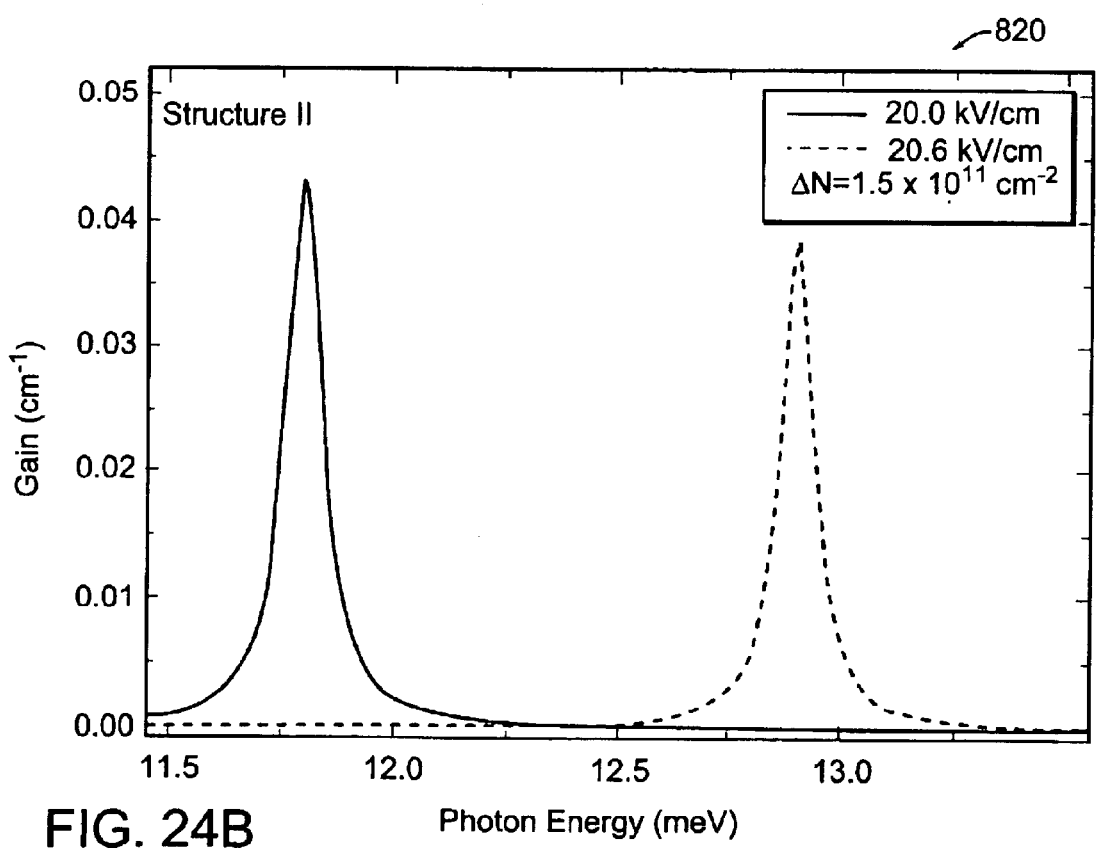

FIGS. 24A and 24B show the gain spectrum for the two structures. The dashed lines are spectra at a higher applied voltage. It is seen that structure I, in spite of having greater oscillator strength, gives lower peak gain due to reduced population inversion. The possibility of tuning the emission wavelength by making use of the quantum confined Stark shift is also analyzed. It can be seen that due to the broad spectrum exhibited by structure I, the two peaks cannot be resolved perfectly. On the other hand, structure II shows two well-resolved spectra. One feature common to both the devices is that at bias greater than the anticrossing bias, the peak gain is lowered.

Both structures are capable of showing gain, but the current densities required to get sufficient gain so as to overcome material losses are on the order of ~20–50 kA/cm². In preferred embodiments a threshold current in the range of 0.001 amps/cm²–100,000 amps/cm² can be applied to the semiconductor heterostructure in accordance with the present invention. A preferred embodiment includes improving the gain by wavefunction engineering. Here a coupled quantum well system is considered and the oscillator strength as well as the electron-electron scattering rate for different coupling barrier thickness is analyzed. The emission wavelength of a preferred embodiment is a fixed parameter. The result of this analysis is shown in FIGS. 25A and 25B.

Figure 25A:
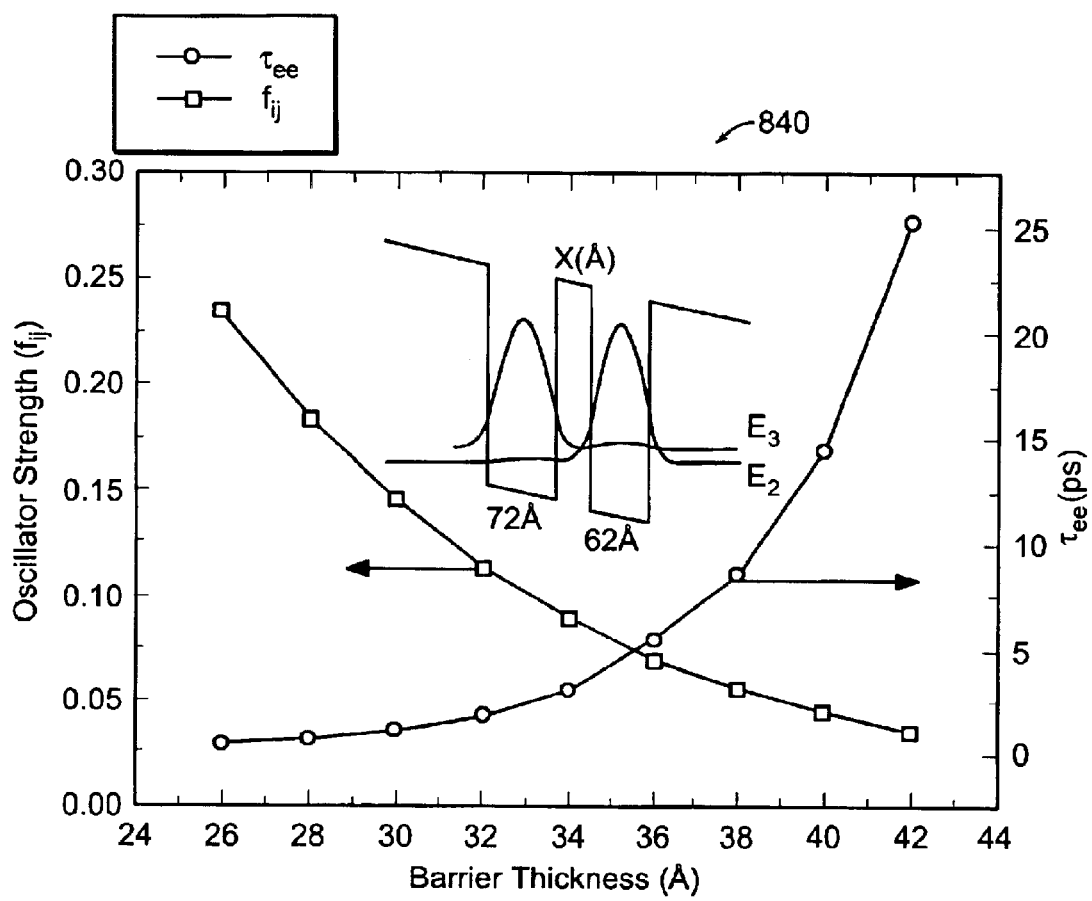
FIGS. 25A and 25B graphically illustrate (a) the oscillator strength and the electron-electron scattering mediated lifetime as a function of barrier thickness and (b) the corresponding values of peak gain in accordance with a preferred embodiment of the present invention.

FIG. 25A illustrates the oscillator strength and the e-e scattering mediated lifetime as a function of barrier thickness. FIG. 25B illustrates the corresponding values of peak gain. The analysis performed used a GaAs/AL$_{0.25}$Ga$_{0.75}$As structure as shown in the inset designed to emit at λ=78 μm. Had the scattering rate been plotted instead of the lifetime in FIG. 25A, the e-e scattering rate follows a parallel dependence on the barrier thickness as does the oscillator strength similar to the behavior seen with applied bias. But an analysis in a preferred embodiment includes the gain calculation (Equation 39) where the e-e scattering rate (1/T$_3$) and the oscillator strength ($f_{ij}$) contribute in different ways.

Figure 25B:
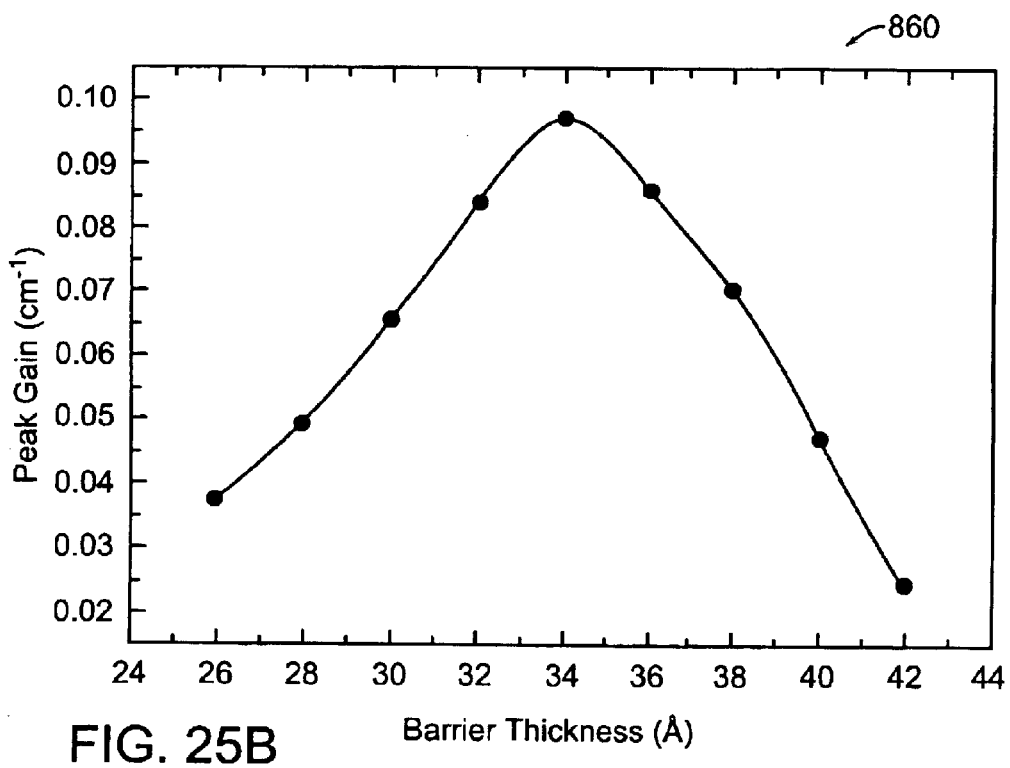

It is seen from the FIGS. 25A and 25B that having a barrier of 34 Å between two quantum wells of 72 Å and 62 Å gives the preferred performance. The result of an analysis of the gain spectra for such a structure is shown in FIG. 26 which illustrates the theoretical gain spectra for one module of the optimized structure of a preferred embodiment at three different biases.

Figure 26:
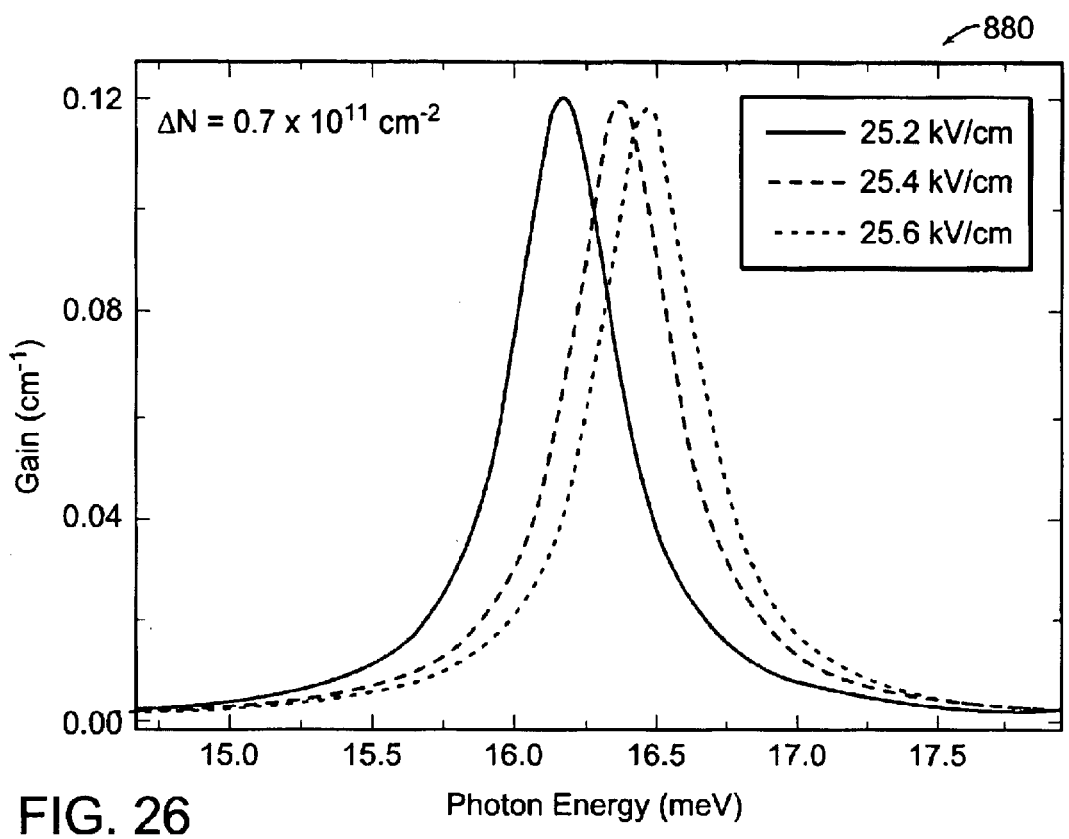
FIG. 26 graphically illustrates theoretical gain spectra for one module of the optimized structure in accordance with a preferred embodiment of the present invention.

It can be seen from FIG. 26 that the peak gain is 0.12 cm$^{-1}$ which is an enhancement by a factor of five over the previous systems. Also, the corresponding injection current is only ~5 kA/cm². Hence, in preferred embodiments of the present invention enhanced gain has been obtained for a lower injection current. The spectra displays Stark shift under applied bias which suggests that there is tunability in lasing. Optimization along the lines described herein above in preferred embodiments, employing wavefunction engineering circumvents and minimizes the effects of the highly competing nonradiative scattering mechanisms and develops a laser in the THz frequency range.

Figure 27:
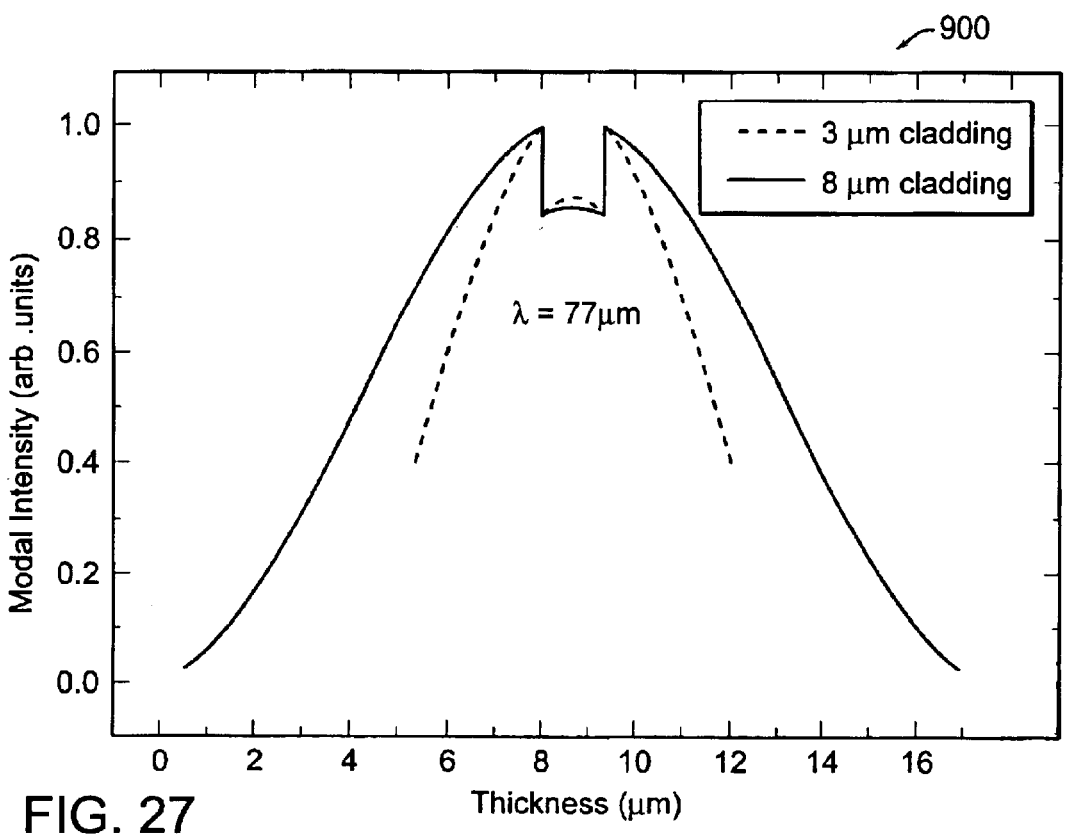
FIG. 27 graphically illustrates the optical mode confinement of THz radiation at $\lambda=77$ $\mu$m using a dielectric slab waveguide in accordance with a preferred embodiment of the present invention.

Confinement of the emitted electromagnetic field is a necessary condition for the operation of any light emitting device, especially a laser. The typical way of achieving waveguiding in near and mid IR devices is to use a dielectric slab waveguide. A typical dielectric waveguide is based on refractive index contrast and consists of a waveguide core having high refractive index sandwiched between two waveguide-cladding layers of lower refractive index. Applying a similar method to the THz emitters results in having very thick cladding layers which results in high series resistance, and is also time consuming to grow with MBE. This is explicitly shown in FIG. 27, where a dielectric slab waveguide system emits at 77 μm. It can be seen that one has to grow ~8 μm thick cladding ($Al_{0.54}Ga_{0.46}As$) on each side, which results in a total thickness of ~18 μm including the cascade structure. $Al_{0.54}Ga_{0.46}As$ layers are used as cladding on either side of the QCL structure. The 3 μm cladding system does not allow the modal intensity to die out completely and hence results in heavy losses.

In a preferred embodiment, the concept of plasmon enhanced waveguides is used for achieving confinement of the optical mode. Heavily doped cladding containing free-electron plasma is used to confine the radiation. It is known from electromagnetic theory that radiation cannot propagate in a medium with negative dielectric constant because the wavevector is imaginary. Radiation that is incident on such a medium can traverse through it only if its frequency is greater than the plasma frequency, which is given by the following:

$$\omega_p^2 = \frac{N_d e^2}{m^* \varepsilon_\infty} \quad (45)$$

where, $N_d$ is the doping density, e is the electronic charge, $m^*$ is the effective mass of electron in the medium, and $\varepsilon_\infty$ is the high frequency dielectric constant of the semiconductor. The dielectric constant of a free electron gas can be given by:

$$\varepsilon(\omega) = \left(1 - \frac{\omega_p^2}{\omega^2 - i\omega\gamma_{pl}}\right)\varepsilon_\infty \quad (46)$$

where $\epsilon(\omega)$ is the dielectric permittivity which includes the phonon contribution, $\gamma_{pl}$ is the damping constant of plasmons and is given by $\gamma_{pl} = e/2\pi\mu m^*$, and $\mu$ is the mobility in the material. The expression in Equation 46 can be broken up into its real and imaginary parts and written as the following:

$$\varepsilon(\omega) = \left[\left(1 - \frac{\omega_p^2}{\omega^2 + \gamma_{pl}^2}\right) - \left(\frac{\omega_p^2 \gamma_{pl}}{\omega(\omega^2 + \gamma_{pl}^2)}\right)\right]\varepsilon_\infty \quad (47)$$

For the situation where, $\gamma_{pl} \ll \omega$, the real part of the dielectric constant can be written as, $$\varepsilon(\omega) = \varepsilon_\infty\left(1 - \frac{\omega_p^2}{\omega^2}\right) \quad (48)$$

It can be seen from Equation 48 that for the embodiment in which the frequency of the radiation is lower than the plasma frequency, the dielectric constant is negative, and the index of refraction is imaginary. Due to this, the wavevector for the radiation is imaginary and hence the wave attenuates in the medium.

Figure 28:
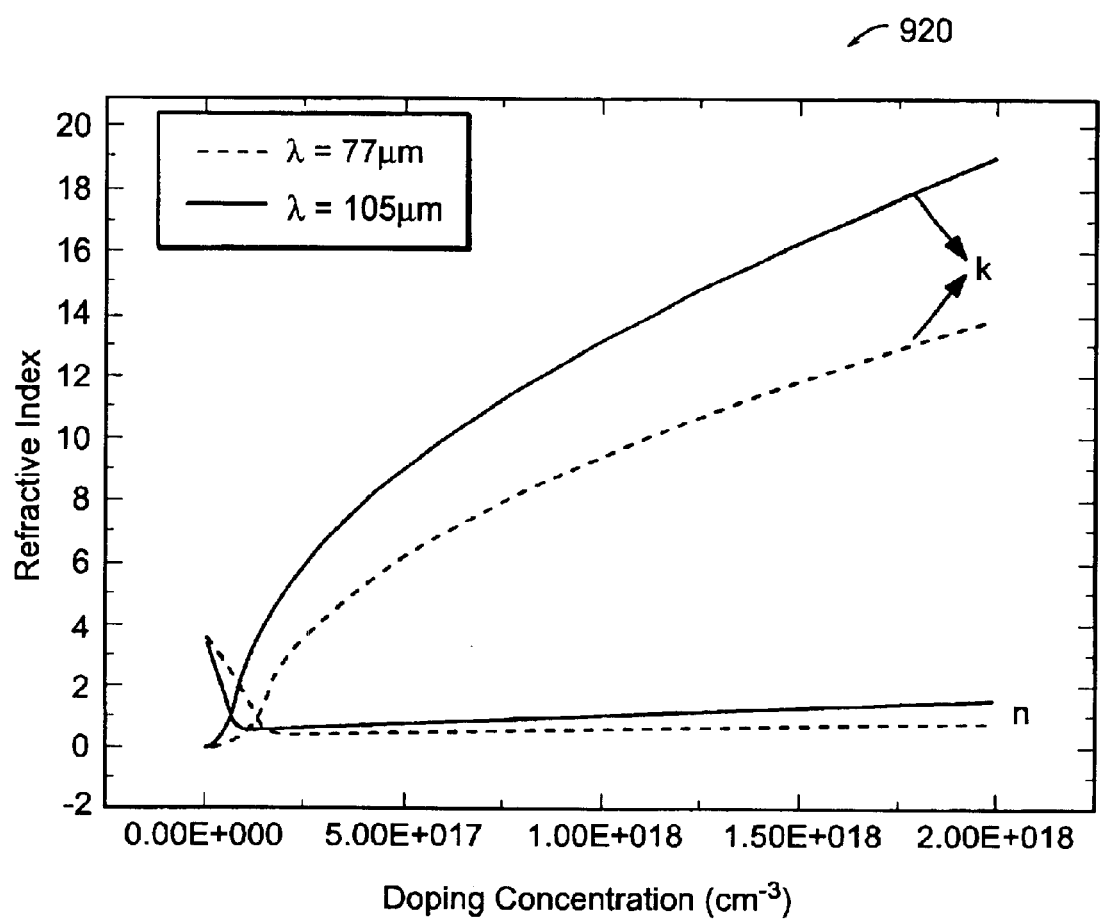
FIG. 28 graphically illustrates the calculated real and imaginary part of the refractive index as a function of doping concentration in accordance with a preferred embodiment of the present invention.

It can also be observed that as the doping concentration increases in a semiconductor material, the refractive index of the medium changes. The change in the complex refractive index in an embodiment is due to the plasma contribution. FIG. 28 below illustrates the variation in refractive index for the two particular wavelengths of interest as a function of doping concentration. The short dashed line corresponds to the 77 μm and the solid line corresponds to the 100 μm wavelength. The refractive indices of undoped GaAs and $Al_xGa_{1-x}As$ for the two different wavelengths are given previously in Table 1.

The real part of the index initially decreases and then increases gradually as a function of doping concentration. This change in the real part of the index occurs with the simultaneous increase in the imaginary index, which accounts for the attenuation in the plasma layer. Having determined the indices of the heavily doped cladding layers, the TM-polarized modes of the waveguide are determined using a standard transfer matrix method (TMM) for complex refractive indices. On solving the eigen-modes of the system, the complex propagation constant is obtained from which the waveguide losses can be estimated.

Figure 29A:
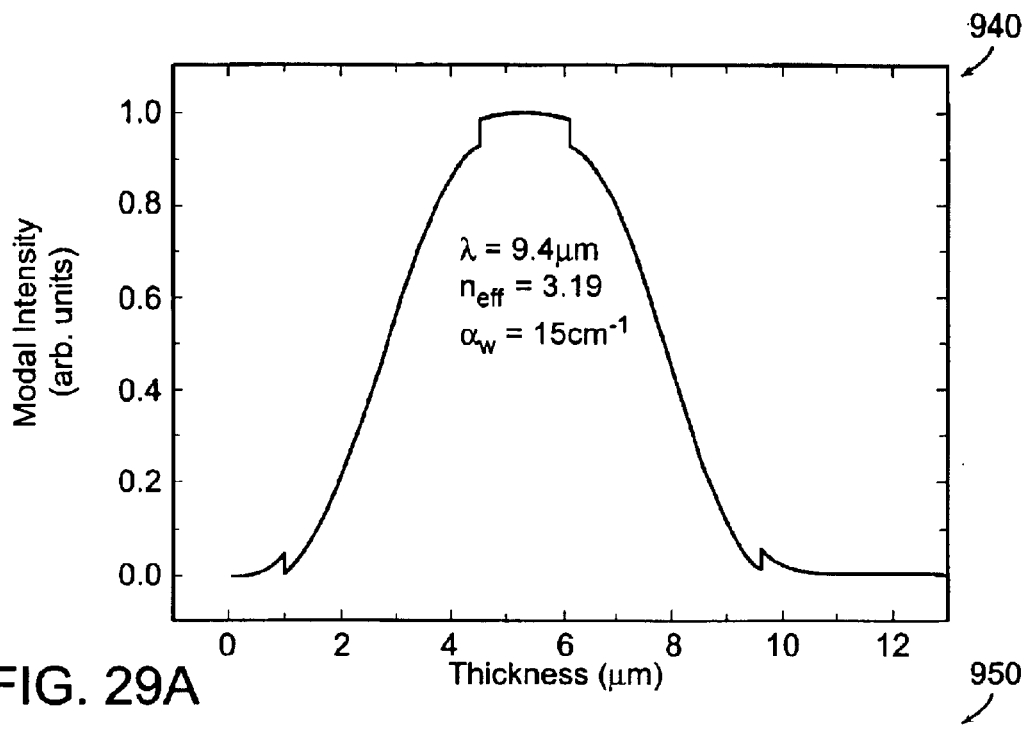
FIGS. 29A, 29B and 29C graphically illustrate the calculated modal intensity profile for the fundamental TM mode wherein the real part is shown in FIG. 29B and the imaginary part is shown in FIG. 29C in accordance with a preferred embodiment of the present invention.
Figure 29B:
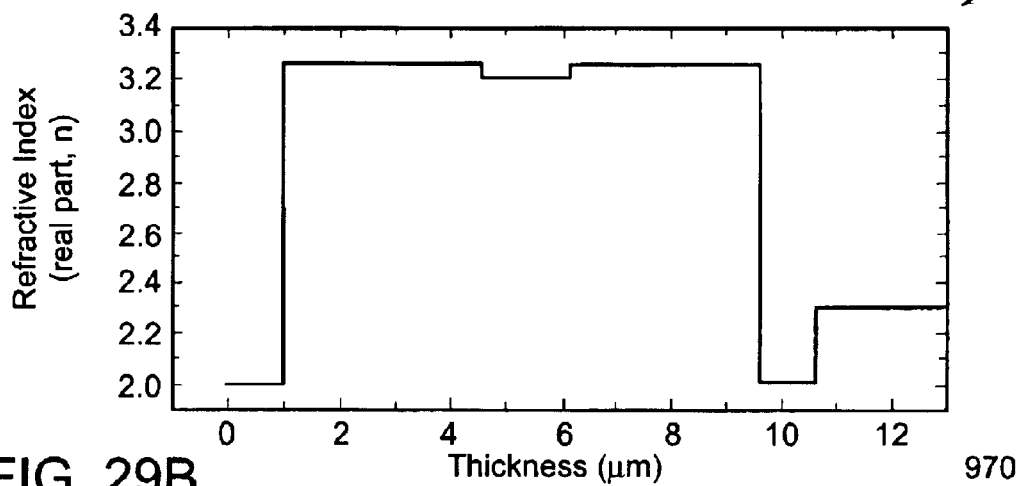
Figure 29C:
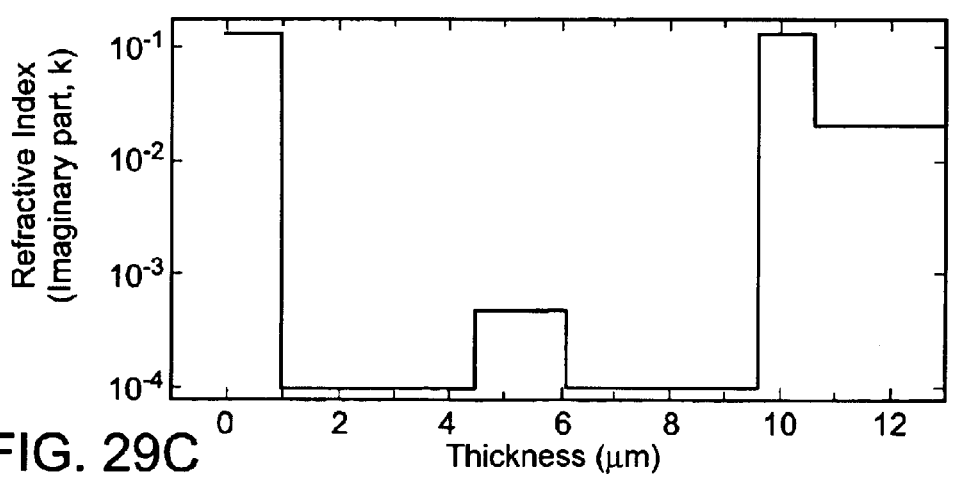
Figure 30A:
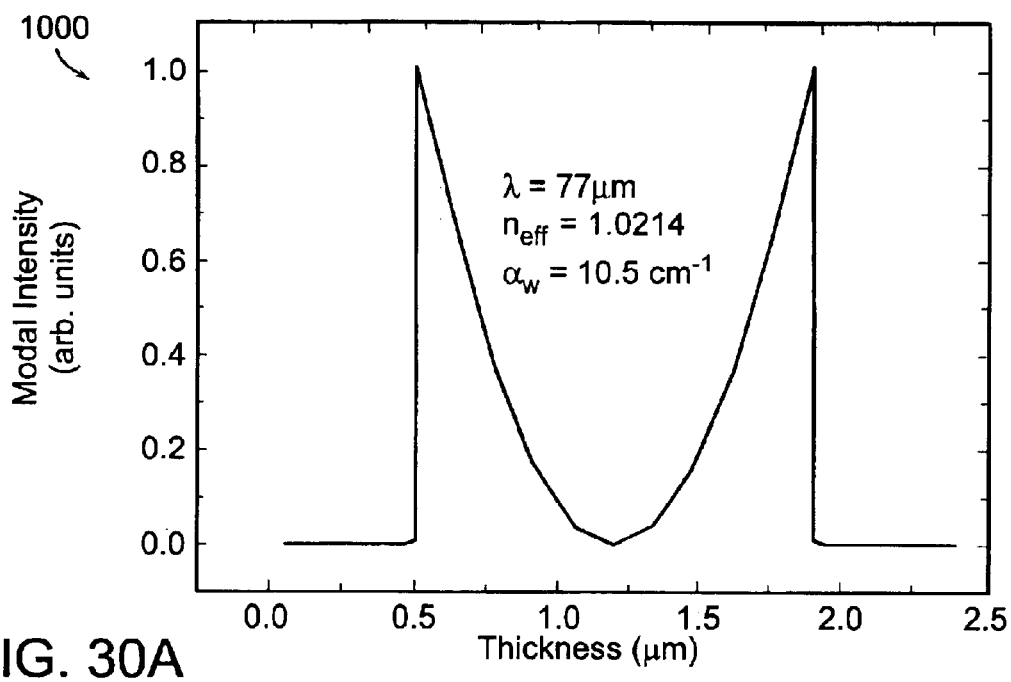
FIGS. 30A, 30B and 30C graphically illustrate the mode intensity profile for quantum cascade structure designed for emission at 77 $\mu$m in accordance with a preferred embodiment of the present invention.
Figure 30B:
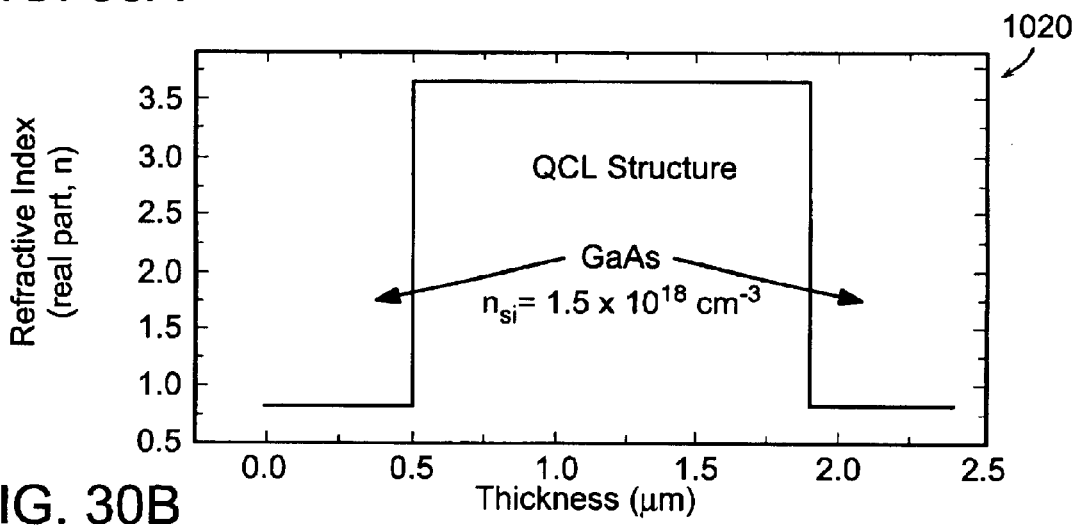
Figure 30C:
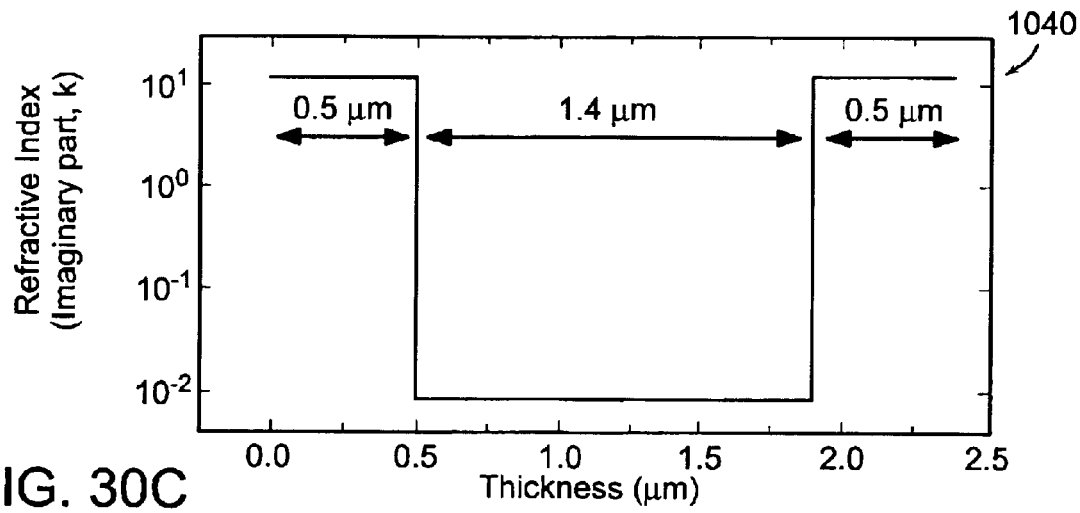
Figure 31A:
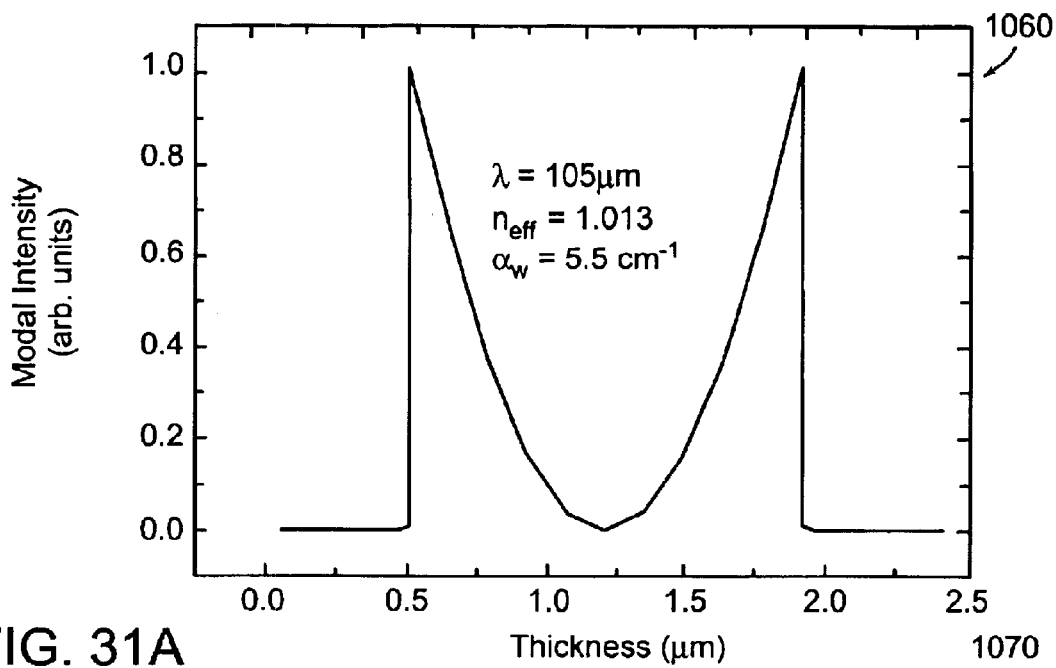
FIGS. 31A, 31B and 31C graphically illustrate the mode intensity profile for quantum cascade structure designed for emission at 105 $\mu$m in accordance with a preferred embodiment of the present invention.
Figure 31B:
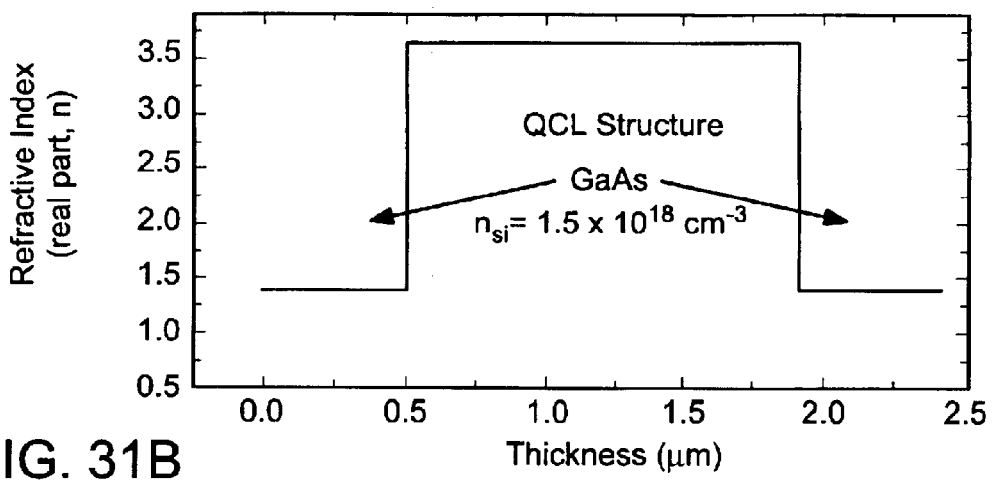
Figure 31C:
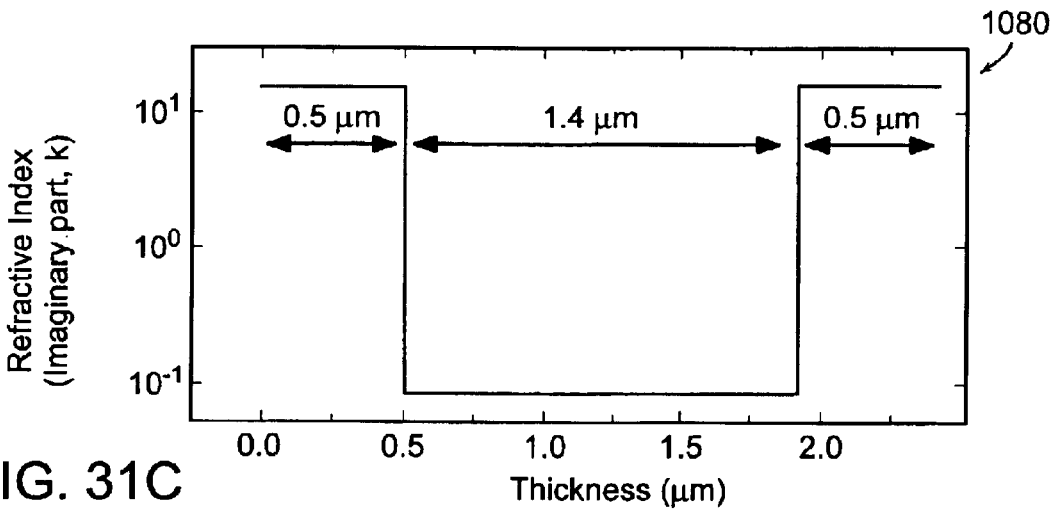

Calculations can be performed for a preferred embodiment mid IR device for which the mode profile as well as the waveguide loss may be obtained. One basic difference between the mid IR device and the THz device is that, in the former, the operating frequency is just above the plasma frequency of the doped cladding layers. This is done to utilize the anomalously low real part of the index experienced by the light with frequencies just above the plasma frequency. FIGS. 29A, 29B and 29C show the modal intensity profile for the fundamental TM mode for a mid IR quantum cascade laser designed for emission at $\lambda$=9.4 μm. The real part of the index is shown in the middle and the imaginary part is the lower plot FIG. 29C.

In a preferred embodiment, the last layer is doped heavily and hence there is a drastic reduction in the real part of the index, while the imaginary part goes up by almost three orders of magnitude. The doping concentration of ~1-2× $10^{18}$ cm$^{-3}$ corresponds to a plasma frequency of 10-17 THz, which is greater than the frequency of the THz emitters (2-4 THz). Hence the generated THz radiation cannot propagate through the free carrier plasma and is completely attenuated. This feature is used to confine the optical modes within the active region. The layer configuration consists of the cascade structure sandwiched between two heavily doped plasma reflectors.

In a preferred embodiment, a doping concentration of 1.5×$10^{18}$ cm$^{-3}$ is used for the cladding layers which corresponds to a plasma frequency which is above that of the emission frequency from a preferred embodiment device. Hence the radiation does not pass through this plasma reflector. The refractive index of the cascade structure is determined using a weighted average of the refractive index of GaAs and $Al_xGa_{1-x}As$ for far IR. Complex refractive indices can be used as input for the mode solver, and the resulting propagation constant is complex. The imaginary part of the propagation constant gives the net loss in the waveguide. The mode intensity profiles for the two structures emitting at 77 $\mu$m and 105 $\mu$m are shown in FIGS. 30A, 30B and 30C and FIGS. 31A, 31B and 31C, respectively. The real and imaginary parts of the indices for the different layers and the corresponding doping concentrations are shown in the middle and lower figures.

It can be seen from these figures that it is possible to confine the emitted THz TM mode in the active region using plasma reflectors. Further modifications on these can enhance the device performance. One issue of concern with these plasma reflectors is the attenuation of the optical mode by the plasma layers. Hence, in preferred embodiments minimum penetration into these layers is ensured.

High quality of interfaces play a pivotal role in the performance of Quantum Cascade Lasers (QCL) or for that matter any heterostructure based optoelectronic device. The interfaces are preferably sharp and free of defect states and impurity states. In the case of QCLs, their performance depends on the exact localization of carriers and precisely desired energy levels in each stage. The device performance depends on the repeatability of the several modules of the structure. Hence, for fabrication of QCLs, a high level control over layer thickness as well as material composition is recommended. Prior art techniques of growing thin films like Liquid Phase Epitaxy (LPE) cannot meet all the stringent requirements mentioned hereinbefore. Another technique that is used includes Metal Organic Chemical Vapor Deposition (MOCVD). This method is used in industry for the production of the double heterostructure semiconductor lasers. In both LPE and MOCVD, controlling the interface to a monolayer is either impossible (LPE) or extremely difficult (MOCVD). Another method of growing thin films is Molecular Beam Epitaxy (MBE), which can control interfaces to a monolayer and has proven to be successful when applied to high precision quantum well devices. In preferred embodiments, MBE is used for fabrication of the THz emitters, without limitation. The growth in accordance with a preferred embodiment was done in a RIBER 32 solid source MBE system.

As referenced hereinbefore, the MBE growth method is used to grow the multiple quantum well quantum cascade structure in preferred embodiments. The in-situ growth characterization technique of Reflection High Energy Electron Diffraction (RHEED) is also used and results of RHEED study performed during the growth of the preferred embodiment THz emitters are described herein.

Figure 32:
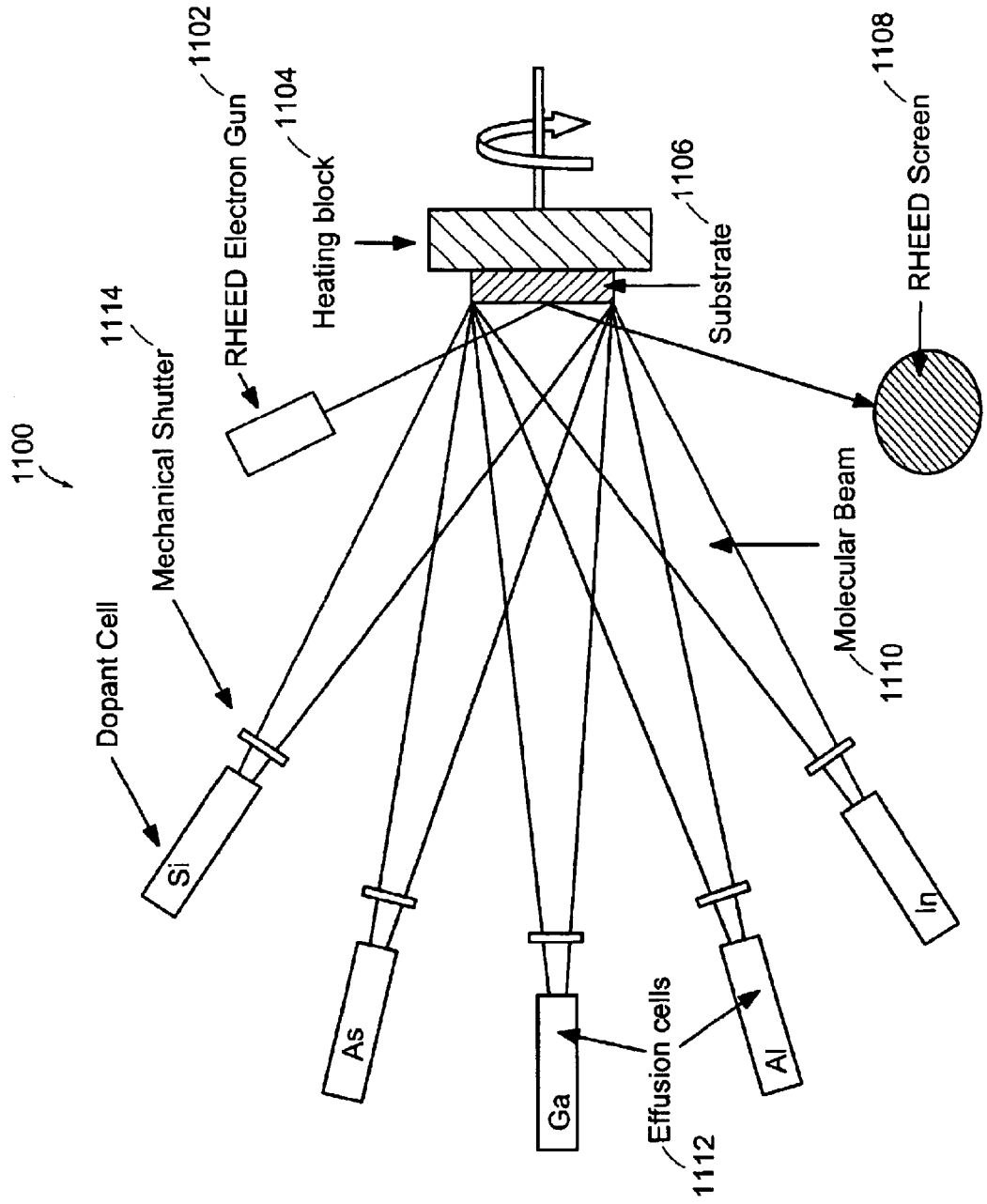
FIG. 32 graphically illustrates a schematic diagram of a MBE growth chamber in accordance with a preferred embodiment of the present invention.
Figures 33A, 33B:
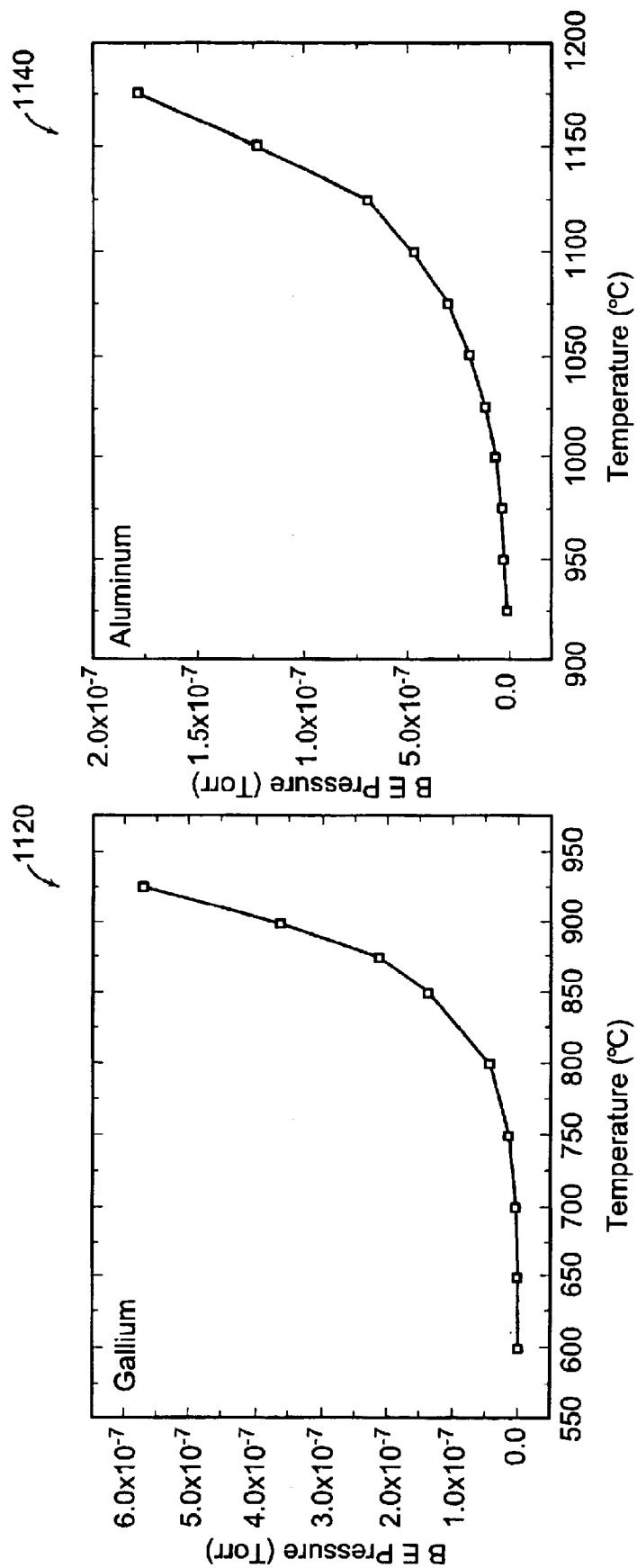
FIGS. 33A–33D graphically illustrate the variation of Beam Equivalent Pressure (BEP) for the different cells in accordance with a preferred embodiment of the present invention.
Figures 33C, 33D:
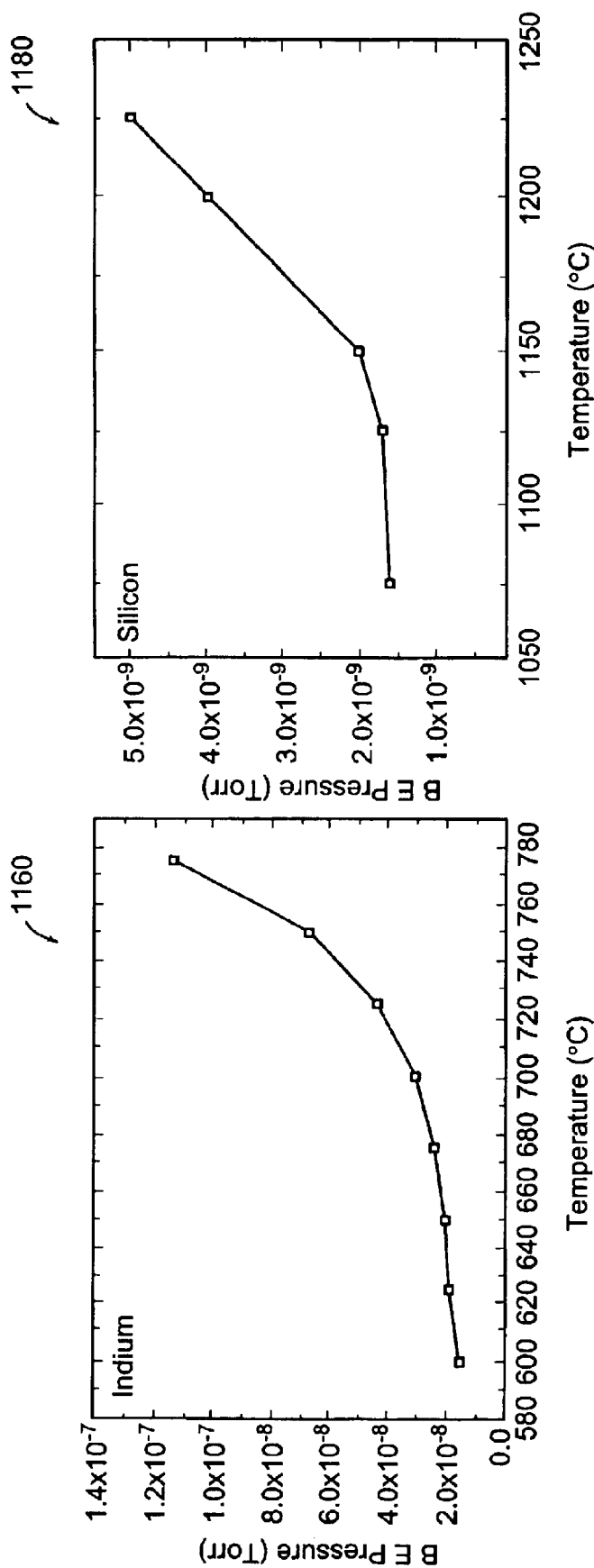

MBE is one of the most appropriate techniques for the epitaxial growth of thin films, when the requirements for layer thickness, material composition and repeatability are critical. The historical reason for the development of MBE technology was the growing interest from the semiconductor community for developing complex devices. The device performance depends critically on the electrical and morphological properties of the epitaxial layers. In MBE, the thin films grow due to the reaction between the thermally excited molecular beams of constituent elements, for example, Ga, As, Al, and In and a substrate which acts as a template for the crystal growth. The entire process of MBE occurs in ultra high vacuum ($10^{-8}$–$10^{-9}$ Torr). An advantage of MBE over other thin film growth techniques is the accuracy with which one can control the beam fluxes and growth conditions. Hence the growth conditions are highly reproducible. Due to the ultra high vacuum environment, the system is far removed from thermal equilibrium and hence the crystal growth is primarily governed by surface kinetics occurring when the incident molecular beams react with the outermost surface of the substrate. FIG. 32 shows the features of a MBE system and graphically illustrates a schematic diagram of a MBE growth chamber in accordance with a preferred embodiment of the present invention.

The parts of a MBE growth chamber consist of the effusion cells which house the constituent elements, mechanical shutters which are used to block the molecular beams when not required, and the substrate heater block which can be rotated to avoid variations across a structure. The Si cell is the n type dopant cell. The substrate is mounted on a heating block which is rotated for uniform deposition. RHEED measurements are taken in-situ using a set up similar to that shown in FIG. 32. More details on the exact physical mechanism taking place during a RHEED measurement follow herein.

The composition and doping densities of the material grown can be varied by manipulating the relative ratio of arrival rates of the elements, which in turn depends on the temperature of the effusion cells containing the elements and the evaporation rates of the particular elements. Before growth, the flux rates from each of the cells to be used are measured in units of Beam Equivalent Pressure (BEP). FIGS. 33A–33D demonstrate the variation of BEP with cell temperature for the different cells in the RIBER 32 Solid Source MBE system in accordance with a preferred embodiment of the present invention. The ratios of the BEPs are important to determine the material composition.

Two important parameters that determine the quality of MBE growth under clean ultra high vacuum environment are substrate preparation and the surface structure during layer deposition. There are three kinds of substrates that are used for MBE growth, namely semi-insulating, highly doped $n^+$substrates and p-type substrates. In the $n^+$substrates, the doping agents that are typically used are S, Se, Te or Si. The 100 or a few degrees off 100 is the usual choice of orientation preferred for MBE growth. In a preferred embodiment, the quantum cascade THz emitters, $n^+$ substrates can be used.

The $n^+$substrates can be cleaned in a solution of tri-chloro ethylene at 100° C. for 10 minutes to remove any wax present on the surface. The substrate may then be rinsed in acetone followed by methanol and blown dry with nitrogen gas. Then the substrate is etched in a mixture containing $H_2SO_4$:$H_2O_2$:$H_2O$ taken in proportion 5:1:1 for 2–3 minutes. This etchant removes 1–25 $\mu$m of GaAs from the surface by an oxidizing process, thereby removing any surface damages and leaving a clean defect free surface for growth. The substrate is then rinsed in deionized (DI) water, blown dry with nitrogen gas and mounted on the molybdenum (MO) block using indium as a sticking agent.

In-situ substrate cleaning is performed in the loading chamber, where the substrate is heated to ~300° C. for 20 minutes. This outgassing removes any water vapor or contaminants present in the substrate prior to transferring into the growth chamber. In the growth chamber, the substrate is further heated to ~600° C. in an arsenic rich environment to remove the native oxide layer. During this process, the substrate surface is monitored using RHEED. In a preferred embodiment, system at ~530° C., the RHEED screen shows the bulk GaAs spot pattern which turns into streaks as temperature is increased.

With regard to surface diagnostics, due to the UHV nature of MBE growth, it is possible to do in situ analysis of surfaces during the growth process. One of the most utilized techniques for surface analysis is the RHEED study. In RHEED, an electron beam is allowed to be incident on the surface of the crystal being grown at a very small glancing angle (~3° C.) and the reflected beam is observed on a fluorescent screen. Due to the extremely small glancing angle, the penetration depth of the electron beam is only within 1–2 monolayers. RHEED analysis gives an exact measure of growth rates for different compounds along with the compositional properties. It also provides information about the quality of initial substrate surface and changes in surface due to variations in beam fluxes.

Figure 34:
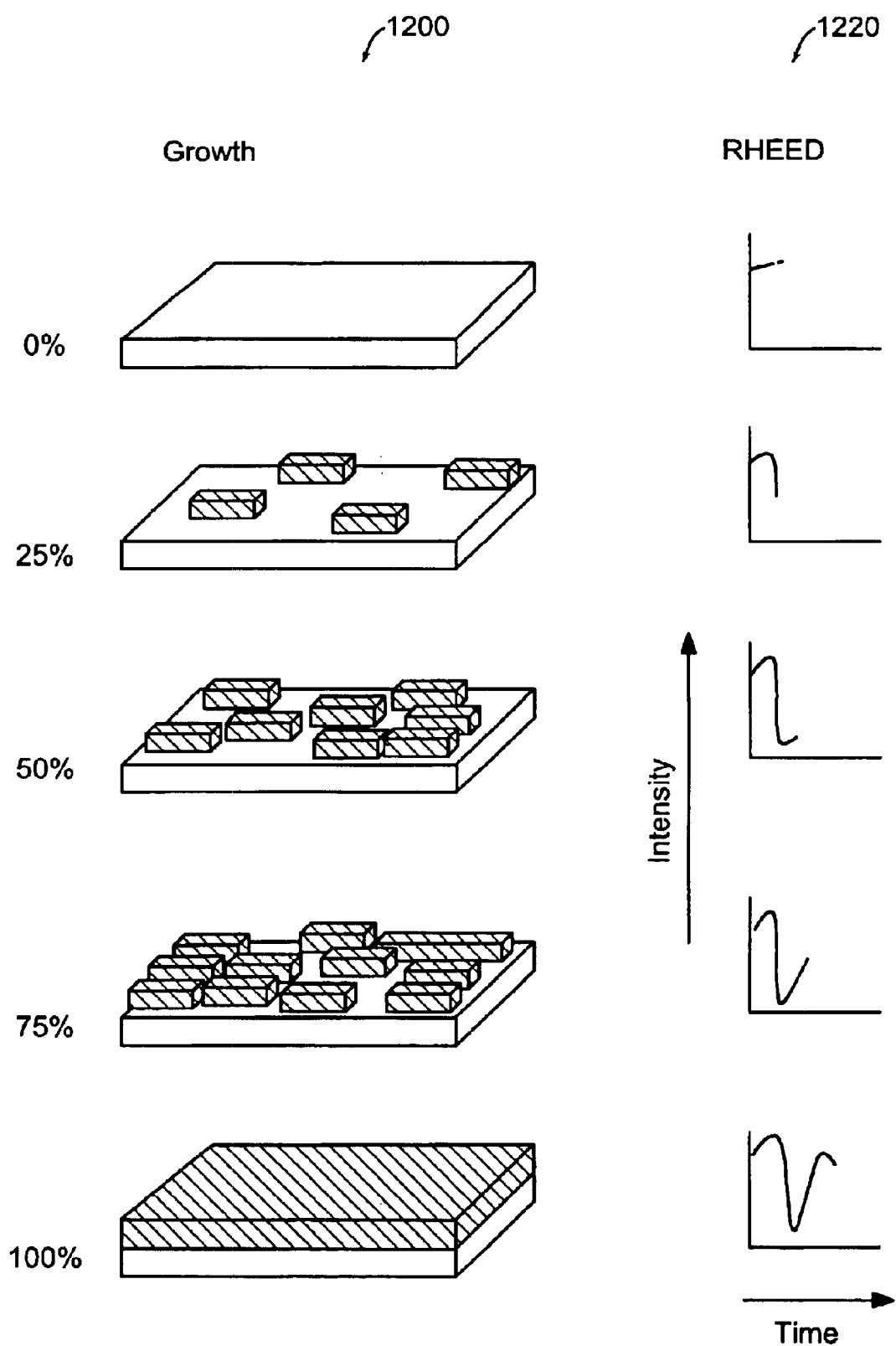
FIG. 34 graphically illustrates a schematic illustration of monolayer formation along with the corresponding reflection high energy electron diffraction (RHEED) intensity oscillation in accordance with a preferred embodiment of the present invention.

FIG. 34 schematically illustrates the formation of one monolayer. The corresponding variation in intensity of the RHEED pattern during the various stages of the monolayer growth is also shown. Here 100% corresponds to the formation of one whole monolayer. Intensity peaks occur when there is maximum reflectivity and this in turn happens when the surface is perfectly smooth. Hence, maximum reflectivity is seen during the initial and final smooth surfaces. It can be inferred further that one oscillation corresponds to the growth of one monolayer. Thus by counting the number of oscillations, the number of monolayers can be determined giving the total thickness of the layer grown during that time and thus the growth rate. By taking the ratios of the growth rates for the different compounds, for example, GaAs and AlGaAs, the molefraction of a particular element in the compound, such as, Al in AlGaAs can be determined.

Results of RHEED analysis performed on the two THz emitter devices are shown in FIGS. 35A and 35B and FIGS. 36A and 36B, respectively. The inset shows the Fourier Transform of the RHEED spectra, which gives a direct measure of the growth rate for the various compounds.

It can be seen from FIGS. 35A and 35B and FIGS. 36A and 36B that the growth rate for GaAs is ~1.58 Å/Sec. The AlGaAs growth rate for first device is 2.07 Å/Sec and that for the second device it is 1.97 Å/Sec. Taking the ratio of these growth rates, the molefraction of Ga in AlGaAs for each of these MBE growth runs is obtained. For the first device, 1.58/2.07=0.75 and for the second, 1.58/1.97=0.80. Thus, the first device has 25% Al in AlGaAs ($Al_{0.25}Ga_{0.75}As$) and for the second has 20% Al in AlGaAs ($Al_{0.2}Ga_{0.8}As$).

Figure 37A:
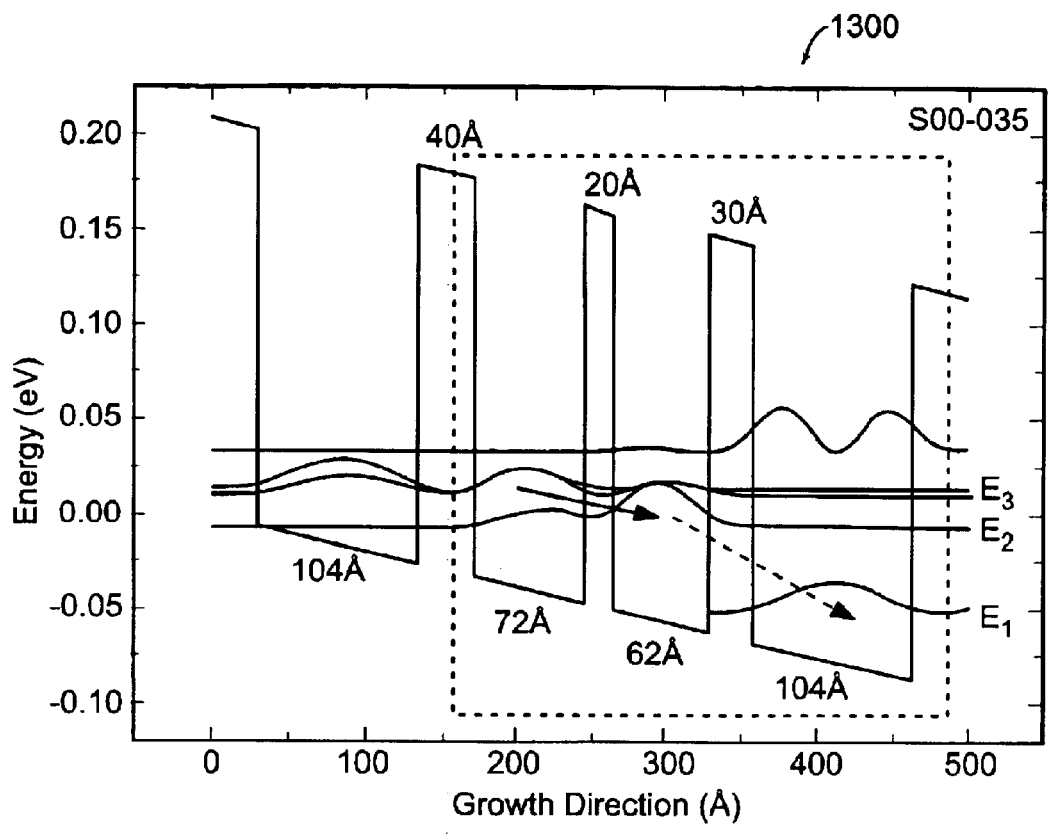
FIGS. 37A and 37B graphically illustrate the conduction band profile for sample (a) a first structure and (b) a second structure in accordance with a preferred embodiment of the present invention.
Figure 37B:
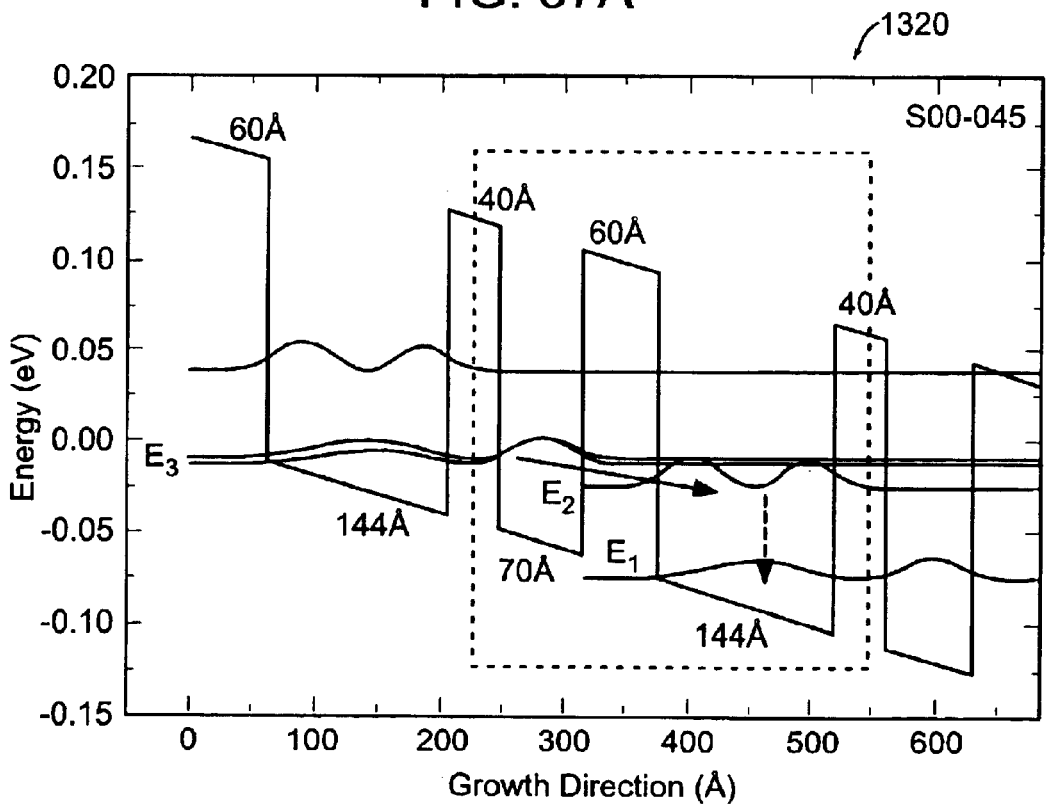

With regard to the growth details for the device, 0.6 micron of $n^{++}$(~$1.5 \times 10^{18} cm^{-3}$) GaAs can be first grown on the $n^+$GaAs substrate. Then forty periods of the quantum cascade structure can be grown using automated shutter controls at a temperature ~520° C. and growth chamber pressure of $1 \times 10^{-8}$ Torr. The conduction band profile of the two quantum cascade structures that are grown is shown along with the calculated energy levels and squared moduli of the wavefunctions in FIGS. 37A and 37B. The structure for the first device is shown in FIG. 37A and for the second device is shown in FIG. 37B. On completion of growth of the cascade structure, 0.6 micron of $n^{++}$(~$1.5 \times 10^{18} cm^{-3}$) GaAs may be further deposited on top as the upper clad layer.

Figure 38:
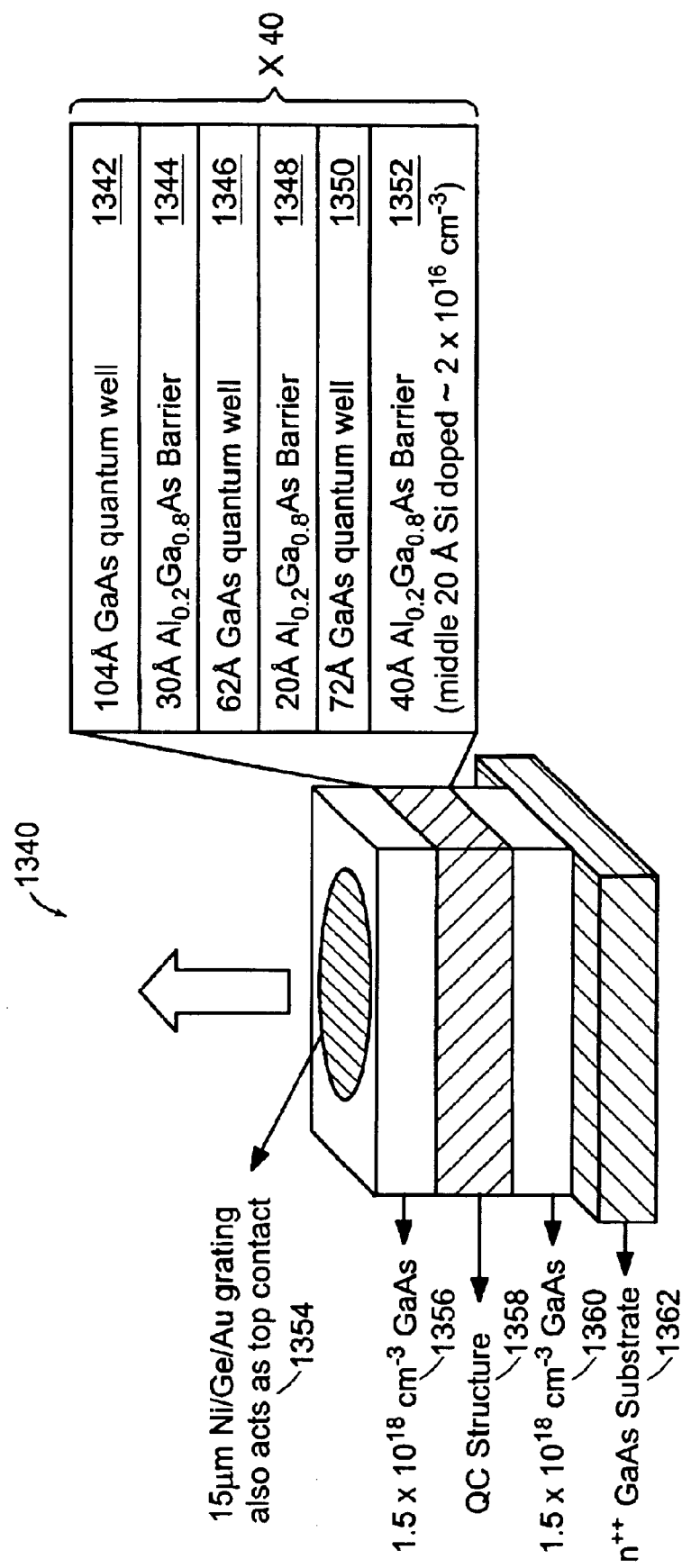
FIG. 38 schematically illustrates a device configuration in accordance with a preferred embodiment of the present invention.

Once grown, the wafers were processed into emitter samples with the indium alloyed into the back of the wafer during the growth process serving as the back ohmic contact. Ni/Ge/Au grating with outer edge connecting ring is deposited on the top surface for output coupling, and top ohmic contact as illustrated in FIG. 38 which schematically illustrates a preferred embodiment of a device configuration. The grating on the top surface performs the function of an output coupler as well as top ohmic contact.

The first stage in post fabrication involves patterning the surface using the photolithography process, which involves the following steps. First, the structure is spin coated at 2500 RPM with AZ1512 photoresist for 30 seconds. Secondly, it is softbaked at 90° C. for 30 minutes. This is followed by flood exposure using an UV lamp with the 15 $\mu$m grating mask for 7 seconds. The structure is kept in a solution of chlorobenze for 10 minutes. A developer such as, for example, AZ327 is used to develop the pattern. Typical developing time varies from 2–3 minutes. Then the device is finally rinsed in water and air dried using nitrogen gas.

The next stage is deposition of Ni, Ge and Au using electron beam (E-Beam) evaporation. The structures are mounted in the E-Beam system and 300 Å of Ni followed by 400 Å of Ge and 2000 Å of Au are deposited in that order. The structures are taken out, and the photoresist is lifted off using acetone kept in an ultrasound bath.

Finally, the metallic grating that was deposited using E-Beam evaporation is made into ohmic contacts using Rapid Thermal Annealing. Annealing is done at 500° C. for 30 seconds in a nitrogen rich environment. During the process two pieces of sacrificial GaAs may be used to clad the device in order to prevent a desorption.

The structures can be cleaved to smaller dimensions (1 mm×1 mm) and mounted on gold headers using In solder. Wire bonds may be attached to a preferred embodiment device from the posts on the header for electrical contact.

Interband Photoluminescence, Intersubband Absorption, and Intersubband Emission can be used to characterize the MBE structures grown. Besides these optical characterizations, Hall measurement can be applied for studying the mobility of the MBE grown devices.

Figure 39:
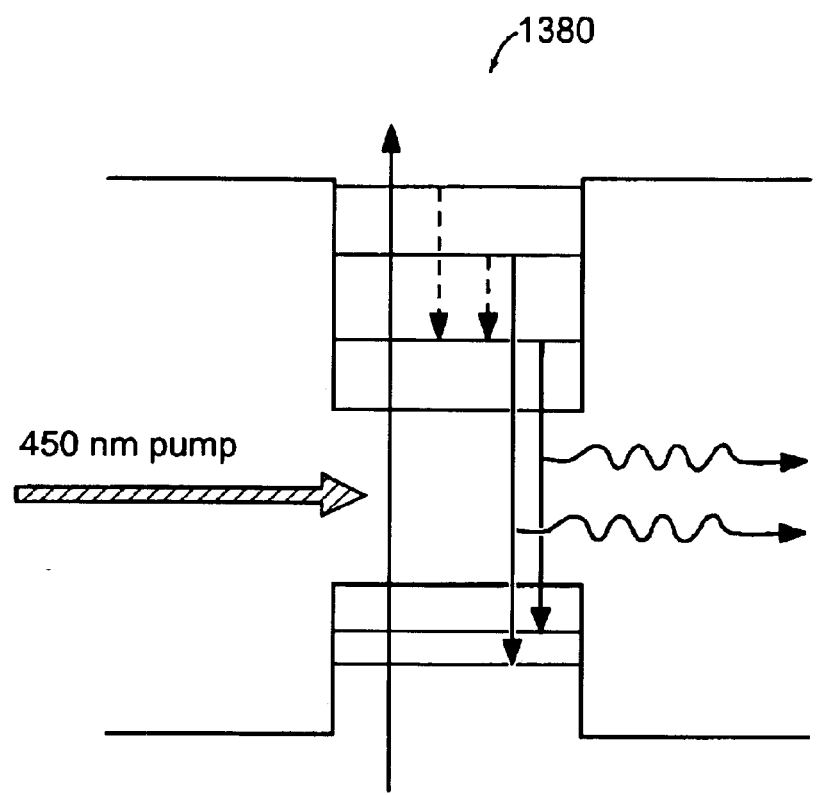
FIG. 39 schematically illustrates the physical mechanism involved in photoluminescence in accordance with a preferred embodiment of the present invention.

The basic mechanism involved in photoluminescence is shown in FIG. 39. The quantum well is exited with a radiation having energy greater than the bandgap of the well material. In a preferred embodiment, this radiation source can be an Argon-Ion laser operated at 450 nm. Since the incident radiation has energy greater than the bandgap, the electrons sitting in the valence band are kicked up to the conduction band. The electrons that are kicked up finally relax down to the ground state of the quantum well and eventually undergo an electron hole recombination, which is seen as the luminescence. The luminescence energy corresponds to the sum of the band gap energy of the quantum well material, electron energy level and hole energy level. These results can be easily verified with theoretical calculations.

Figure 40:
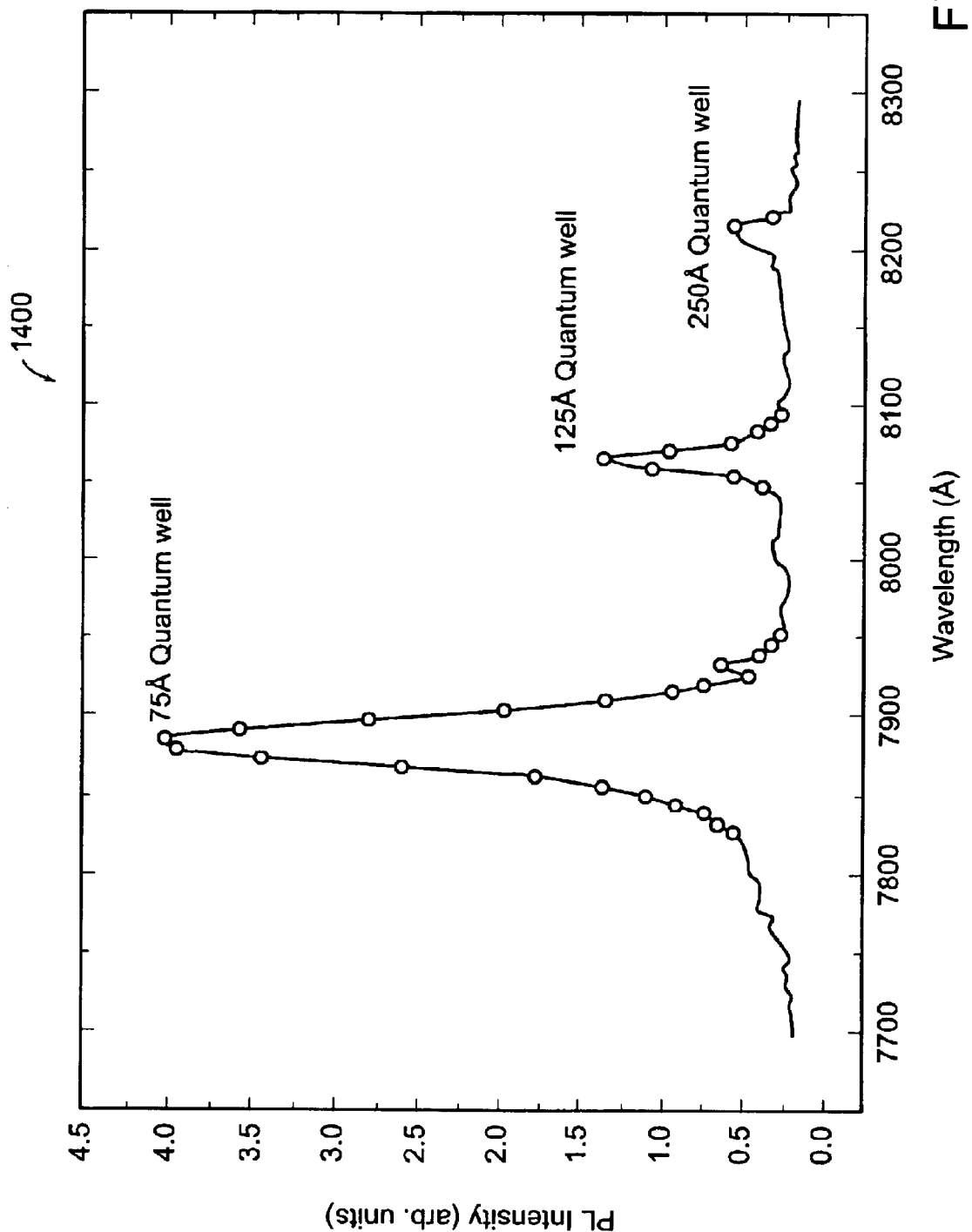
FIG. 40 illustrates photoluminescence spectra for a MBE grown sample having quantum wells of three different thicknesses at T=77 K in accordance with a preferred embodiment of the present invention.

Photoluminescence (PL) may be performed on single quantum well devices grown on semi-insulating substrates. This can be done to verify the growth process and ensure that the layers of desired thickness and good interfaces are being formed. FIG. 40 shows the PL spectra for a device having quantum wells of three different widths.

Figure 41A:
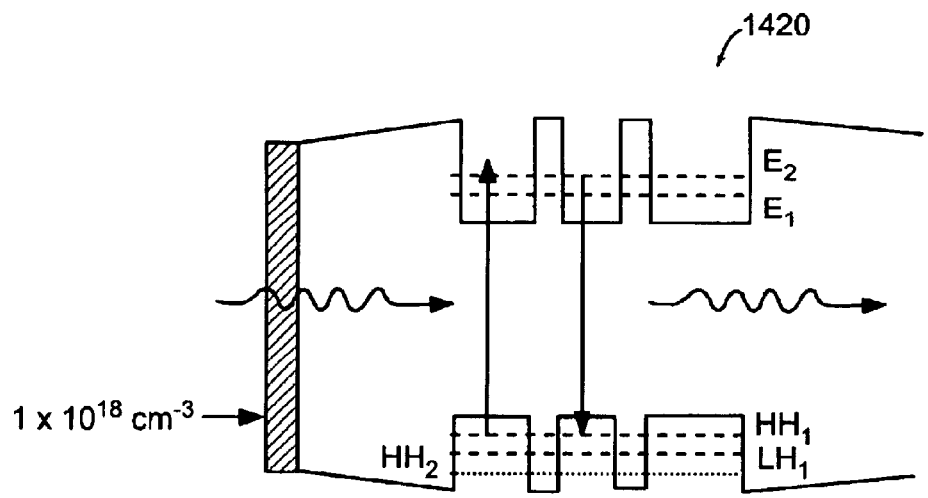
FIGS. 41A and 41B illustrate (a) schematic band profile of the structure used for interband photoluminescence experiment and (b) the photoluminescence spectra in accordance with a preferred embodiment of the present invention.
Figure 41B:
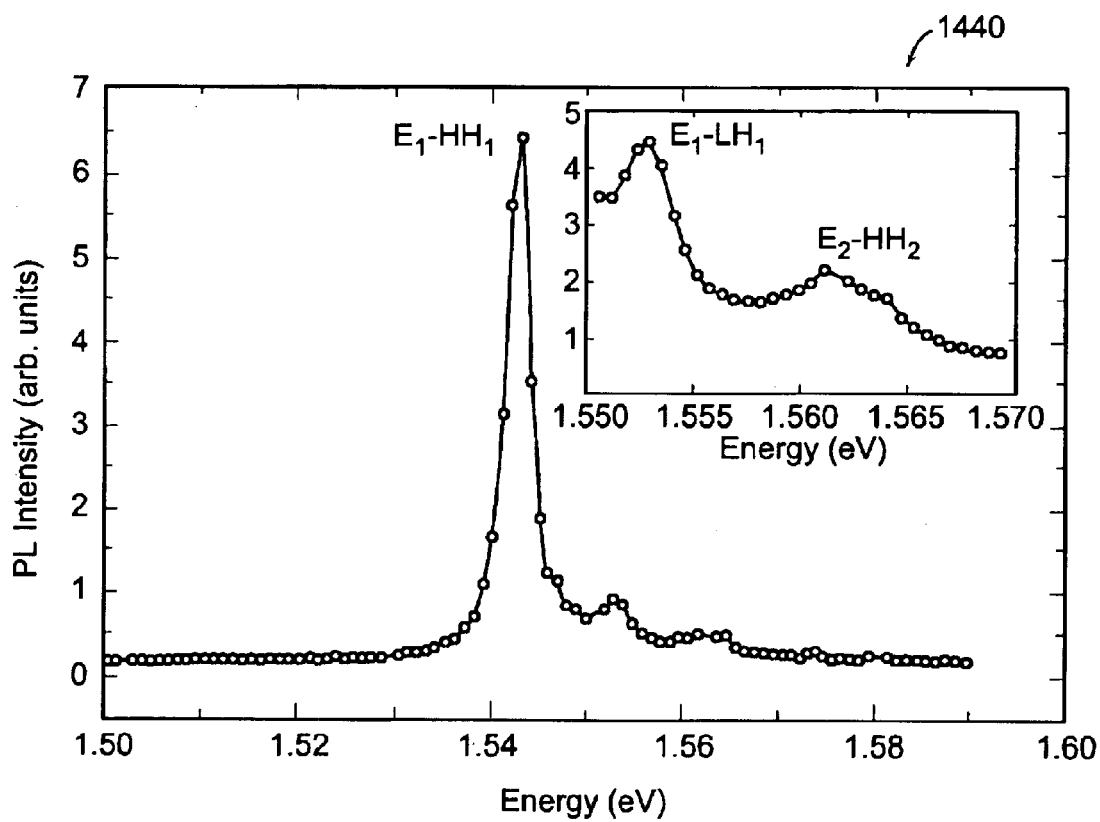

Interband PL can be performed on multiple quantum well (MQW) devices having well widths similar to the THz emitter. In a preferred embodiment, these devices had 20 similar MQW structures separated by thick (550 Å) barriers. These barriers can be modulation doped in the center to provide charge carriers to the quantum wells. A typical PL spectrum obtained for one of the first device is shown in FIGS. 41A and 41B. FIG. 41A illustrates the schematic band profile of the structure used for interband PL. The layer sequence of one period of the structure, in Å from left to right starting from the $n^{++}$doped layer is 50/250/72/20/62/30/134/250. The GaAs quantum wells are 72, 62, 134 and the $n^{++}$doped layer is 50. The system consists of $Al_{0.25}Ga_{0.75}As$ barriers.

In FIG. 41B, the PL spectra obtained at a temperature of 77 K from the same structure is shown. The main peak corresponds to the $E_1$-$HH_1$ (1.5427 eV) transition. The inset shows a section of the spectra that has been magnified, where peaks corresponding to $E_1$-$LH_1$ (1.5530 eV) and $E_2$-$HH_2$ (1.5610 eV) transitions can be seen.

The transition energies obtained experimentally can be compared to theoretically obtained values calculated using the Schroedinger-Poisson self-consistent computational method. Due to the to the large number of carriers present in the system, the bands undergo bending and hence to account for this, both the Schroedinger equation and the Poisson equation can be solved self-consistently to get a realistic band profile. Transfer Matrix Methods can be used to solve both the Schroedinger equation as well as the Poisson equation iteratively. In a preferred embodiment, iterations were stopped when the variations in energy levels between two successive iterations were within the experimental resolution (~2 meV). The Schroedinger-Poisson solver can be tested for other systems like pseudomorphic High Electron Mobility Transistors where a high level of agreement can be seen between theory and experiment. The experimental results obtained for the structure are compared to the theoretically obtained results in Table 8.

TABLE 8

Comparison of transition energies obtained experimentally and theoretically for the structure depicted in FIGS. 41A and 41B

|  | $E_1$-$hh_1$ (eV) | $E_1$-$lh_1$ (eV) | $E_2$-$hh_2$ (eV) |
| --- | --- | --- | --- |
| Theory | 1.5422 | 1.5533 | 1.560 |
| Exp. | 1.5427 | 1.5530 | 1.561 |

It can be seen from Table 8 that there is very good agreement between experimentally obtained transition energies and theoretically obtained ones. It can be concluded that the MBE growth has been optimized to give the desired layer thickness, material compositions and doping concentrations in preferred embodiments of the present invention.

As illustrated hereinbefore, the intersubband dipole matrix element is polarized along the growth direction. This selection rule for intersubband transitions requires the electric field of the incident radiation to have a finite component perpendicular to the quantum well layers. In usual transmission studies, where the light is incident normal to the plane of the sample surface, the electric field components lie only along the plane of the quantum well. Hence to induce intersubband absorption, one has to use nonstandard techniques can be used.

Figure 42:
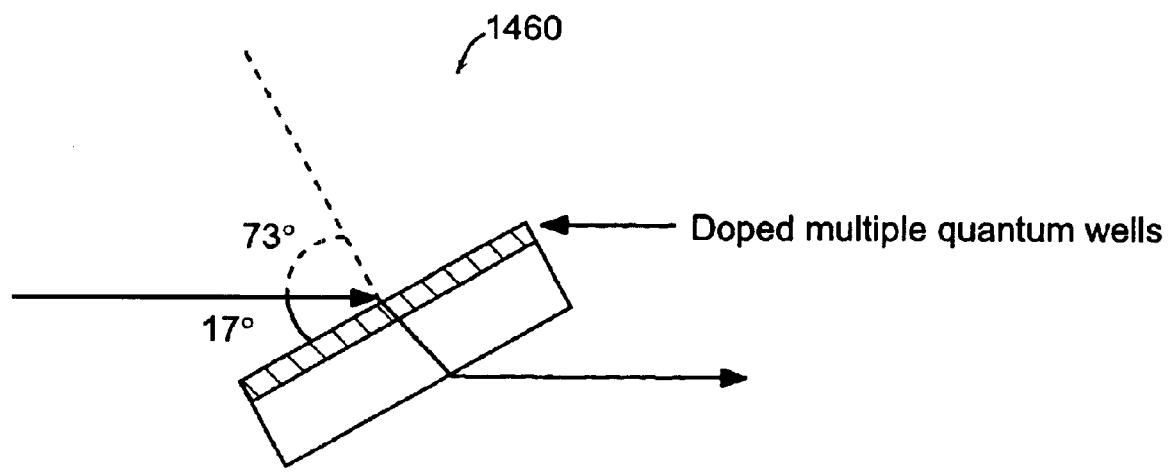
FIG. 42 illustrates Brewster angle geometry used for intersubband absorption study in accordance with a preferred embodiment of the present invention.

In a preferred embodiment, a method to have finite electric field component perpendicular to the quantum well layers includes orienting the surface of the structure at an oblique angle to the incident beam. The preferred choice of angle for such a method is the Brewster angle where the effects of reflection are annulled. For GaAs, with a refractive index of 3.3, the Brewster angle is 73°. Hence the glancing angle of the light has to be $\theta_g=17°$ with respect to the surface of the structure, there by inducing a very small component of the electric field along the growth direction (perpendicular to the quantum well layers). Even though the coupling strength is weak due to the small angle of incidence (correspondingly small $E_z$ component), for samples with high doping concentrations the Brewster angle scheme suffices. The coupling factor in this case is given by $\sin^2\theta_g/\cos^2\theta_g \approx 0.09$ for GaAs. Other methods for coupling light for studying intersubband absorption include, but are not limited to, grating coupling and multipass waveguide geometry using wedged edges. The latter has the advantage of increasing the coupling coefficient several fold. The Brewster angle scheme has been employed to do the absorption measurements in preferred embodiments. FIG. 42 illustrates the Brewster angle incidence geometry for studying intersubband absorption in accordance to a preferred embodiment. For GaAs, the Brewster angle=73°, which results in 90°−73°=17° glancing angle.

Figure 43A:
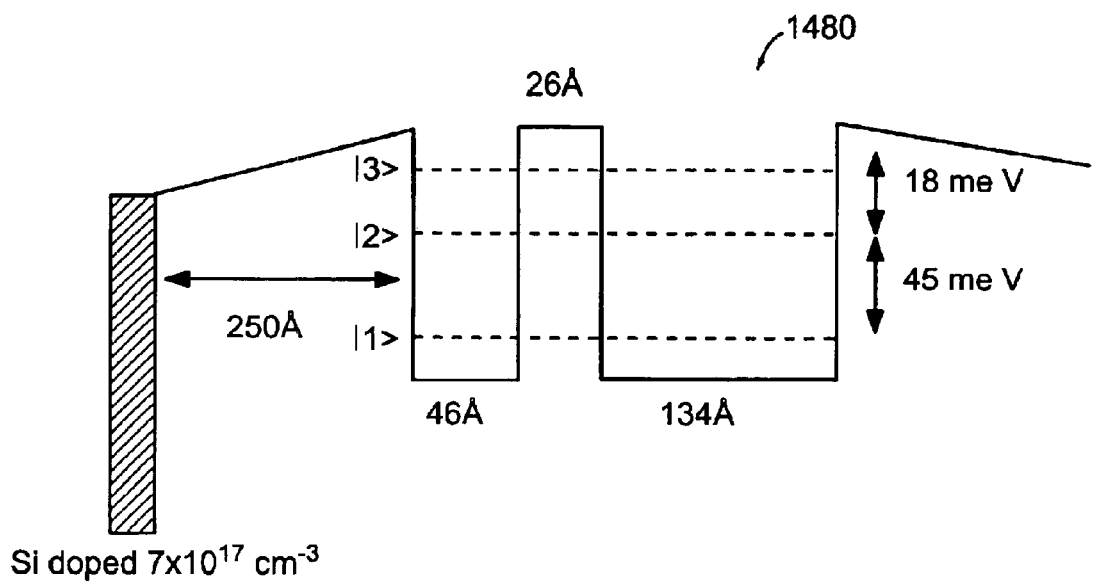
FIGS. 43A and 43B illustrate (a) the conduction band profile of a structure and (b) relative transmission spectra obtained using oblique angle of incidence geometry in accordance with a preferred embodiment of the present invention.
Figure 43B:
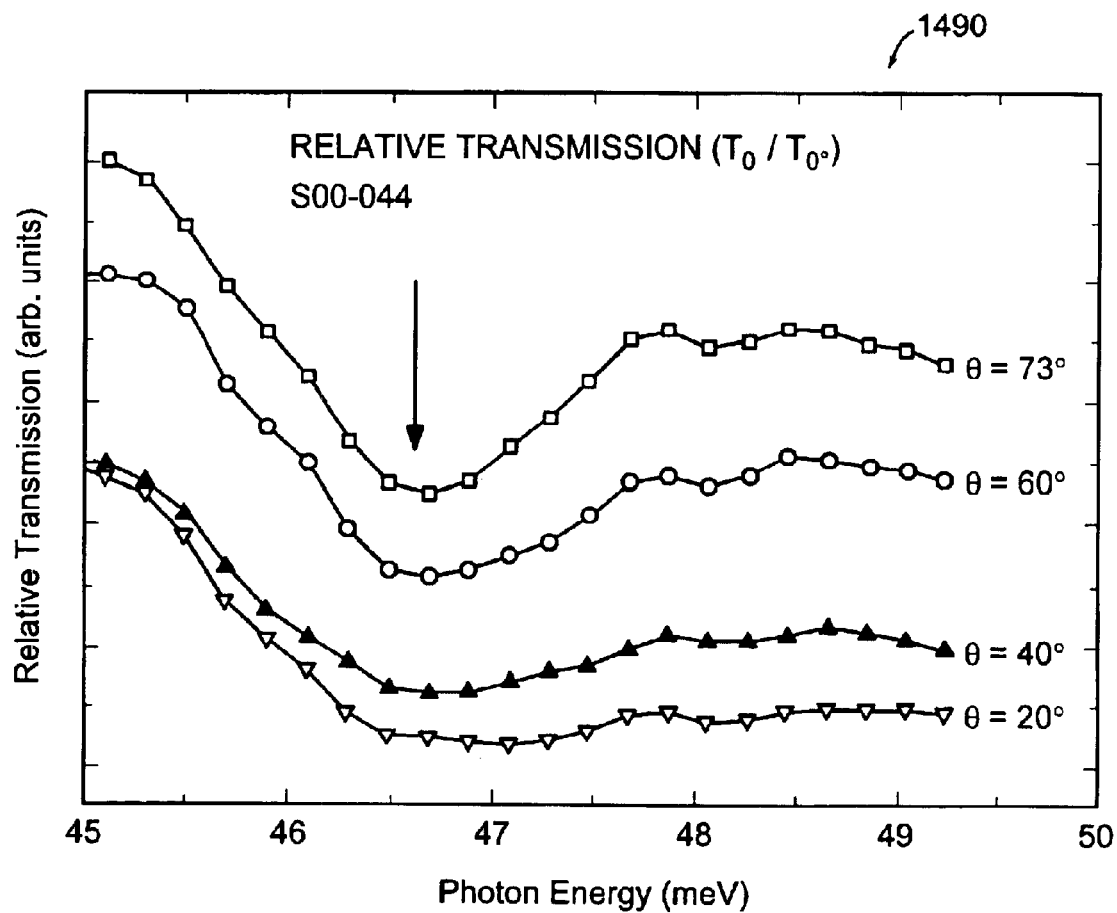

A Bruker IFS 66 V Fourier Transform Infrared Spectrometer (FTIR) can be used for studying intersubband absorption. The device is mounted in the chamber of the FTIR spectrometer, and the whole path of light is evacuated, thereby reducing any losses due to water vapor absorption in accordance with a preferred embodiment. Transmission measurements may be performed at various angles of incidence ($\theta_i$=0° to 73°). Taking the relative transmission between that at a finite angle of incidence to that at normal incidence the instrumental, substrate, phonon and free carrier absorption effects are removed. Measurements can be performed at room temperature. FIGS. 43A and 43B show the relative transmission spectra obtained at different angles of incidence. It can be seen from the plots that as the angle of incidence comes closer to the Brewster angle, the coupling of the radiation to the intersubband transition is higher, and hence a greater dip in the transmission spectra is seen. This data was taken for another device whose conduction band profile along with intersubband energy level spacing is also shown in FIGS. 43A and 43B. The structure consisted of GaAs quantum wells and $Al_{0.25}Ga_{0.75}As$ barriers. 20 periods of the asymmetric double quantum well structure are present in the device. Each period is separated by 550 Å spacers which are doped $7 \times 10^{17} cm^{-3}$ in the middle 50 Å.

Figure 44:
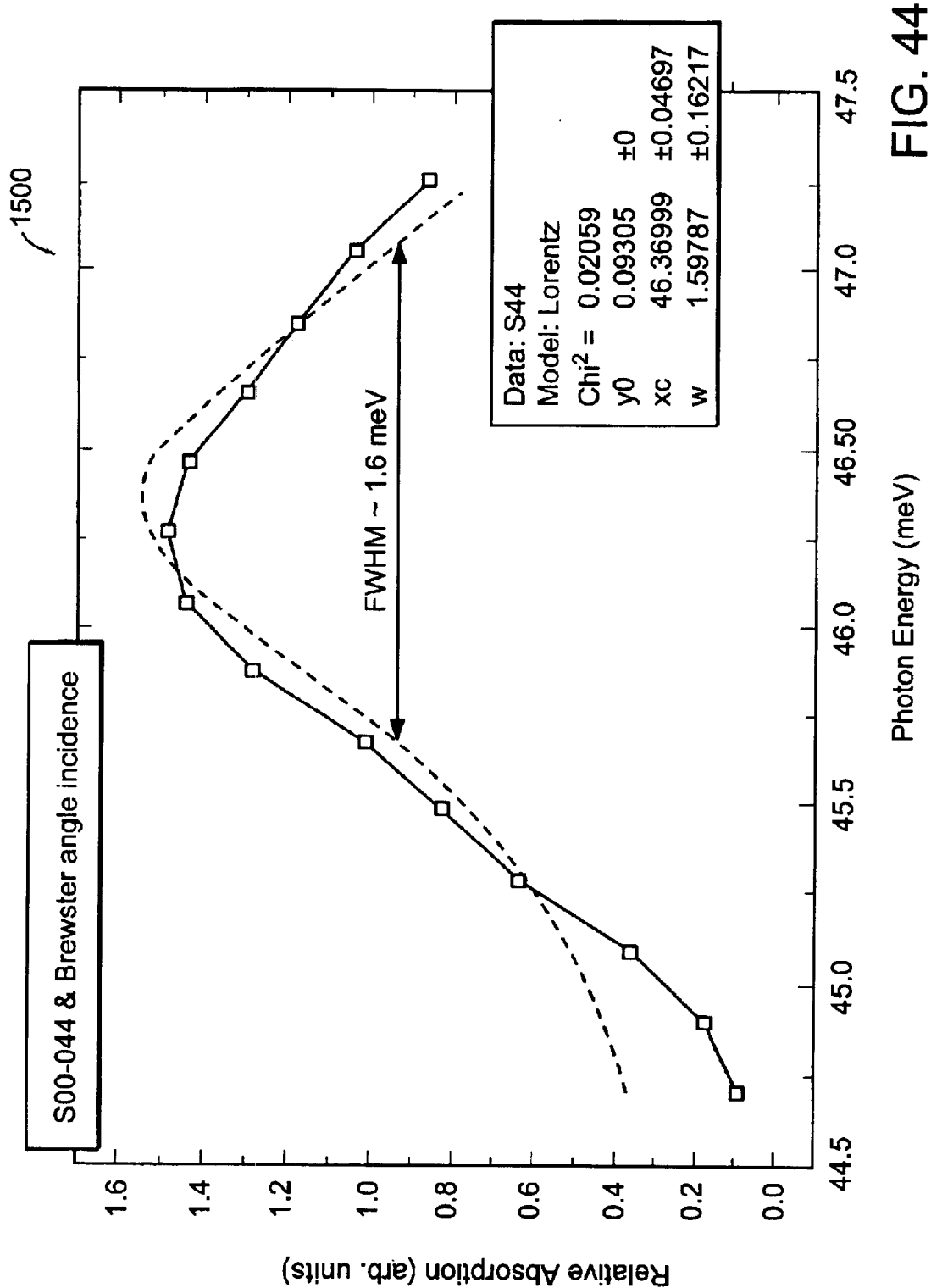
FIG. 44 graphically illustrates the relative absorption spectrum for a structure taken at room temperature using the Brewster angle geometry in accordance with a preferred embodiment of the present invention.

In FIG. 43B it was seen that the transmission dip occurs at ~46 meV which corresponds to. $|2>-|1>$ transition, which in this embodiment is an electronic transition mediated through phonon absorption. For intersubband energy level spacing greater than the LO phonon energy, the dominant mechanism for electron transfer is via LO phonon absorption or emission. The relative transmission spectra is obtained using oblique angle of incidence geometry at a temperature T=300 K. From the relative transmission spectra the relative absorption for the particular device is obtained. The relative absorption spectrum for the measurement taken at the Brewster angle is shown in FIG. 44. The dashed line corresponds to a Lorentzian fit to the data. The Full Width at Half Maximum (FWHM) and the peak position are indicated in the inset.

A Lorentzian line shape is assumed for the intersubband absorption spectrum of the form, $$g(\bar{h}\omega) = \frac{\Gamma/\pi}{(E_{21} - \bar{h}\omega)^2 + \Gamma^2} \qquad (49)$$

where $2\Gamma$ is the full width at half maximum and is constituted of two different contributions as in atomic physics, $$\Gamma = \bar{h}\left(\frac{1}{2T_1} + \frac{1}{T_2}\right) \qquad (50)$$

Figure 45:
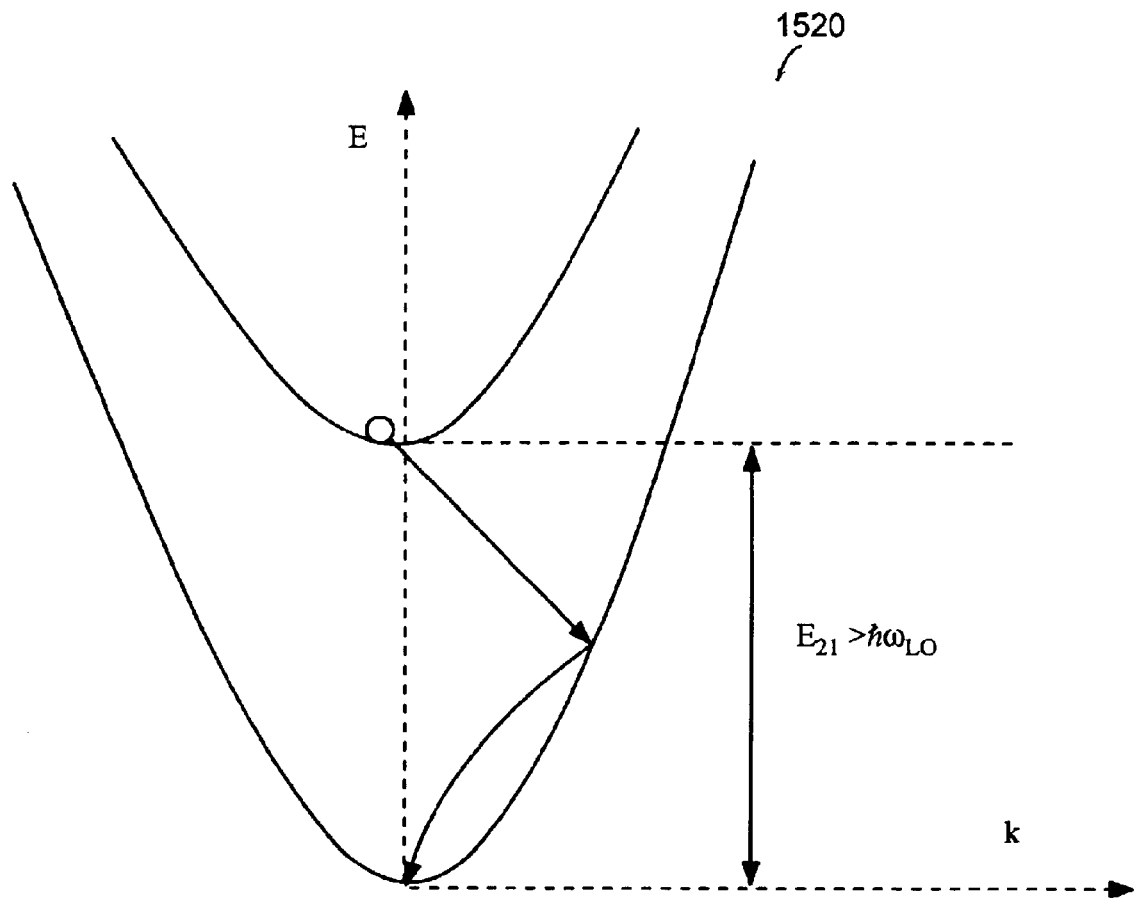
FIG. 45 illustrates the intersubband relaxation mechanism in a quantum well with subband energy level spacing greater than the LO phonon energy in accordance with a preferred embodiment of the present invention.

Here, $T_1$ is related to inelastic collisions and $T_2$ to elastic collisions. In semiconductor quantum wells, due to the energy dispersion along the in-plane direction (x-y), even elastic collisions can result in intersubband transitions to another subband. The two types of inelastic scattering mechanisms possible in quantum well systems are mediated via acoustic phonons and LO phonons with typical lifetimes on the order ~100 ps and 1 ps, respectively. To emit a LO phonon, the energy subband spacing has to be greater than the LO phonon energy in the system. FIG. 45 shows the mechanism of LO phonon emission in a quantum well system with subband energy spacing greater than the LO phonon energy in accordance with a preferred embodiment of the present invention. In such systems at sufficiently high temperatures, the line width of intersubband absorption or emission is primarily LO phonon limited.

The main elastic scattering processes are ionized impurity scattering and interface scattering. The impurity scattering limited lifetime can be as short as 1 ps, but in modulation doped structures with large setback of dopants, the lifetime is increased to ~10 ps. Interface roughness scattering becomes a factor only when the length of the system is <100 Å, because the rate goes as $L^{-6}$. Hence for the kind of structures in a preferred embodiment the dominant scattering process is LO phonon mediated.

The LO phonon limited lifetimes of the subbands can be estimated. The calculations and analysis indicate that at energy level spacing ~46–47 meV, the interface phonon is the dominant LO phonon mode that takes part in the absorption or emission. For the structure in accordance with a preferred embodiment, the LO phonon mediated lifetime is theoretically estimated to be ~0.75 ps which gives a total broadening of the intersubband absorption line $2\Gamma_{21}$~1.75 meV. The Lorentzian fit to the experimental intersubband absorption spectrum taken at a temperature T=300 K gives a full width at half maximum (FWHM) corresponding to 1.6 meV which corresponds to a lifetime of 0.83 ps. At high enough temperatures (T>40 K) the intersubband absorption spectra is lifetime broadened and hence the Lorentzian line fit is a direct measure of the interface phonon limited lifetime of level |2>. It is noted that even though the manybody effects on the energy or the collective effects such as, for example, depolarization shift, have not been considered, a good estimate of the lifetimes is obtained.

Figure 46A:
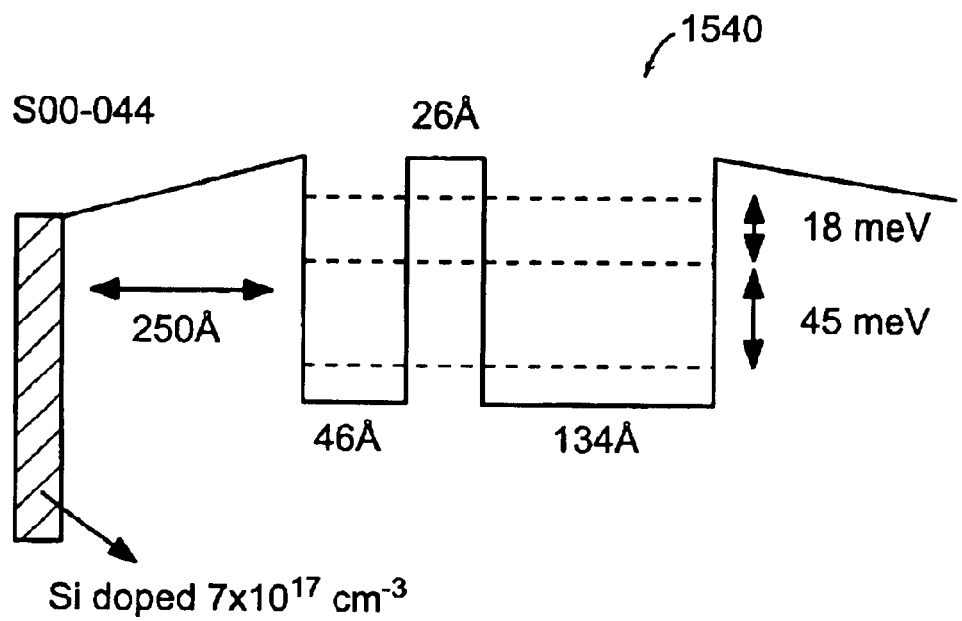
FIGS. 46A, 46B and 46C illustrate schematic conduction band profiles along with the computed energy level spacing for the samples that showed interface phonon absorption and normal incidence transmission spectra for structures in accordance with a preferred embodiment of the present invention.
Figure 46B:
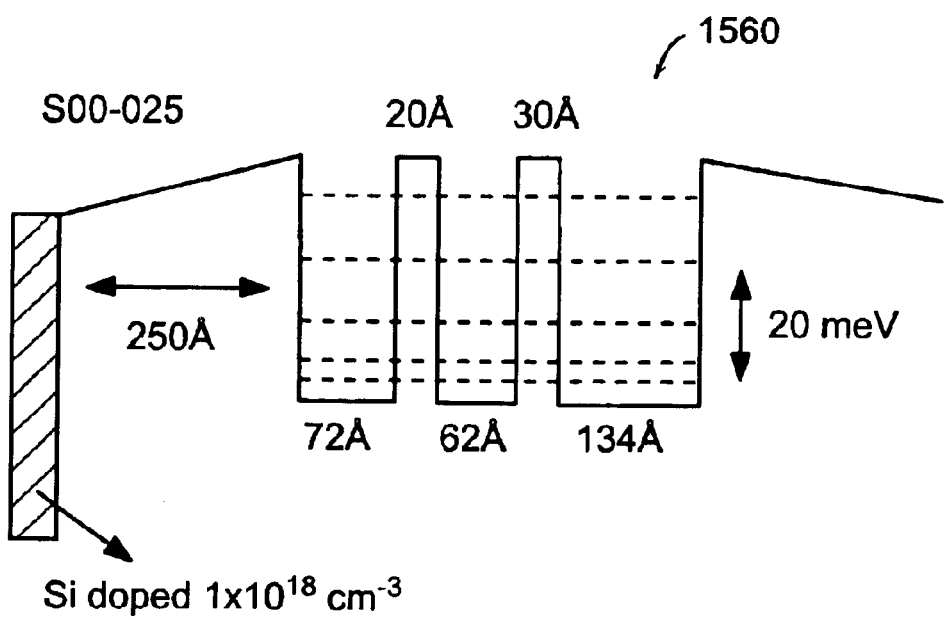
Figure 46C:
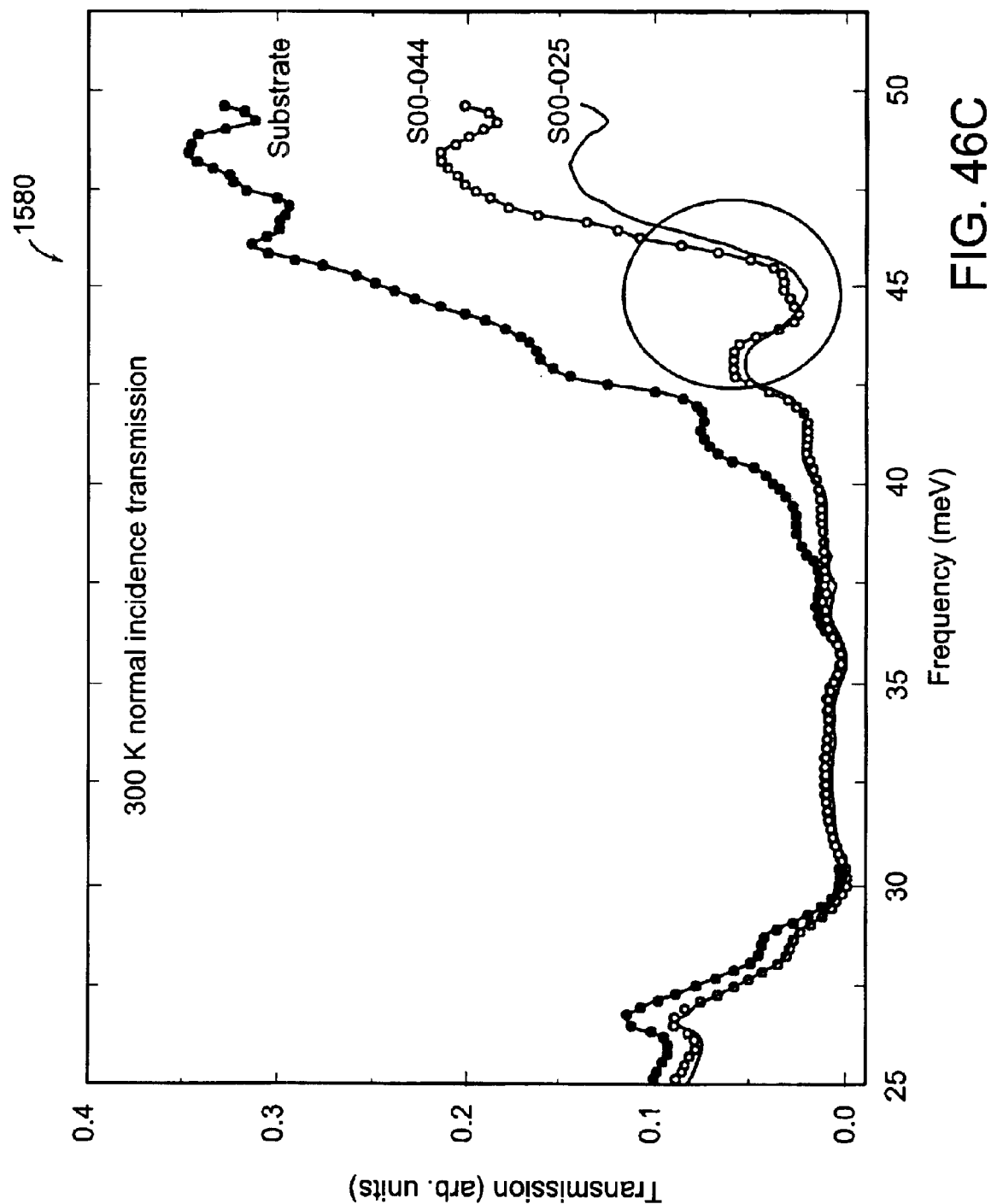

With regard to interface phonon absorption, while performing the transmission studies on the device described earlier in connection with FIGS. 43A and 43B, it was noted that the transmission spectra showed a wide dip at energies close to 45 meV even for normal incidence. This dip was not occurring due to intersubband transitions because these transitions cannot couple to the normally incident light. Transmission studies performed on another device which did not have intersubband energy spacing anywhere close to 45 meV, showed the dip at ~45 meV for normal incidence. When the allowed interface phonon mode frequencies is computed for both the systems, it is seen that both the structures allowed interface LO phonon modes having energies close to 45 meV. Hence, the dip seen in the normal incidence transmission spectra can be associated with absorption by interface phonons. Further, a transmission study performed on a semi-insulating GaAs substrate, which does not support interface phonons in accordance with a preferred embodiment of the present invention illustrated no dip being observed in the transmission spectrum at 45 meV for the substrate. This indicates the role of interface phonons in the absorption seen at 45 meV. FIGS. 46A–46C shows the schematic conduction band profile for the two devices that exhibit interface phonon absorption. Both the devices can be grown on semi-insulating substrate and consisted of 20 periods separated by 550 Å spacers with the middle 50 Å doped. As can be seen from FIG. 46A, the second device did not have any level spacing corresponding to 45 meV. The location of dopants were set back to minimize the effects of impurity scattering. The structure has GaAs quantum wells and $Al_{0.25}Ga_{0.25}As$ barriers.

The small dips at ~30 meV and 36 meV can be accounted for as the TO phonon and the bulk LO phonon absorption which is seen for all the three devices. FIG. 46B demonstrates the importance of accounting for the interface phonons in layered heterostructures. It is these modes that are used for depopulation in the quantum cascade THz emitter. The circle indicates the dip in the transmission corresponding to interface phonon absorption, which is not seen in the substrate.

Figure 47:
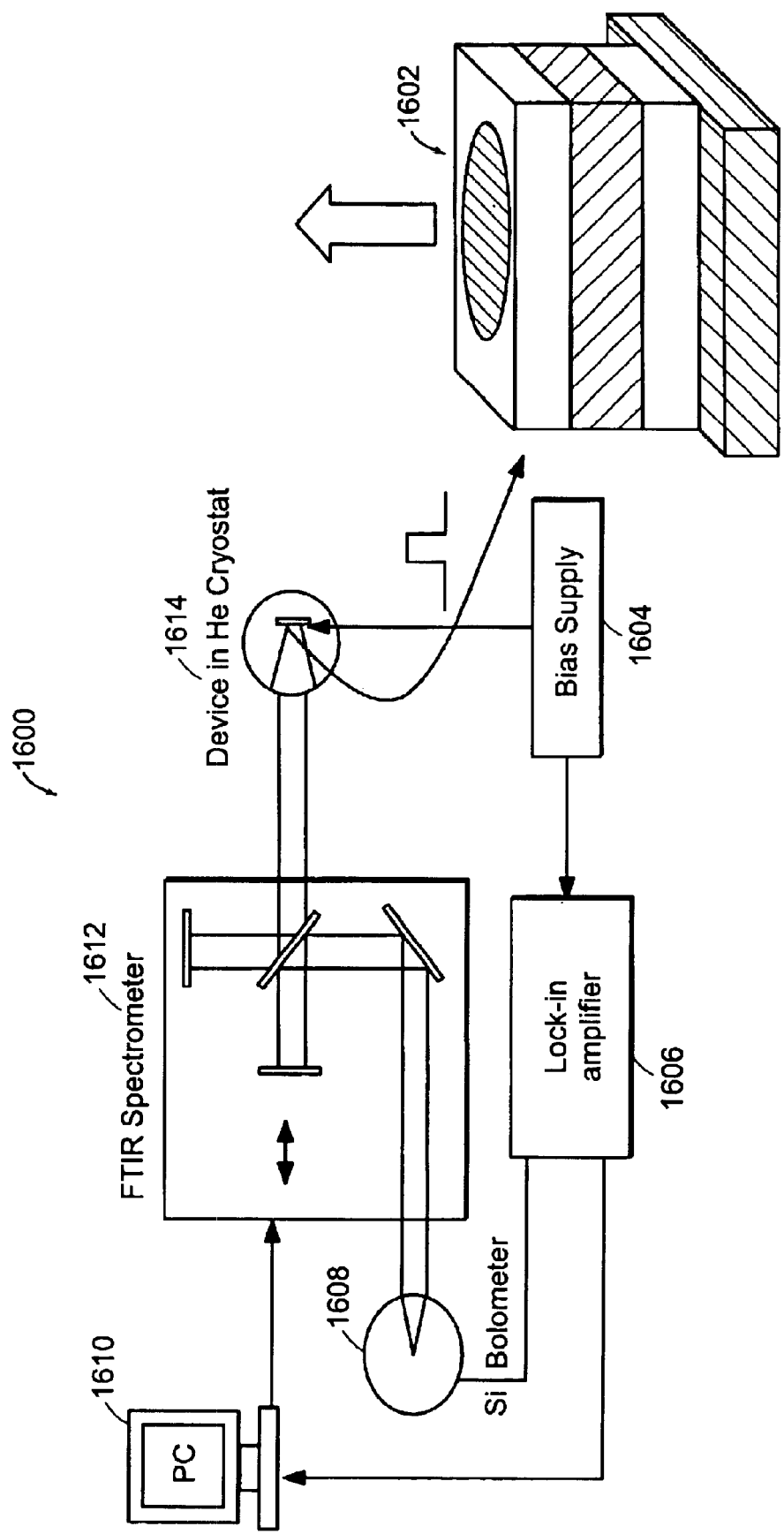
FIG. 47 schematically illustrates the experimental setup used for observing terahertz emission in accordance with a preferred embodiment of the present invention.

The first step towards developing a laser is to develop an emitter or a LED. For studying THz emission from the MBE grown quantum cascade structures, a Bruker IFS 66V Fourier Transform Spectrometer (FTIR) spectrometer can be used in the step scan mode to resolve the emission spectra in accordance with a preferred embodiment. The schematic diagram of the experimental set up used is shown in FIG. 47.

The structures can be mounted on the cold finger of a Helium (He) flow cryostat, and the temperature can be controlled using a Lakeshore DRC 93CA temperature controller. Current injection can be provided by a HP-214A function generator set to give out bursts of 1 ms pulses at a repetition rate of 50 Hz, corresponding to 10% duty cycle. The effect of the pulse width and correspondingly the duty cycle is analyzed in accordance with a preferred embodiment of the present invention. It is observed that as the duty cycle goes up, the structure suffers from excessive heating, and hence the emission from the structure suffers. The electroluminescence signal can be sent into the FTIR spectrometer which may be evacuated to avoid any losses due to water vapor. The resulting signal can be collected by a Si bolometer cooled to 4.2K. The output from the detector is fed into a lock in amplifier. The function generator also acts as a trigger for the spectrometer as well as reference for the lock in amplifier.

The FTIR spectrometer can be used in the step scan mode, where the mirror moves a step waits till it gets the next trigger either from the function generator or internally depending on the choice made and then moves to the next position. While the mirror waits at a particular position, the detector collects as much data as possible. This is enabled without limitation using the co-addition method in the Internal ADC TRS menu in the OPUS 2 version of the software that runs the spectrometer. Other platforms and computing software may be alternatively used.

The bias applied across the device is varied by changing the pulse height, which is monitored using an oscilloscope. The He cryostat that houses the device has SMA connections to feed the current. The temperature of the device can be varied from 5 K to 20 K using the screw adjustment on the cryostat. For higher temperatures, one may use the Lakeshore temperature controller.

Figure 35A:
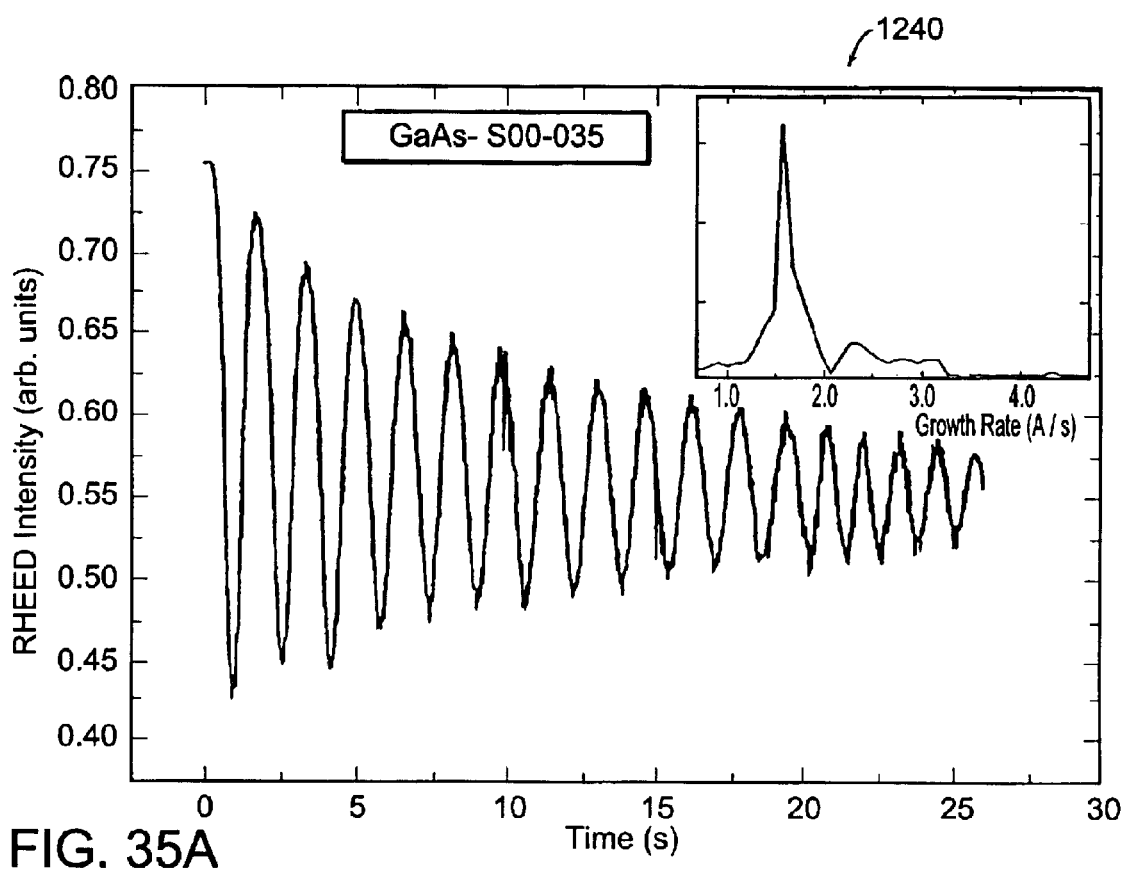
FIGS. 35A and 35B graphically illustrate the RHEED data for (a) GaAs and (b) AlGaAs for a structure in accordance with a preferred embodiment of the present invention.
Figure 35B:
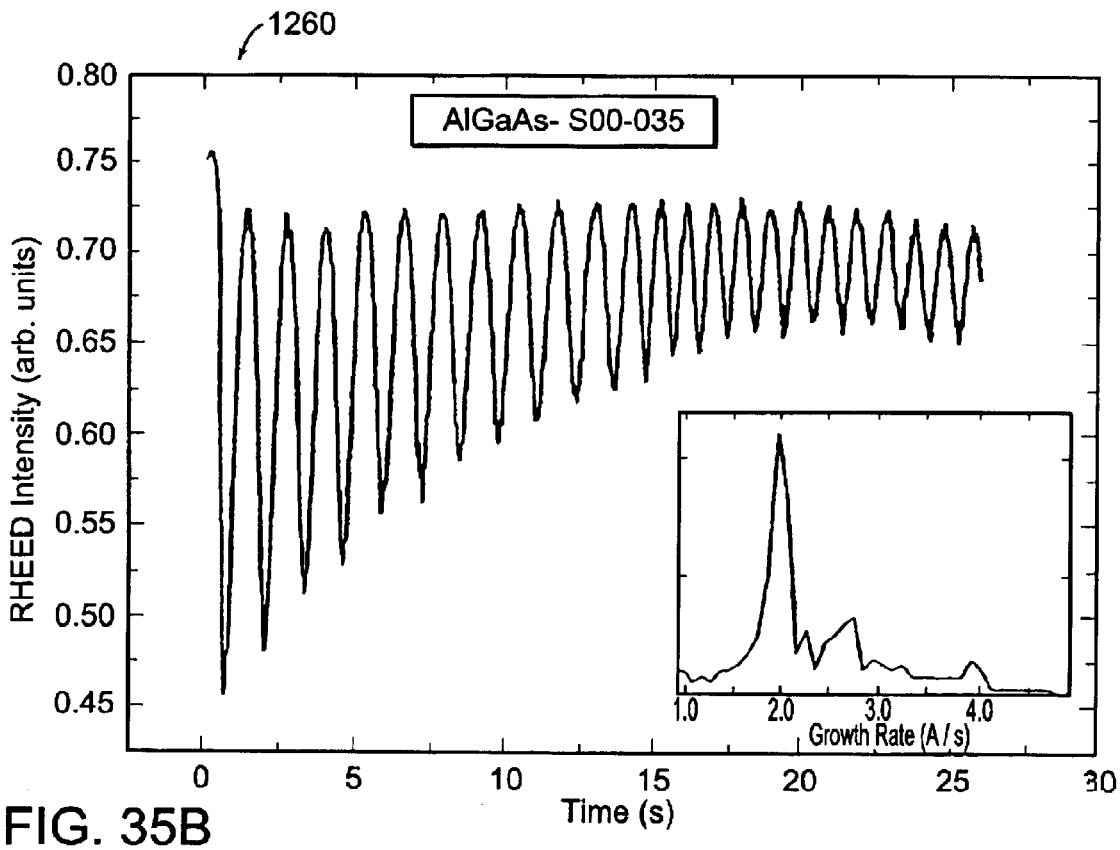
Figure 48:
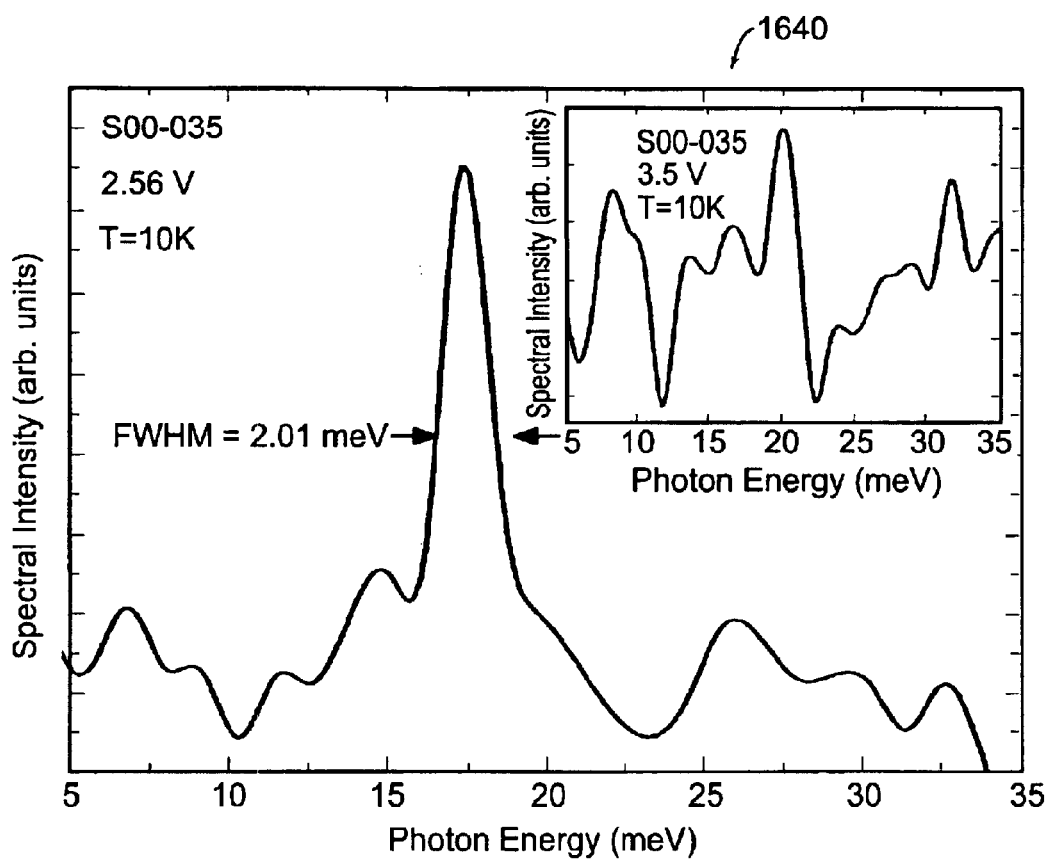
FIG. 48 graphically illustrates electroluminescence spectra taken at T=10 K for a structure showing emission at 17 meV (71 $\mu$m) in accordance with a preferred embodiment of the present invention.

The device described in connection with FIGS. 35A and 35B in accordance with a preferred embodiment had 40 periods of the $GaAs/Al_{0.25}Ga_{0.75}As$ triple quantum well cascade structure sandwiched between two 0.6 μm $n^{++}$ ($1.5 \times 10^{18}$ cm$^{-3}$) doped layers. The total thickness of the active region is ~1.31 μm. From theoretical calculations, it is seen that the optimal bias is 19.6 kV/cm which for the thickness of the device translates to 2.57 V. FIG. 48 shows the emission spectra obtained for this device at a temperature T=10 K at an applied bias of 2.56 V. A 15 μm grating with 50% fill factor can be used to couple the radiation out of the structure. To verify that the emission is occurring due to the intersubband transitions, spectra can be taken at a bias of 3.5 V where the energy levels are expected to be misaligned. The inset shows the spectra for 3.5 V where there are several peaks in the spectrum corresponding to a random energy level method.

Figure 49:
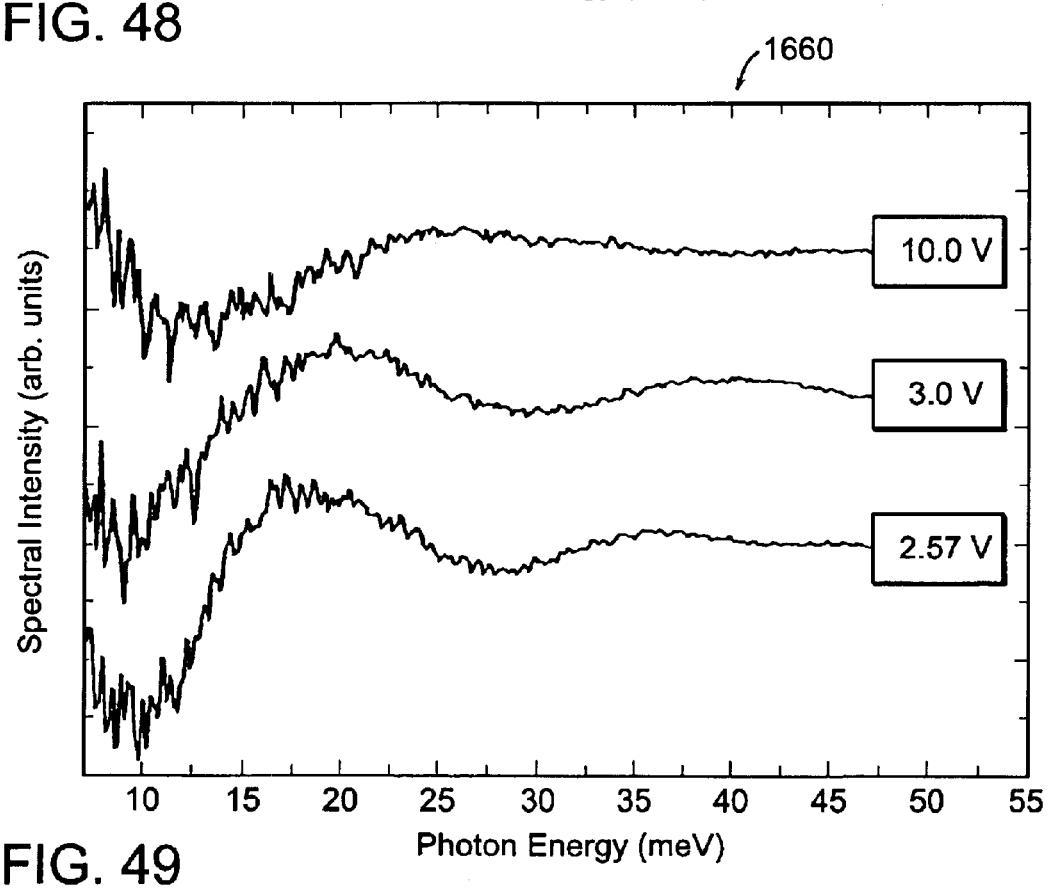
FIG. 49 graphically illustrates the variation of emission spectrum with applied bias for a structure in accordance with a preferred embodiment of the present invention.

It can be seen from FIG. 48 that emission at ~17.5 meV (4.2 THz or 71 μm) is observed at the appropriate bias. This is very close to the theoretically predicted value of 16 meV (3.9 THz or 77 μm). The Full Width at Half Maximum (FWHM) is found to be 2.01 meV. Emission studies can be performed at a temperature T=60 K also. The spectrally resolved THz intersubband emission observed at a temperature T=60 K is shown in FIG. 49.

It is seen as expected that the spectrum gets broader at higher temperatures due to the broadening of energy levels, but the main peak at 2.57 V is at the same energy as that seen at a temperature T=10 K. Even though the energy subband spacing is lower than the optical phonon energy, at sufficiently high temperatures, the hot electrons can emit phonons and may become the dominant nonradiative mechanism. A secondary broad feature with a peak at ~40 meV exists at a temperature of 60 K. This is attributed to black body radiation due to device heating.

Figure 36A:
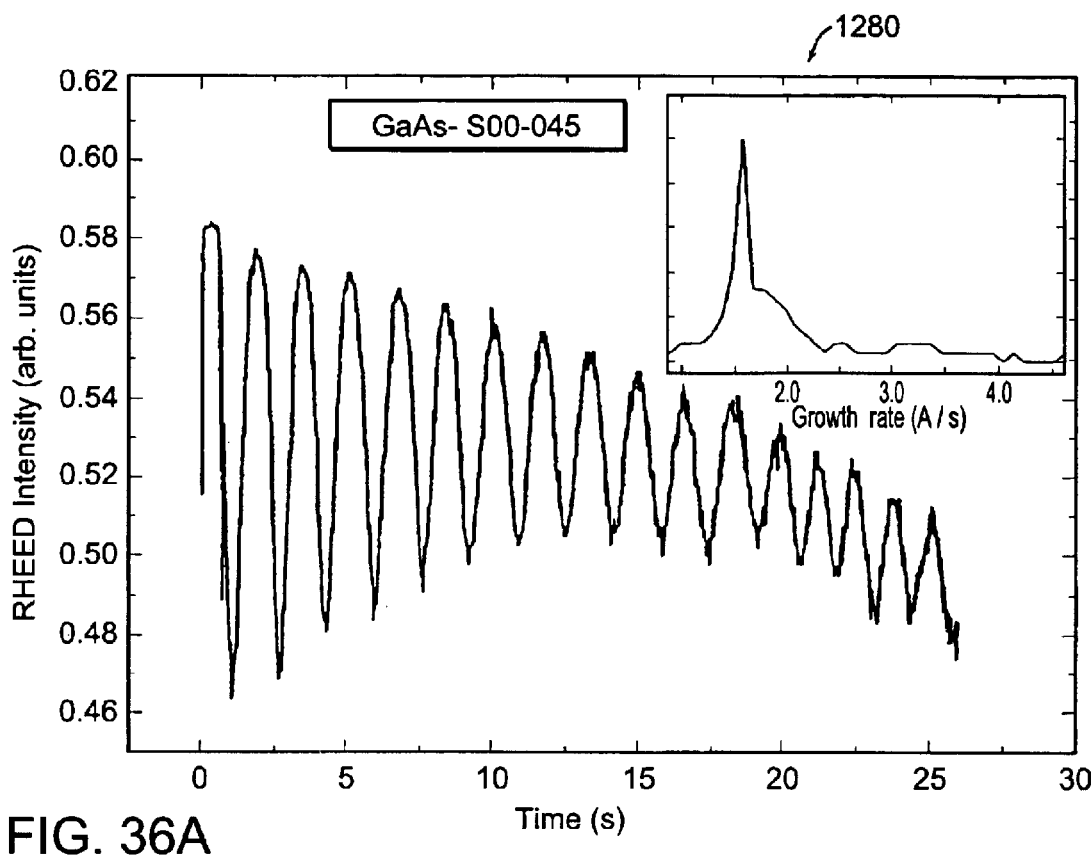
FIGS. 36A and 36B graphically illustrate the RHEED data for (a) GaAs and (b) AlGaAs for a structure in accordance with a preferred embodiment of the present invention.
Figure 36B:
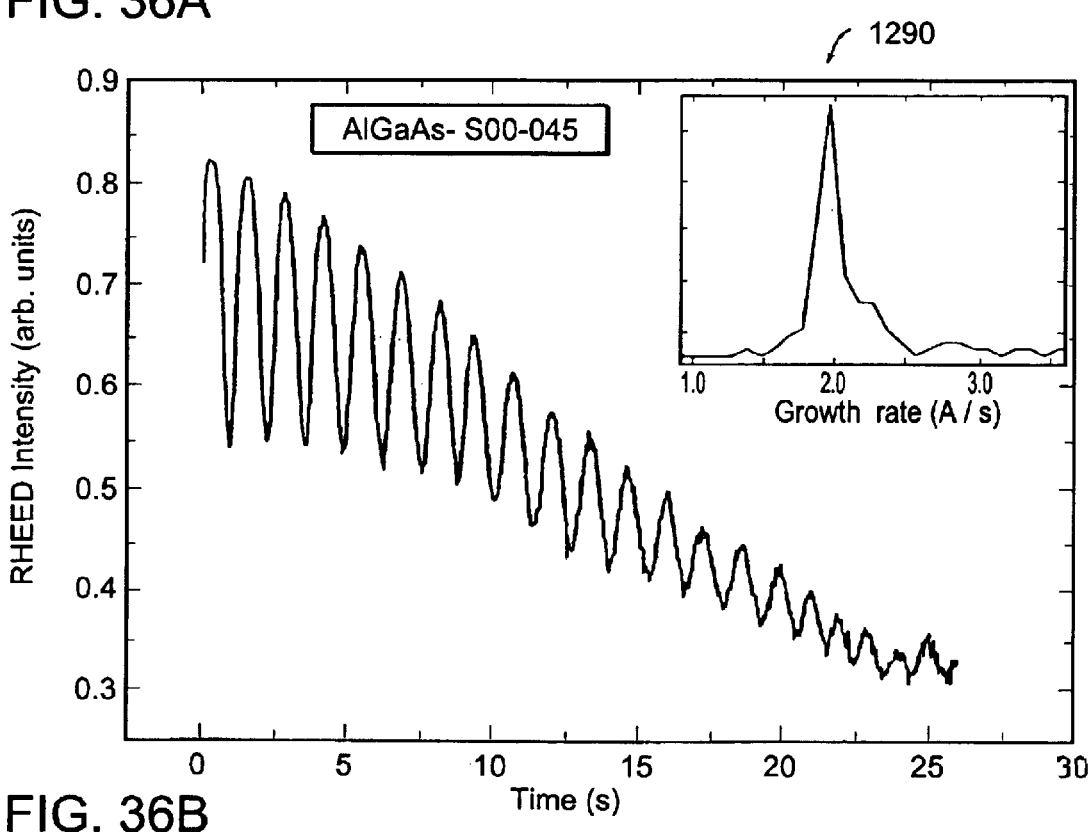
Figure 50:
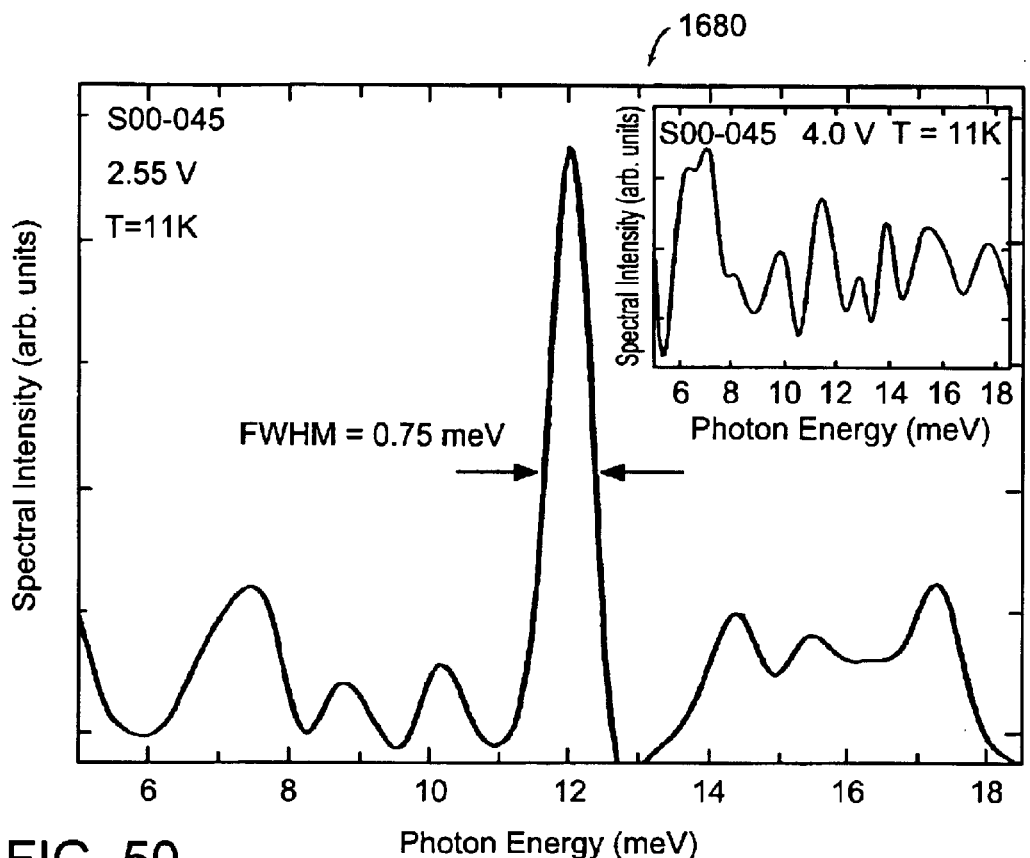
FIG. 50 graphically illustrates the electroluminescence spectra taken at T=10 K for a structure showing emission at 12 meV (2.9 THz or 104 $\mu$m) in accordance with a preferred embodiment of the present invention.

In another preferred embodiment, the device described in connection with FIGS. 36A and 36B consists of a GaAs/Al$_{0.2}$Ga$_{0.8}$As coupled asymmetric double quantum well structure which is repeated 40 times. This cascade structure can be sandwiched between two 0.6 μm n$^{++}$ doped layers (1.5×10$^{18}$cm$^{-3}$). The total thickness of the active region is ~1.26 μm. Theoretical simulation indicated that the optimal bias when the desired energy level spacing occurred is 20 kV/cm which corresponds to 2.52 V in this embodiment. FIG. 50 shows the emission spectra obtained for a structure at a temperature of T=10 K at an applied bias of 2.52 V. A 15 μm grating with 50% fill factor can be used to couple the radiation out of the structure.

As in the previous embodiment, to verify that the emission is occurring due to the intersubband transitions, the spectra can be measured at a high bias of 4.0 V where the energy levels are expected to be misaligned. The inset shows the spectra for 4.0 V where there are several peaks in the spectrum, corresponding to a random energy level method.

It can be seen from FIG. 50 that emission at ~12 meV (2.9 THz or 103 μm) is observed at the appropriate bias. This is very close to the theoretically predicted value of 11.8 meV (2.85 THz or 105 μm). The Full Width at Half Maximum (FWHM) is found to be 0.75 meV in this embodiment.

Figure 51:
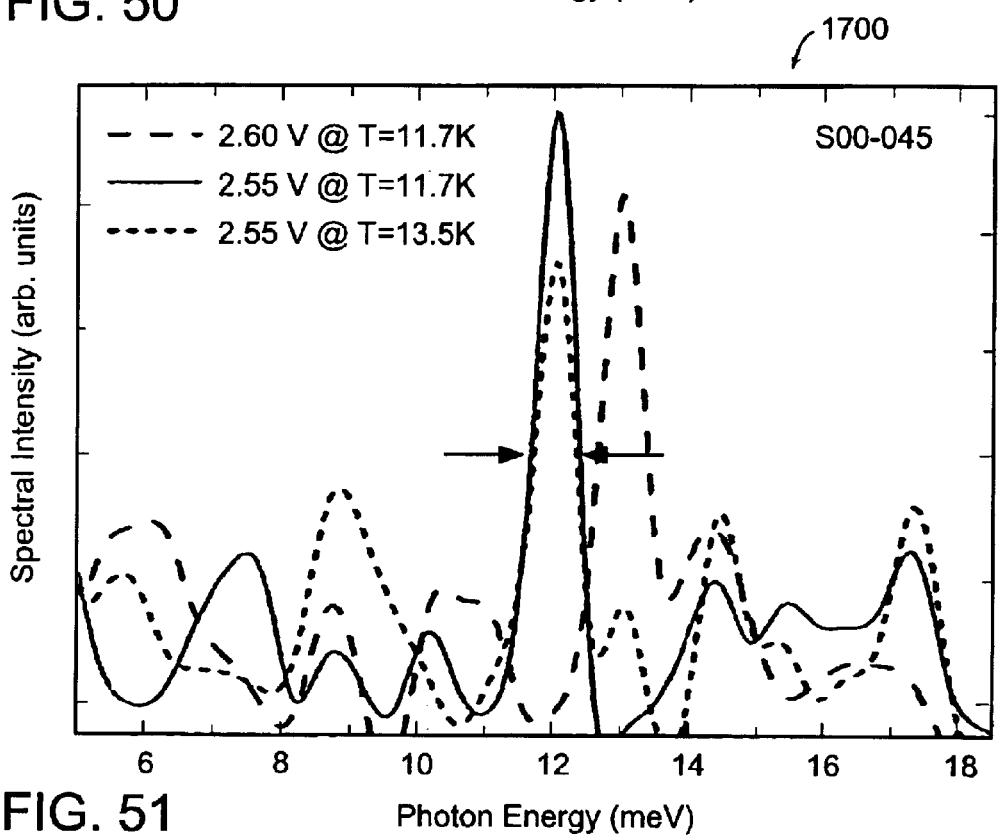
FIG. 51 graphically illustrates the intersubband emission for a structure at two different biases in accordance with a preferred embodiment of the present invention.

The possibility of observing Stark shift in the emission peak from this device can also be analyzed. The applied bias may be slowly tuned and the resulting spectrum taken using the FTIR spectrometer in the step scan mode. FIG. 51 shows the emission spectra taken at two different biases. The short dashed line corresponds to the emission spectrum at a higher temperature for an applied bias of 2.55 V.

Figure 52:
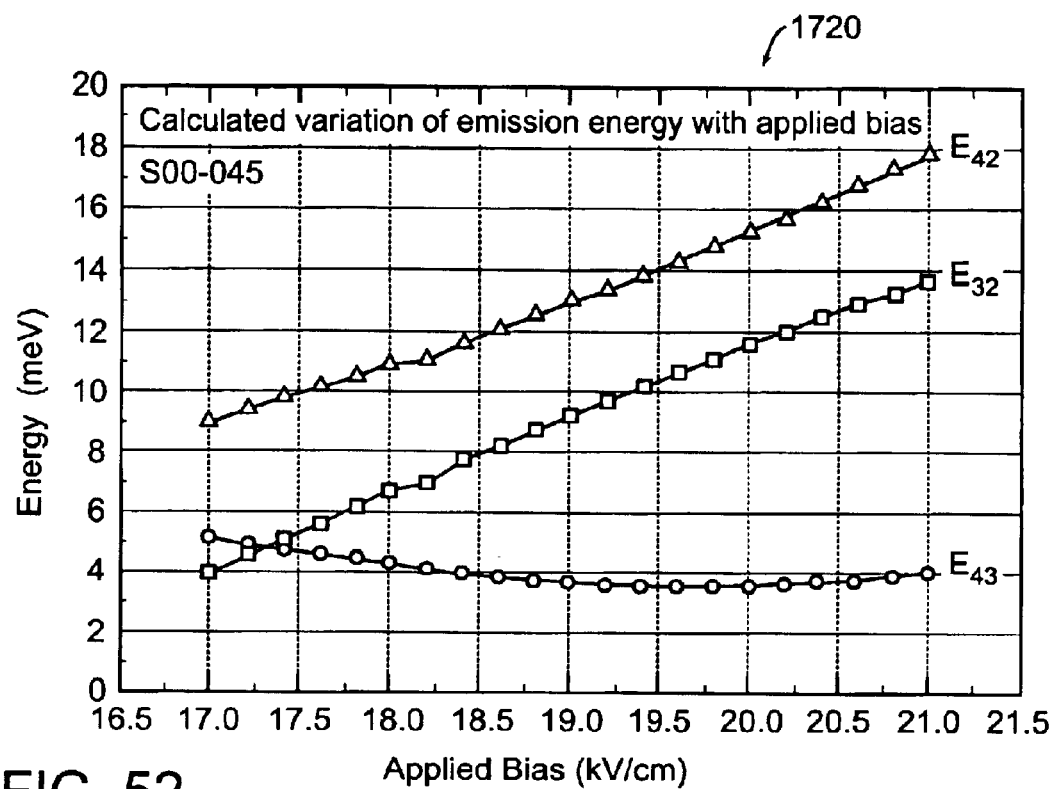
FIG. 52 graphically illustrates the calculated variation of emission energy as a function of applied bias in accordance with a preferred embodiment of the present invention.

The effect of quantum confined Stark shift is seen from the plots where peaks are observed at 12 meV and 13 meV for two different biases. To validate this, theoretical computation of the transition energies for different applied bias can be carried out. The variation in the transition energy for different bias is due to the quantum confined Stark shift. This is shown in FIG. 52 which illustrates the calculated variation of emission energy as a function of applied bias. E$_{32}$ is the main emission transition and E$_4$ corresponds to the lowest energy level of the previous stage.

It can be seen that the biases corresponding to 12 meV and 13 meV transitions are 20.2 kV/cm and 20.6 kV/cm, respectively. For the experimental data, the two biases that gave 12 meV and 13 meV emission are 2.6 V and 2.55 V, respectively. The ratio of the applied bias for the two emission embodiment can be taken for both theory and experiment.

$$\text{Theory:} \quad \frac{20.6 \text{ kV/cm}}{20.2 \text{ kV/cm}} = 1.018 \quad (51)$$

$$\text{Experiment:} \quad \frac{2.60 \text{ V}}{2.55 \text{ V}} = 1.019 \quad (52)$$

There is a high degree of agreement between the ratios for theory and experiment. Hence, it can be concluded that the shift in emission peak was due to quantum confined Stark effect.

Also, the spectrum taken at a slightly higher temperature for the same applied bias shows the same main peak, but with additional smaller peaks. These spurious peaks are most probably due to emission from other levels. The peaks seen between 15 meV and 17 meV can be attributed to the transition occurring between the lowest state of the previous stage and the second level of the current one (E$_{42}$). It can be seen in FIG. 52 that when the E$_{32}$ transition corresponds to ~12 meV, the E$_{42}$ transition corresponds to ~16 meV.

Figure 53:
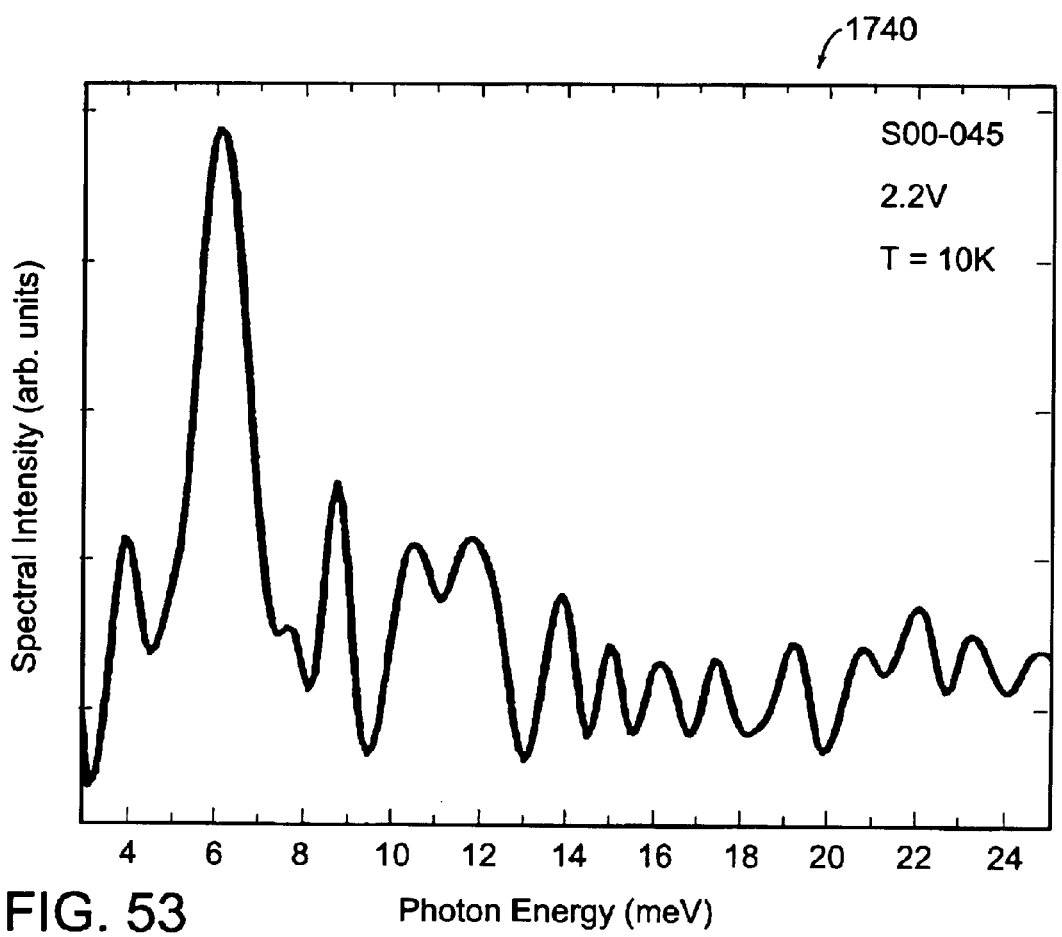
FIG. 53 graphically illustrates the electroluminescence spectrum of a structure at 2.2 V exhibiting emission at 6 meV (1.45 THz or 206 $\mu$m) in accordance with a preferred embodiment of the present invention.

In a preferred embodiment, dual wavelength emission is observed. At a lower bias (2.2 V), a second structure exhibited emission at ~6 meV (1.45 THz or 206 μm). FIG. 53 shows the emission at 6 meV (1.45 THz or 206 μm) seen from the structure under an applied bias of 2.2 V at a temperature T=10 K.

To explain the secondary emission seen at ~6 meV from a preferred embodiment structure, the energy level spacing between all the energy levels in the system can be examined. From FIG. 52 it is evident that for E$_{32}$ to be ~6 meV, the applied bias has to be 17.7 kV/cm. The results of the band structure analysis performed for second structure under a bias of 17.7 kV/cm is shown in FIGS. 54A and 54B.

Figure 54A:
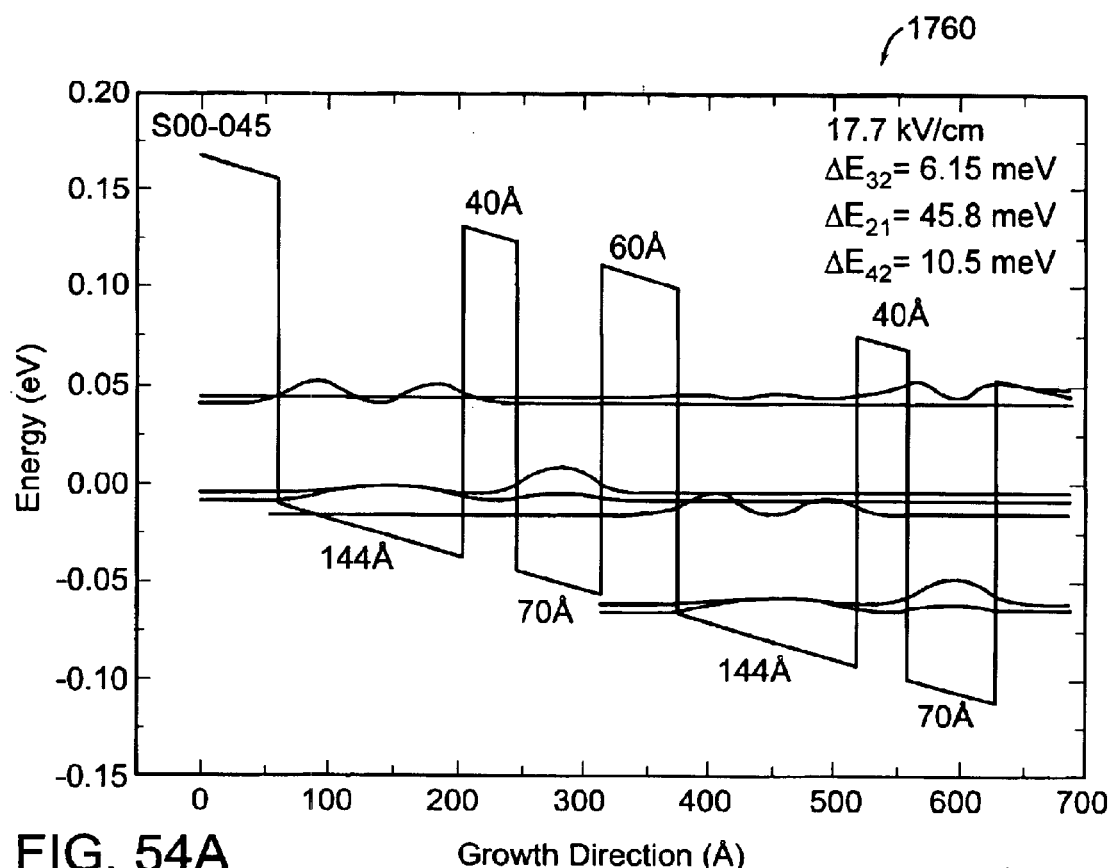
FIGS. 54A and 54B graphically illustrate the conduction band profile of a structure under an applied bias of 17.7 kV/cm and (b) magnified image of the same in accordance with a preferred embodiment of the present invention.
Figure 54B:
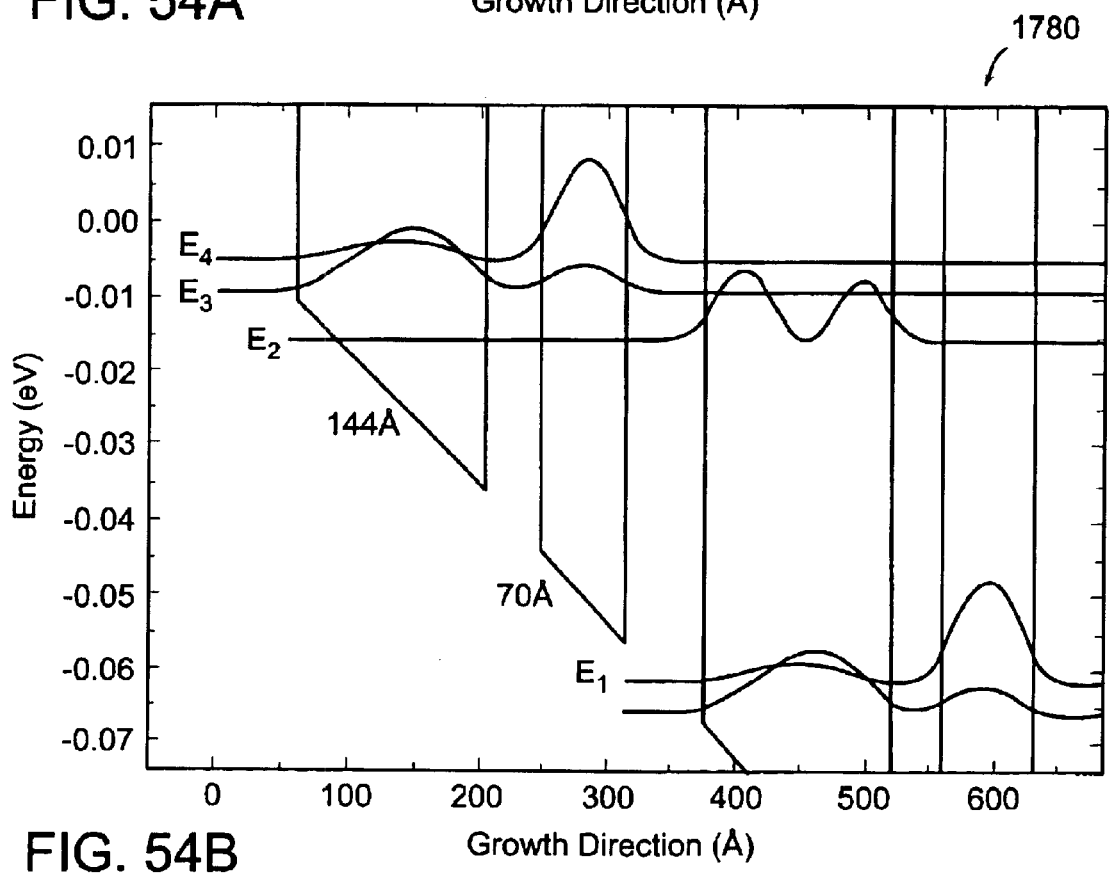

At a bias of 17.7 kV/cm it is seen from FIGS. 54A and 54B that the energy level spacing between E$_3$ and E$_2$ is ~6 meV and that between E$_2$ and E$_1$ is ~46 meV. Hence the E$_{21}$ transition is in resonance with an interface phonon mode of the system, thereby ensuring fast depopulation of level |2>. It should however be noted that the level |3> is more localized in the last well off the previous stage and level |1> is more localized in the first well of the next stage. This is seen in FIG. 54B, where E$_3$ is more localized in the 144 Å quantum well of the previous stage and E$_1$ is more localized in the 70 Å quantum well of the next stage. Due to this nature of localization of wavefunctions, the oscillator strength for radiative transition decreases considerably and hence this emission method may not be as efficient as the one that occurs at 20 kV/cm. In the latter case, E$_3$ is localized in the 70 Å quantum well of the current stage and E$_1$ is localized in the 144 Å quantum well.

Thus, this cascade system in accordance with the present invention is capable of emission at two entirely different wavelengths (104 μm and 206 μm) for two different applied biases. Further embodiments explore the developing of a multi-wavelength emitter by exploiting the different interface phonon modes in the system. Here only the higher energy interface phonons are used for depopulation.

The quantum cascade lasers in the near and mid infrared (IR) range of the electromagnetic spectrum can be used for the development of a compact coherent source in the terahertz (THz) frequency range. The phonon mediated depopulation method is preferable for layer fluctuations in comparison to the resonant tunneling methods due to the band of phonon energies available in the multiple quantum well structures.

However, using the bulk phonons for depopulation of level |2> in a three level THz emitter provides an undesired non-radiative channel for level |3> (upper level) due to the energy difference $\Delta E_{31}$ coming into resonance with higher energy interface (IF) phonons. In a preferred embodiment the higher energy (AlAs-like) IF phonons for the depopulation of the second level are used.

At low temperature (T<40 K), electron-electron (e-e) scattering is the most dominant non-radiative mechanism when the intersubband energy level spacing is below the LO phonon energy, resulting in lifetimes on the order of 0.1–10 ps. This is much shorter than the acoustic phonon mediated lifetimes, which are typically 100–200 ps. The highly efficient e-e scattering process between the upper levels (levels |3> and |2>) is considered to be one of the most significant barriers in realizing population inversion in a quantum cascade structure designed to emit in the THz range (10–20 meV). Accordingly, in a preferred embodiment population inversion is attained by using the interface phonons for depopulation of level |2>.

Figure 55A:
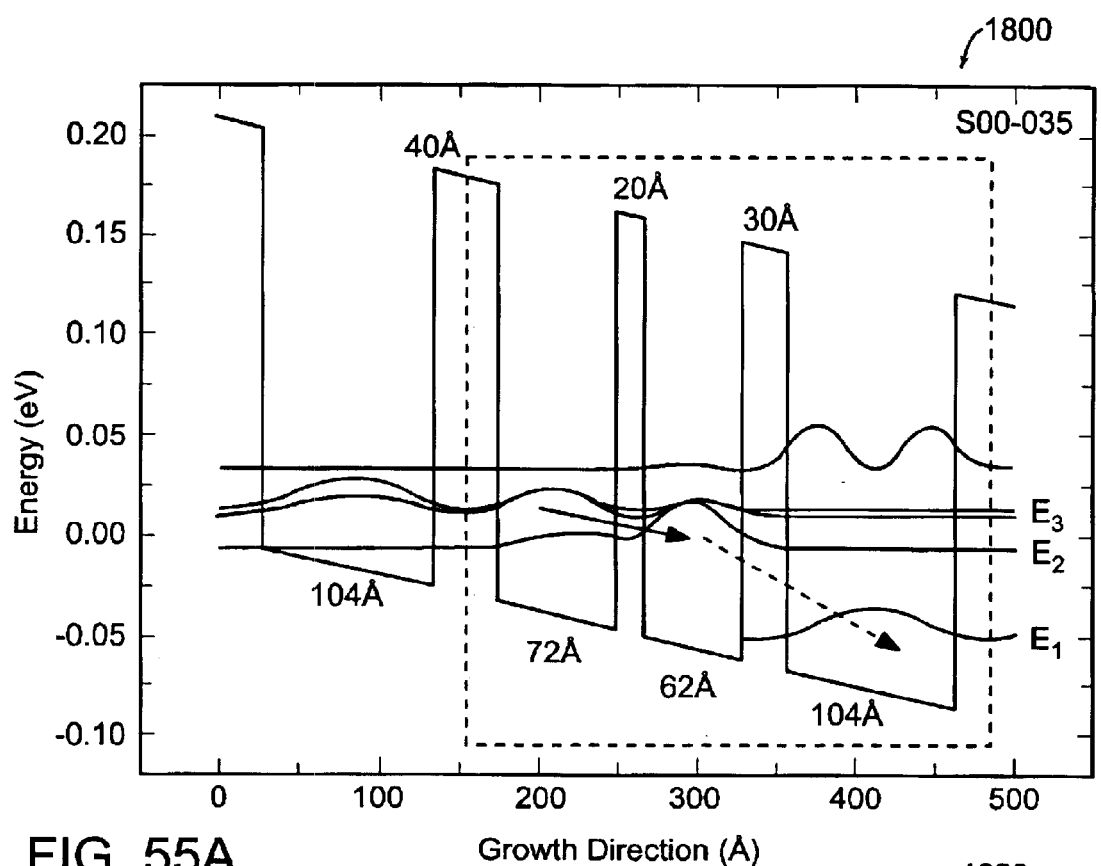
FIGS. 55A and 55B illustrate the conduction band profile for (a) a first structure and (b) a second structure along with the calculated energy levels and squared moduli of the wavefunctions under an applied bias of 19 kV/cm and 20.1 kV/cm, respectively, are shown. The bold arrow indicates the radiathe transition and the dashed arrow corresponds to the interface phonon mediated transition. The region within the dashed box corresponds to one period of the structure. The first structure consists of GaAs quantum wells and $Al_{0.25}Ga_{0.75}As$ barriers and the second structure consists of GaAs quantum wells with $Al_{0.20}Ga_{0.80}As$ barriers in accordance with a preferred embodiment of the present invention.
Figure 55B:
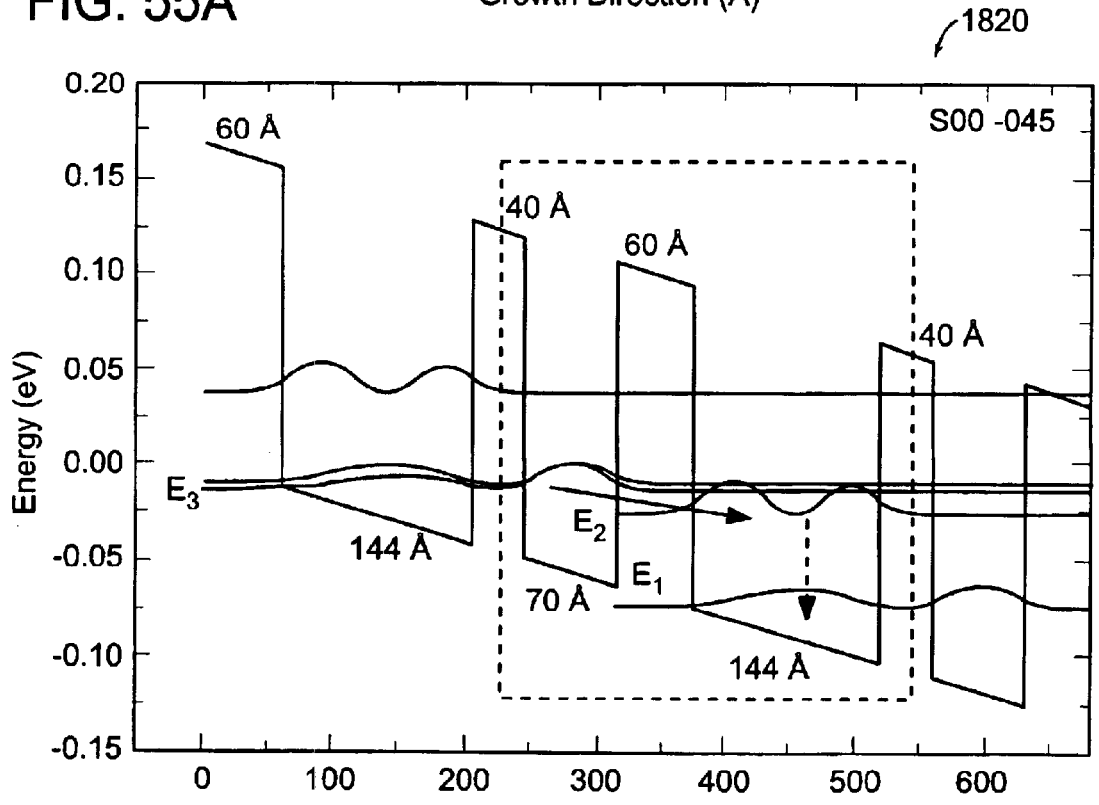

In FIGS. 55A and 55B the conduction band profile is illustrated along with the energy levels and the squared magnitude of wavefunctions of the electronic states in two different preferred structures of the present invention. Both structures rely on interwell (spatially diagonal) transition for emission. The interwell method is to lower the e-e scattering between the relevant electronic states. This, however, is achieved at the expense of lower oscillator strengths.

Figure 56A:
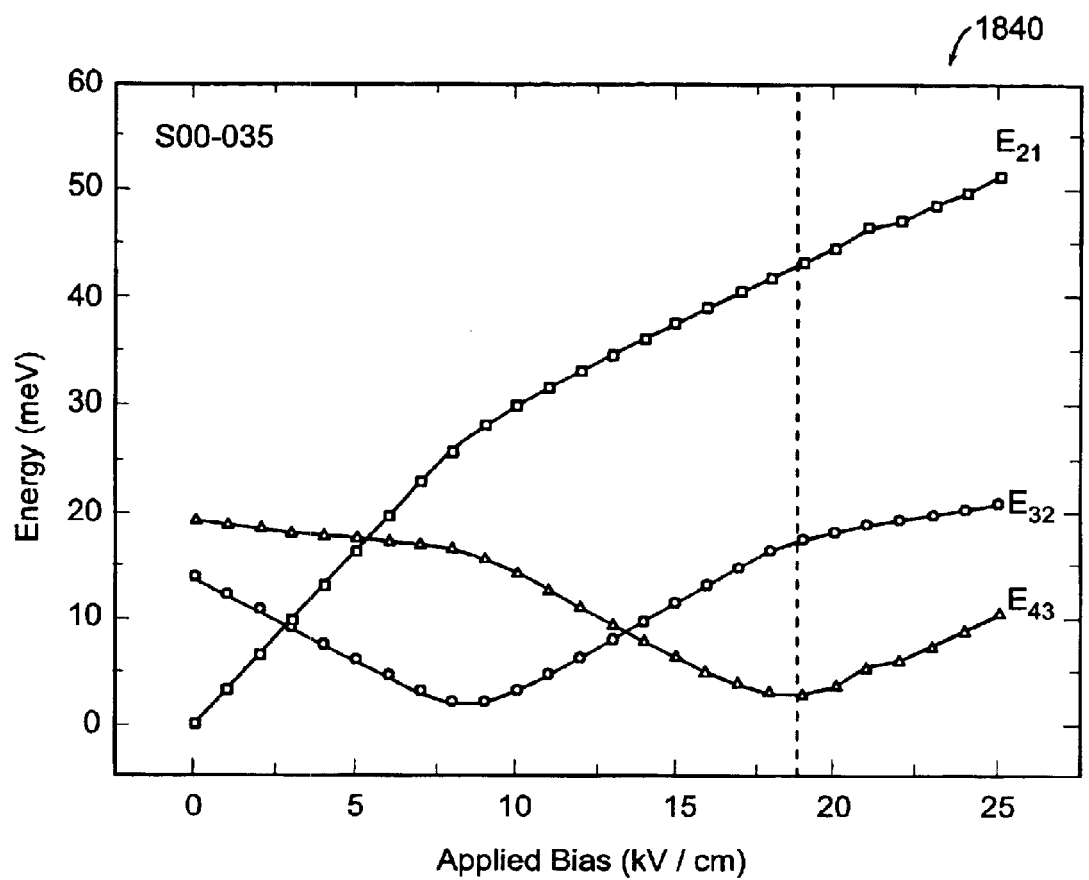
FIGS. 56A and 56B illustrate the variation of intersubband energy level spacing as a function of applied bias for two structures (a) and (b). The dashed line indicates the optimal bias under which $E_{21}$ is close to interface phonon energy and $E_{43}$ is a minimum. Here $E_4$ corresponds to the lowest energy level of the previous stage in accordance with a preferred embodiment of the present invention.
Figure 56B:
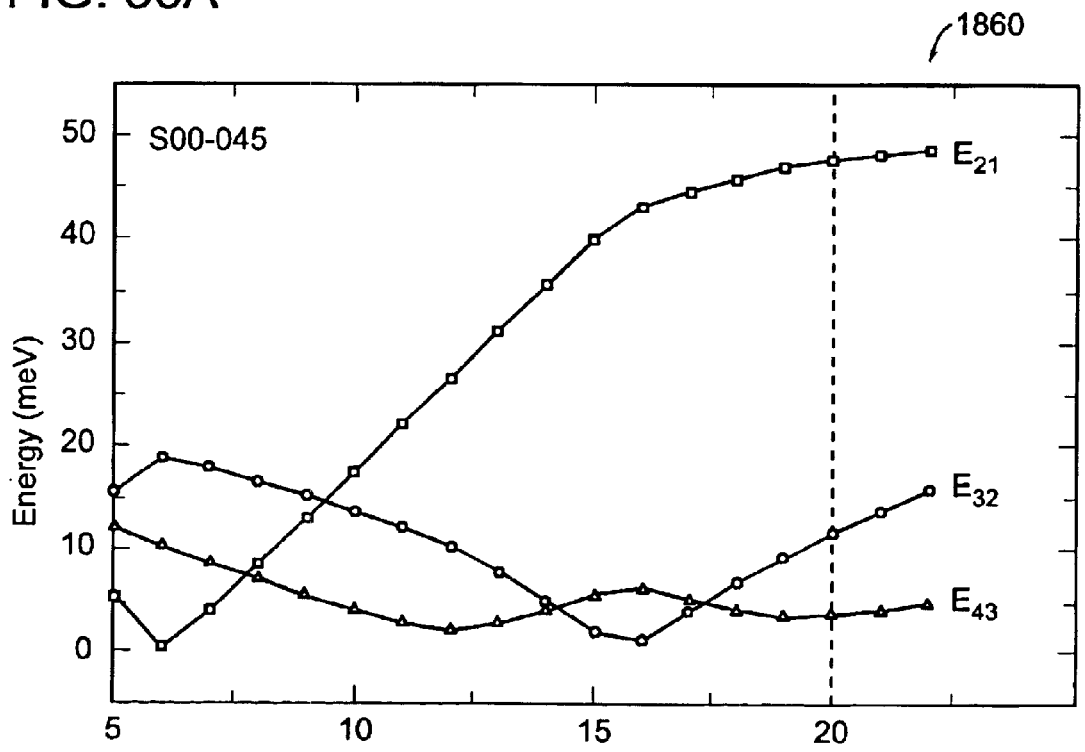

In a preferred embodiment a first structure is designed for emission at 16 meV (3.87 THz or 77.5 μm) and a second structure is designed for emission at 11.8 meV (2.85 THz or 105 μm). In both the structures, levels |2> and |1> are separated by the AlAs-like IF phonon energy (~46 meV). The variation in the energy level spacing for the two structures as a function of applied bias is shown in FIGS. 56A and 56B. The appropnate bias (indicated by dashed lines), levels |3> and |2> are separated by the energy corresponding to THz frequency, levels |2> and |1> are separated by IF phonon energy and levels |4> and |3> are separated by minimum energy. Level |4> corresponds to the lowest energy level of the previous stage in the cascade structure. The minima indicate anti-crossing of the lowest energy level of the previous stage with the uppermost energy level of the current one. This is a necessary condition to achieve maximum injection efficiency from one period to the next. For the two structures in FIGS. 55A and 55B, the calculated values of lifetimes and oscillator strengths are shown in Table 9.

TABLE 9

| | First Structure | Second Structure |
|---|---|---|
| $\tau_{32}$ (electron-electron) (ps) | 0.1 | 15.0 |
| $\tau_{21}$ (electron-phonon) (ps) | 0.06 | 0.05 |
| $\tau_{31}$ (electron-phonon) (ps) | 0.2 | 20.0 |
| $f_{32}$ (Oscillator Strength) (ps) | 0.45 | 0.003 |

The structure described in connection with FIGS. 36A and 36B offer longer lifetime of the upper level at the expense of oscillator strength.

The THz emitters are fabricated using solid source molecular beam epitaxy (MBE) on $n^+$GaAs substrates. Forty periods of the cascade structures were sandwiched between two $n^+$($1.5 \times 10^{18}$ cm$^{-3}$) GaAs layers. In the devices (FIGS. 35–36) the 104 Å quantum well and in the 60 Å barrier was slightly n-doped ($2 \times 10^{16}$ cm$^{-3}$) to minimize space charge effects. In the latter case, the barrier is doped to eliminate any radiative 2p-1s impurity transition. The heavily doped layers are placed on either side of the cascade structure to act as plasma reflectors to confine the THz mode. Once grown, the wafers are processed into emitters with the Indium alloyed into the back of the wafer during the growth process, serving as the back contact. Ni/Ge/Au grating with 15 μm periodicity and 50% fill factor is deposited on the top surface for output coupling and top ohmic contact. The emitters are made into devices of 1000 μm×1000 μm size.

Figure 57A:
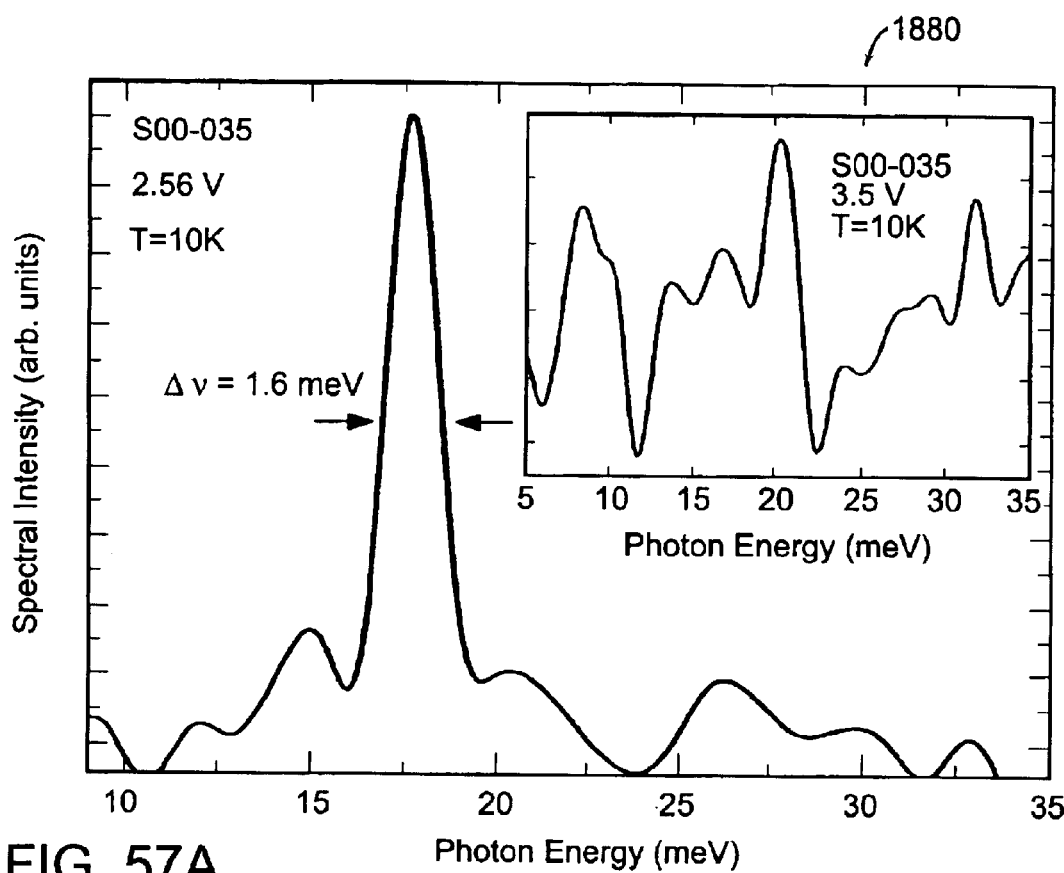
FIGS. 57A and 57B illustrate the electroluminescence spectra taken at T=10 K for (a) a first structure under an applied bias of 2.56 V showing emission at ~17.5 meV (4.2 THz or 71 $\mu$m ) and the inset shows the spectrum taken at 3.5 V. (b) Spectra seen from a second structure at T=10 K under an applied bias of 2.55 V showing emission at ~12 meV (2.9 THz or 104 $\mu$m ) and the inset shows the spectrum taken at 4.0 V in accordance with a preferred embodiment of the present invention.
Figure 57B:
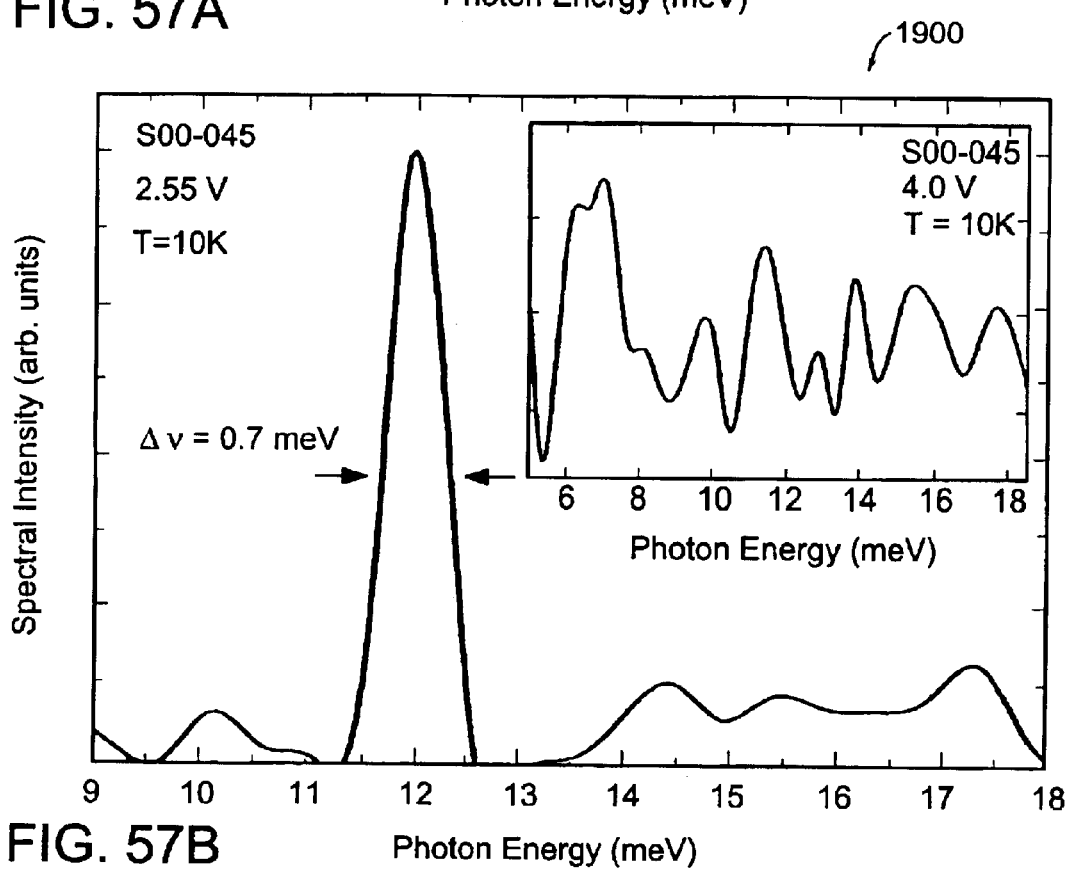

For analyzing the THz emission from the MBE grown quantum cascade structures, a Bruker IFS 66V Fourier transform infrared (FTIR) spectrometer is used in the step scan mode. The devices are mounted on the cold finger of a He flow cryostat and the temperature is controlled using a Lakeshore DRC 93CA temperature controller. Current injection is provided by a HP 214A function generator set to give out 1 ms pulses at a repetition rate of 100 Hz, corresponding to 10% duty cycle. The electroluminescence signal is sent into the FTIR spectrometer, which is evacuated to avoid any losses due to water vapor. The resulting signal is collected by a Si bolometer cooled to 4.2 K. The output from the detector is fed into a lock in amplifier. The function generator also acted as a trigger for the spectrometer as well as a reference for the lock in amplifier. Terahertz electroluminescence observed from the two different samples at a temperature T=10 K are shown in FIGS. 57A and 57B. The first device (FIG. 35) showed emission at 17.5 meV (4.2 THz) with a full width at half maximum (FWHM) of 1.6 meV and the second device (FIG. 36) showed emission at 12.0 meV (2.9 THz) with FWHM of 0.7 meV at a temperature T =10 K. Both the samples showed maximum emission at a bias close to the theoretically predicted value. To further verify that the THz emission is occurring due to intersubband transitions within the conduction band of the cascade structure, the emission spectrum at higher bias is measured. The spectrum obtained at higher bias is shown in the insets in FIGS. 57A and 57B. Multiple peaks arising from severe misalignment of the various energy levels associated with the entire cascade structure are observed. At the bias indicated in FIGS. 56A and 56B, the dominant single peak emission can clearly be ascribed to the specific intersubband transition occurring between levels |3> and |2> in each period of the multiple quantum well structure, providing an indication of the origin of the THz emission.

Figure 58A:
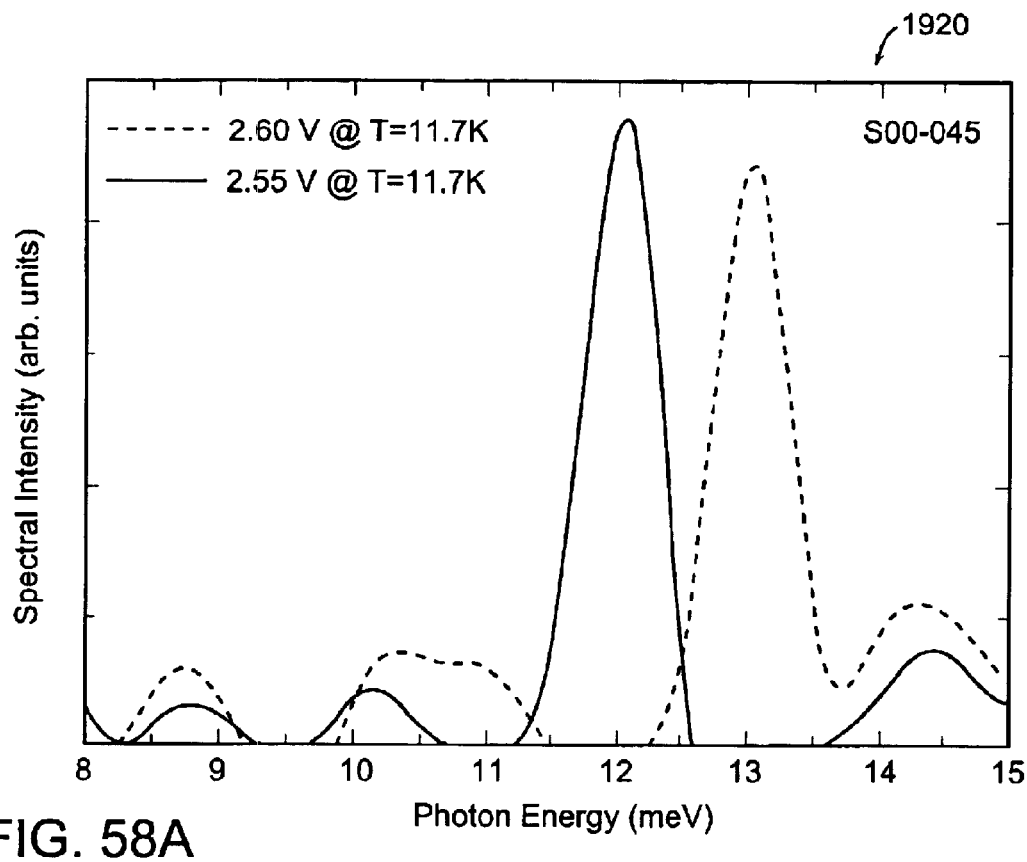
FIGS. 58A and 58B illustrate (a) Intersubband emission for a structure at two different biases demonstrating the quantum confined Stark shift in the main emission peak; (b) the calculated variation of emission energy with applied bias for the structure is also shown. The circles indicate the points corresponding to the experimentally observed emission energy in accordance with a preferred embodiment of the present invention.
Figure 58B:
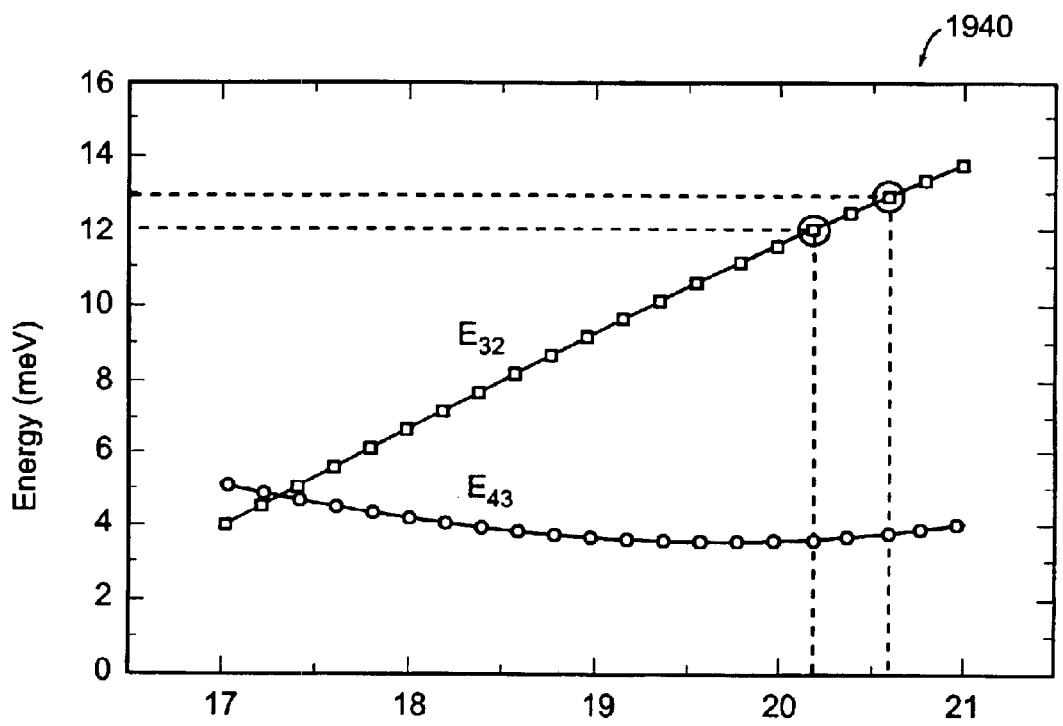

The second device (FIG. 36) also displayed a shift in its emission frequency with applied bias due to the quantum confined Stark effect (QCSE). FIGS. 58A and 58B illustrate the observed shift in emission frequency with applied bias for the device. At 2.55 V the emission peak is at 12 meV, and at 2.6 V the emission peak is at 13 meV. The calculated shift due to QCSE in emission energy as function of applied bias is shown in FIG. 58B. The experimentally observed biases that resulted in the two emission peaks were compared to the theoretically predicated values. From the theoretical curve FIG. 58B, it can be seen that the two biases that result in emission at 12 meV and 13 meV are 20.2 kV/cm and 20.6 kV/cm. For the device in accordance with a preferred embodiment, these biases correspond to 2.54 V (40 periods× 314 Å×20.2 kV/cm) and 2.59 V (40 periods×314 Å×20.6 kV/cm), respectively, and are very close to the experimentally observed values of 2.55V and 2.60V. Here, 314 Å corresponds to the length of one period of the second cascade structure.

Preferred embodiments have demonstrated THz electroluminescence from quantum cascade structures employing IF phonons for depopulation. Very narrow emission peaks are observed, despite the interwell nature of the radiative transition, at 12 meV and 17.5 meV with FWFIM of 1.6 meV and 0.7 meV, respectively, at a temperature T=10 K.

Tunability of the THz emission can be implemented utilizing the Stark shift.

Figure 59:
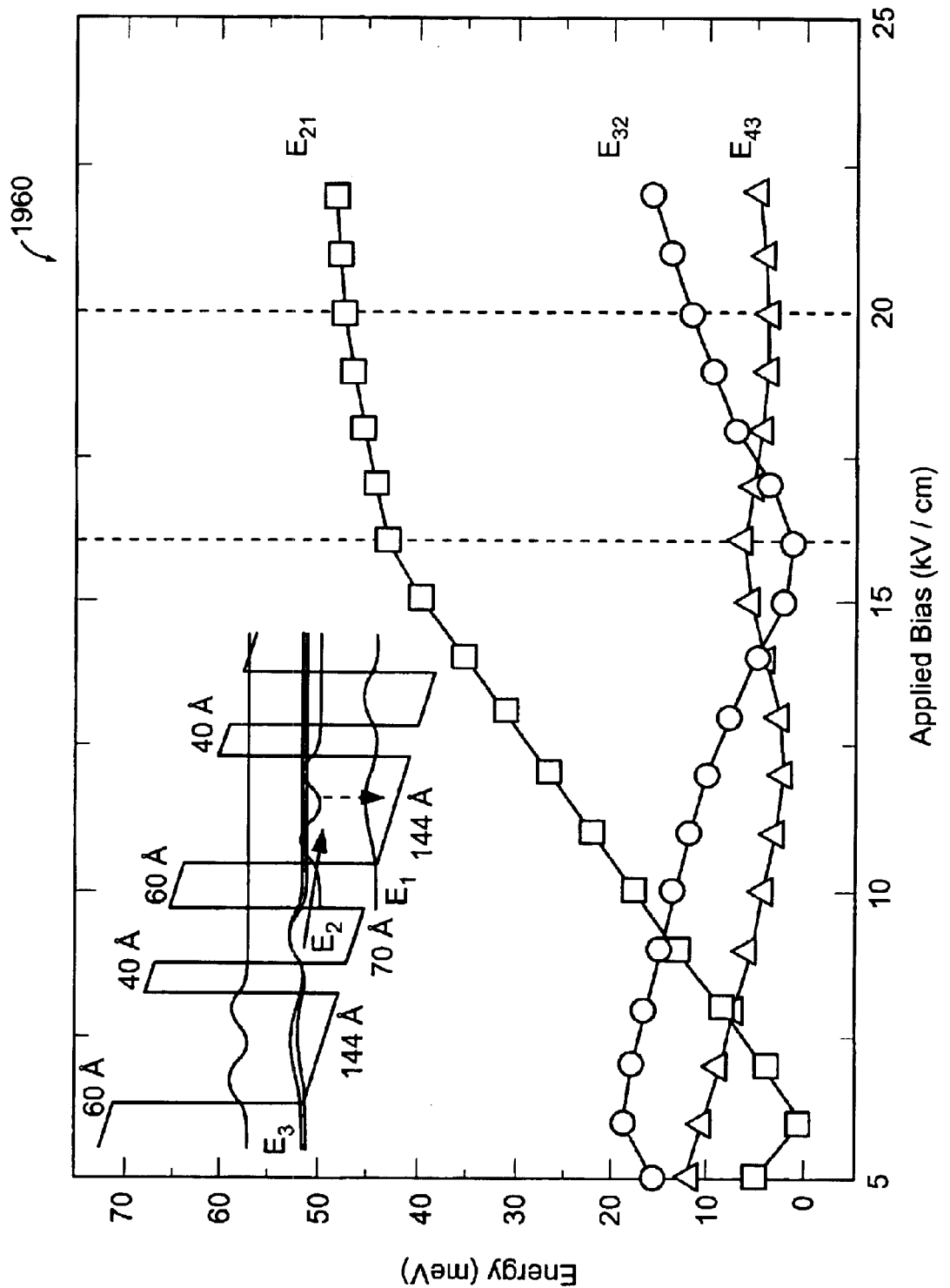
FIG. 59 illustrates the calculated variation of intersubband energy level spacing as a function of applied bias. The dashed lines indicate the optimal values of applied biases under which the device is designed to emit at the two different frequencies. At 16 kV/cm, the device is designed to emit at 6 meV with levels |3> and |2> anticrossing and at 20 kV/cm, the device is expected to emit at 12 meV with levels |4> and |3> anticrossing. At both these biases, $\Delta E_{21}$ is close to the AlAs-like phonon energy. The inset shows the conduction band profile of the $GaAs/Al_{0.2}Ga_{0.8}As$ quantum cascade structure along with the layer thicknesses and wavefunctions in accordance with a preferred embodiment of the present invention.
Figure 60A:
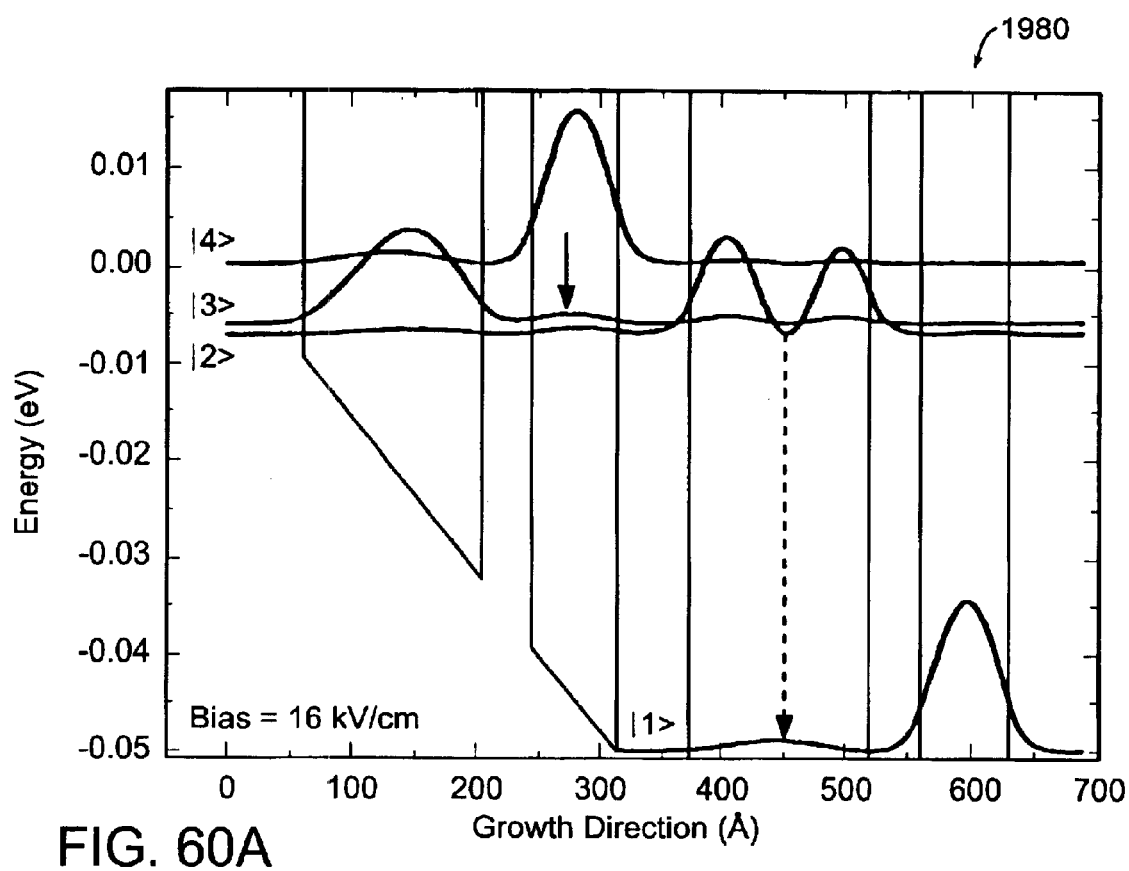
FIGS. 60A and 60B illustrate the squared moduli of the relevant electronic wavefunctions under an applied bias of (a) 16 kV/cm and (b) 20 kV/cm, respectively. The bold arrow indicates the radiative transition and the dashed arrow corresponds to the phonon-mediated transition in accordance with preferred embodiments of the present invention.
Figure 60B:
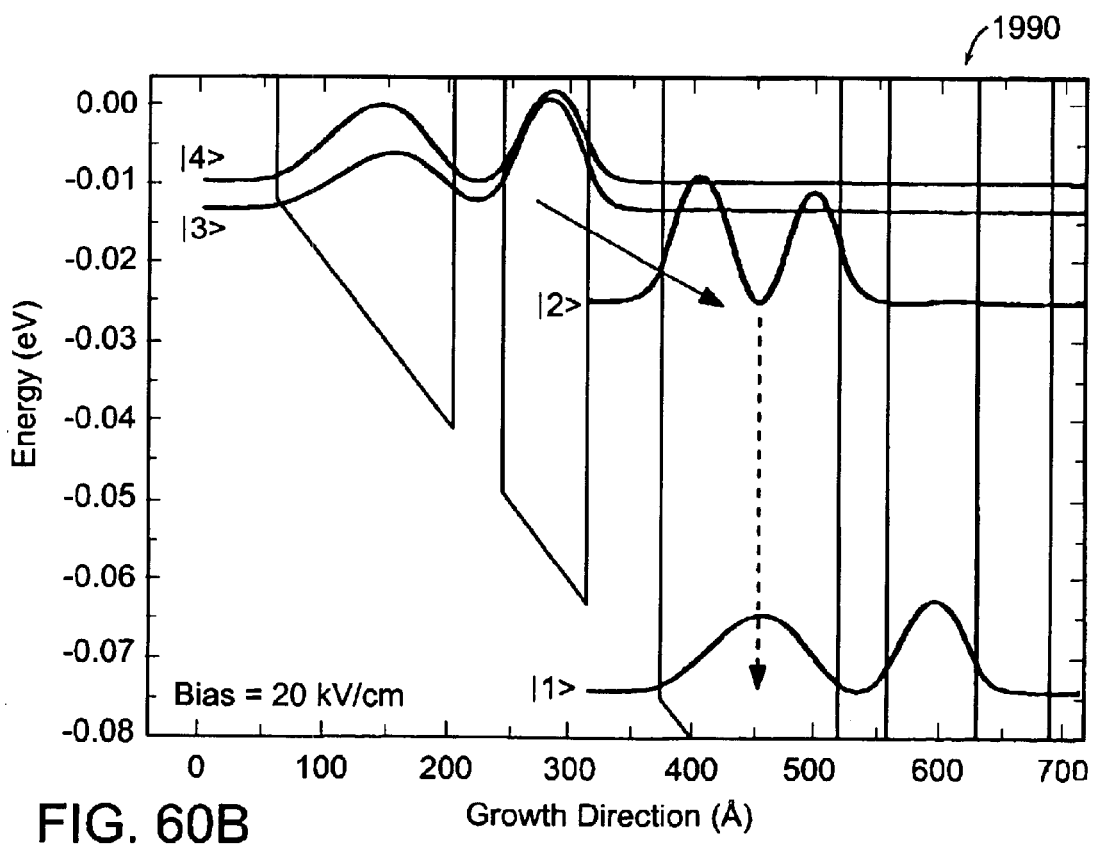

A preferred embodiment of the invention provides dual frequency THz emission from a GaAs/AlGaAs quantum cascade structure. This device utilizes the quantum confined Stark effect (QCSE) for the dual frequency emission and comprises forty periods of an asymmetric double quantum well (ADQW) structure. The energy levels of the ADQW structure are engineered to emit different frequency THz photons at two different biases. Preferably, a structure is selected to improve the oscillator strengths for the two desired transitions. The anticrossing of the energy levels, resonance with phonon energies, and electronic transition matrix elements are the three parameters considered while selecting a preferred cascade structure. Anticrossing is required for maximum injection efficiency between the periods, resonance with phonon energies is desirable for maximum depopulation of the lower level and optimized transition matrix elements are required for-maximizing the radiative transition. The inset in FIG. 59 shows the conduction band profile along with the layer thickness, wavefunctions and material compositions of the structure used for dual frequency emission. The variation in the intersubband energy level spacing in the cascade structure as a function of applied bias is shown in FIG. 59. Anticrossing occurs between levels $|3>$ and $|2>$ at 16 kV/cm and between levels $|4>$ and $|3>$ at 20 kV/cm (Level $|4>$ refers to the lowest energy level associated with the previous period. Emission occurs between levels $|4>$ and $|3>$ in the former embodiment and between levels $|3>$ and $|2>$ in the latter. It is this feature of the energy level configuration that permits dual frequency emission. The energy separation between levels $|2>$ and $|1>$ is an important parameter and has to be carefully designed to be in resonance with one of the higher energy AlAs-like phonon modes to ensure fast depopulation of level $|2>$. FIG. 60 illustrates the squared magnitude of the wavefunctions of the relevant energy levels involved in the THz emission at the two different biases of the device. A smaller overlap between the wavefunctions of the electronic states involved in the THz emission is selected. This is preferred so as to minimize the e-e interaction while maintaining sufficient oscillator strength. Since both the e-e scattering and the oscillator strength have a similar dependence on the wavefunction overlap, the parameter to be optimized is the net gain for a given device. The structure is selected for 6 meV emission between levels $|4>$ and $|3>$ at 16 kV/cm while the 12 meV emission occurs between levels $|3>$ and $|2>$ at 20 kV/cm. The calculated transition dipole matrix elements are 7.4 nm and 6.5 nm, respectively. At these biases, the energy level separation between levels $|2>$ and $|1>$ is 44 meV and 47 meV and the phonon-limited lifetime of level $|2>$ is ~0.8 ps and 0.05 ps, respectively, for the two embodiments. This is calculated and analyzed after taking into account the presence of confined as well as interface phonon modes in these systems. At low temperatures the lifetimes of level $|3>$ and $|4>$ are essentially determined by e-e interaction since phonon mediated transition is not energetically allowed for energy level separations corresponding to the THz range. Assuming that e-e interaction is the most dominant non-radiative mechanism, the lifetime of these levels is predicted to be in the order of ~10 ps. The bold arrow indicates the radiative transition and the dashed arrow indicates the phonon-mediated transition in FIG. 60.

The THz emitters are fabricated using solid source molecular beam epitaxy (MBE) on $n^+$GaAs substrates. Forty periods of the cascade structures are sandwiched between two $n^+(1.5 \times 10^{18}$ $cm^{-3})$ GaAs layers. The 40 Å barrier is slightly n-doped ($2 \times 10^{16}$ $cm^{-3}$) to minimize space charge effects. The heavily doped layers are placed on either side of the cascade structure to act as plasma reflectors to confine the THz mode. Once grown, the wafers are processed into emitter samples with the Indium alloyed into the back of the wafer during the growth process, serving as the back contact. Ni/Ge/Au grating with 15 μm periodicity and 50% fill factor is deposited on the top surface for output coupling and top ohmic contact. The emitters are made into samples of 1000 μm×1000 μm size.

Figure 61:
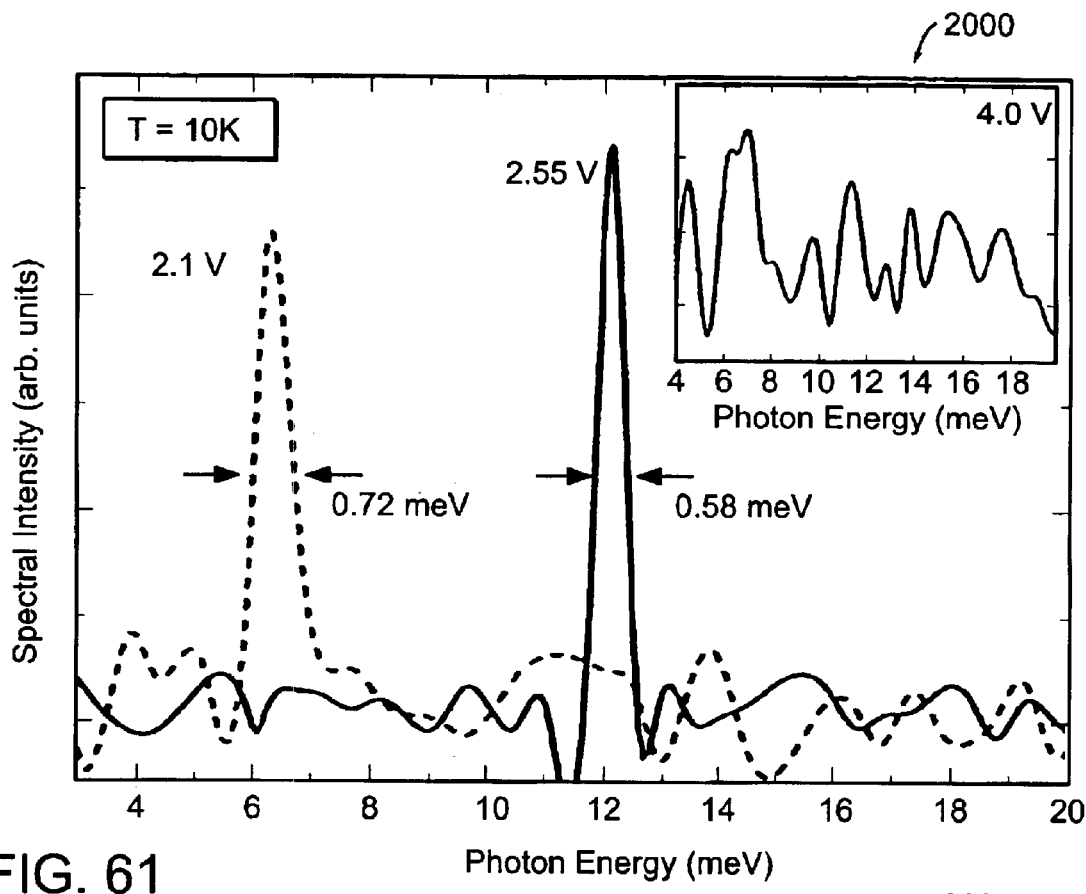
FIG. 61 illustrates electroluminescence spectra taken at T=10 K under an applied bias of 2.55 V showing emission at ~12.18 meV (corresponding to 2.9 THz or 101.8 $\mu$m) and at 2.1 V showing emission at ~6.32 meV (corresponding to 1.5 THz or 196.2 $\mu$m). The inset shows the spectrum taken at 4.0 V in accordance with a preferred embodiment of the present invention.

As described hereinbefore, a Bruker IFS 66V Fourier Transform infrared (FTIR) spectrometer is used in the step-scan mode to resolve the THz electroluminescence spectra. The structures are mounted on the cold finger of a He cryostat and the temperature is controlled using a Lakeshore DRC 93CA temperature controller. Current injection is provided by a HP 214A function generator set to give out 1 ms pulses at a repetition rate of 100 Hz, corresponding to 10% duty cycle. The electroluminescence signal is sent into the FTIR spectrometer, which is evacuated to avoid any losses due to water vapor. The resulting signal was collected by a Si bolometer cooled to 4.2 K. The output from the detector is fed into a lock in amplifier. Terahertz electroluminescence observed from the emitter at the two different biases at a temperature T=10 K are shown in FIG. 61. The device showed emission at 6.32 meV (1.5 THz) with a full width at half maximum (FWHM) of 0.72 meV and emission at 12.18 meV (2.9 THz) with FWHM of 0.58 meV at T=10 K. To verify that the THz emission is occurring due to the desired intersubband transitions within the conduction band of the cascade structure, the emission spectrum is measured at higher bias. The spectrum obtained at higher bias is shown in the inset in FIG. 61. Multiple peaks arising from severe misalignment of the various energy levels associated with the entire cascade structure are observed. The dominant single peak emission observed at the two biases coincide with the theoretically predicted values and hence can clearly be ascribed to the specific intersubband transition occurring between levels $|4>$ and $|3>$ and between $|3>$ and $|2>$ in each period of the multiple quantum well structure.

Figure 62:
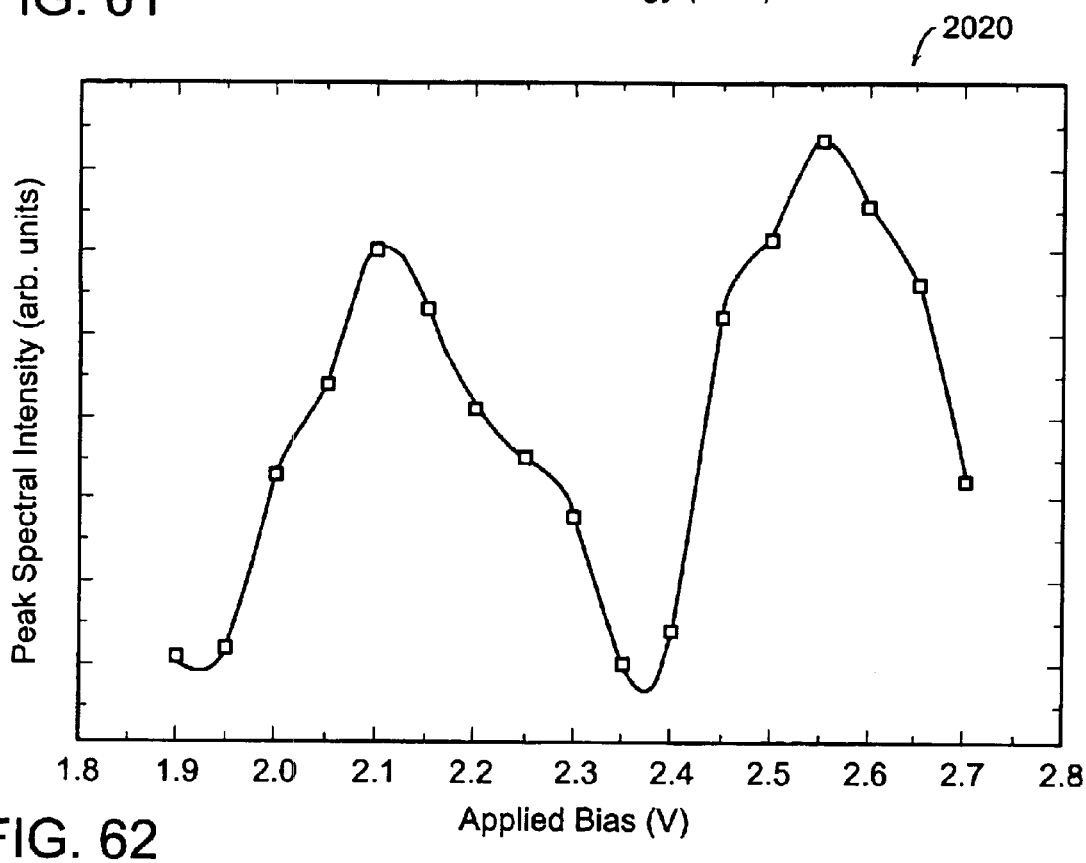
FIG. 62 illustrates graphically the experimentally observed variation in peak intensity of the electroluminescence signal as a function of applied bias. Two distinct peaks are observed at 2.1 V and at 2.55 V corresponding to the two different THz emissions observed from the cascade structure in accordance with a preferred embodiment of the present invention.

The peak intensity of emission as a function of the applied bias to verify the optimization of the device for dual frequency emission is also analyzed. The frequency of the emission peak shifted with applied bias due to QCSE, but the intensity of electroluminescence was most efficient at 2.1 V and 2.55 V, as shown in FIG. 62. Two distinct peaks are evident for the emission at 2.1 V (corresponding to emission at 6.32 meV) and at 2.55 V (corresponding to emission at 12.18 meV). For the particular device comprising of 40 periods with the length of each period equal to 314 Å, these biases correspond to 16.7 kV/cm and 20.3 kV/cm, respectively. From FIG. 60 it can be seen that these values of the applied biases are indeed close to the theoretically designed values at which emission between levels $|4>$ and $|3>$ in the former embodiment and between $|3>$ and $|2>$ in the latter are expected.

Thus, a dual frequency THz emission occurs from a quantum cascade structure at 6.32 meV and 12.18 meV with FWHM of 0.72 meV and 0.58 meV at T=10K. The dual frequency emission occurs from the same cascade structure at two different biases. The variation of the experimentally observed emission peak intensity as a function of applied voltage clearly indicates the capability of the device to emit at two frequencies. Further, the 6.32 meV (corresponding to 196.2 μm) emission is the longest wavelength emission reported by any cascade structure to date.

Figure 63:
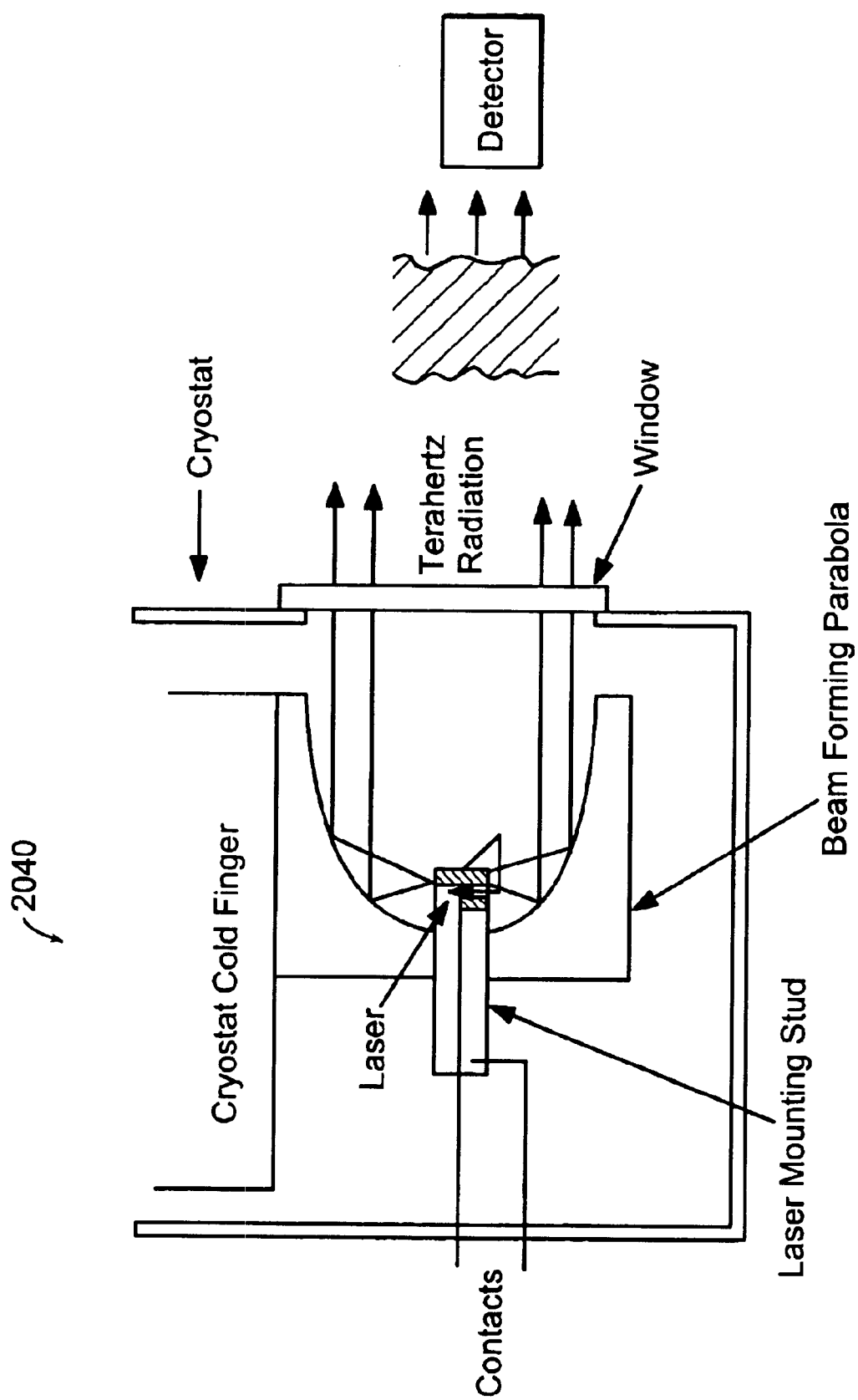
FIG. 63 is a schematic illustrating a phonon mediated intersubband (PMI) laser mounted in liquid helium or liquid nitrogen cryostat in accordance with a preferred embodiment of the present invention.

FIG. 63 is a schematic diagram of a PMI laser mounted in liquid Helium or liquid Nitrogen cryostat in accordance with a preferred embodiment of the present invention. The preferred embodiment of the PMI laser consists of mounting a circular disk of material etched from a PMI wafer onto an OFC stud. The process consists of forming standard Ohmic metal contacts on both sides of the laser and soldering one side of the disk to the stud with indium. The stud is constructed in such a way that it serves as the mounting structure, the heat sink structure and the wire contact structure. The stud is used to position the PMI laser disk at the focus of the metal parabola. The stud, metal parabola and coldfinger are in intimate contact to promote the heat sinking of the disk. A temperature measuring device such as a thermistor may also be added to the stud in an preferred embodiment. Intimate contact of the stud to the parabola is made with a thermal compound and the contact between the parabola and coldfinger is made with crushed indium sheet or other acceptable standard practice.

The PMI disk laser is a circular cylinder, edge emitting device with a waveguide structure and coupled quantum well layer structure as described hereinabove. The device can be mounted either top side down or substrate side down depending on the heat load and temperature required for the particular device. The disk itself can be formed with a variety of dry etching techniques including, but not limited to, reactive ion etching, chemical beam assisted etching, and plasma etching. Since the wavelength of the devices are very large, standard photolithographic processes can be used to define the disk pattern for etching and contacts. Using this design, the entire system, including cryostat, has cylindrical dimensions of about 3 inches in diameter, a height of about 5 or 6 inches and weigh about 2 lbs. The terahertz radiation is detected using a light detection system downstream of the laser.

Figure 64:
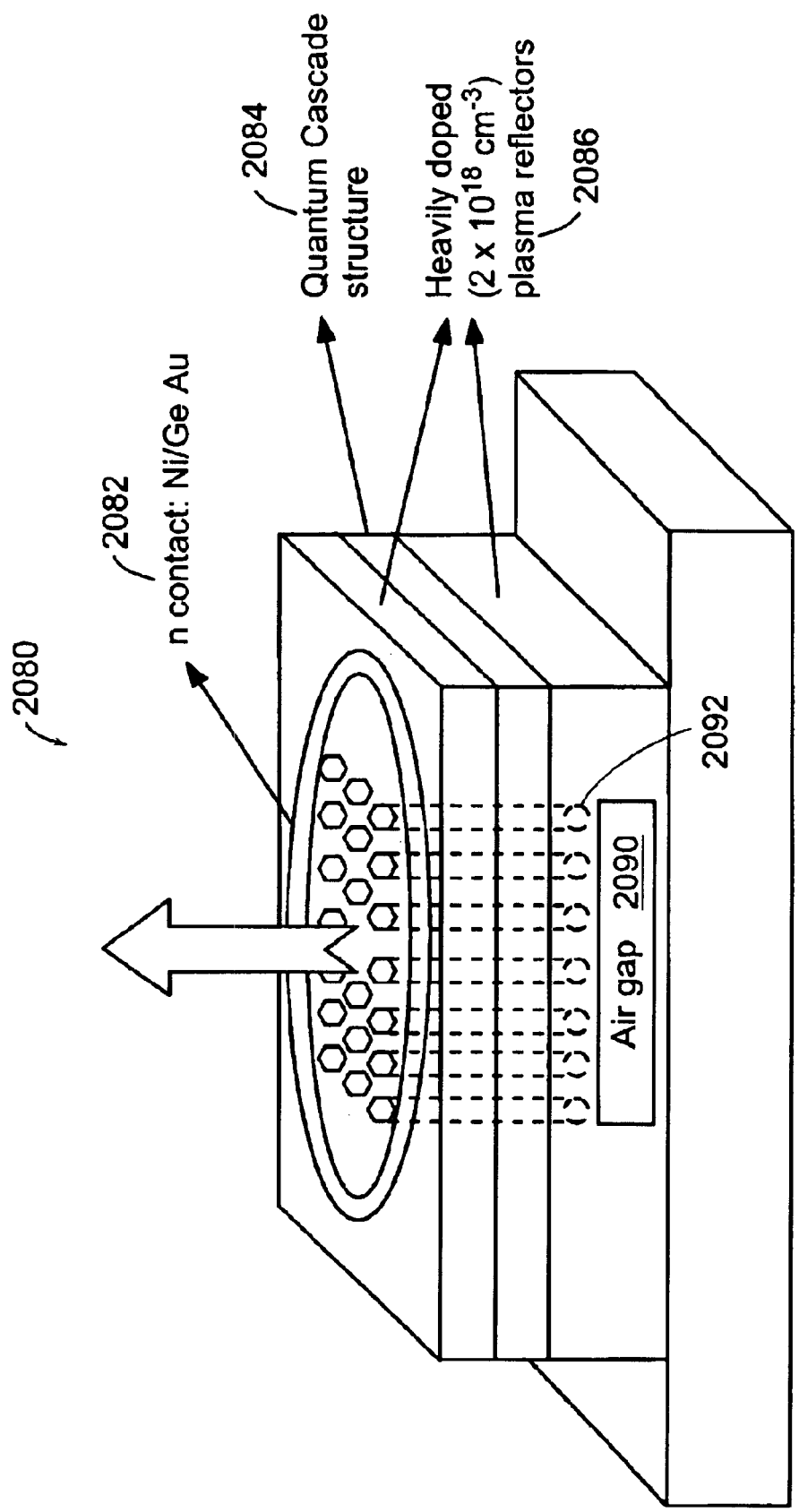
FIG. 64 illustrates a quantum cascade structure for surface emitting including multiple quantum wells between plasma reflectors in accordance with a preferred embodiment of the present invention.

FIG. 64 illustrates a quantum cascade structure 2080 for surface emitting including multiple quantum wells between plasma reflectors in accordance with a preferred embodiment of the present invention. In the preferred embodiment the device is fabricated on a n$^+$GaAs substrate. The quantum cascade structure includes multiple quantum wells sandwiched between two heavily doped plasma reflectors that help in confinement of the THz radiation in the vertical direction. Holes 2092 that extend through the active region and into the middle of the lower plasma reflector are drilled using Electron Beam Lithography thereby forming a photonic crystal. The photonic crystals provide optical mode confinement. The holes are patterned in a hexagonal lattice with a defect at the center wherein the defect is lack of a hole. This defect acts as a location of output coupling of the radiation. The presence of the photonic crystal helps in confining the THz radiation in the lateral direction thereby minimizing the material loss. The air gap 2090 at the bottom reflects the radiation.

Figure 65:
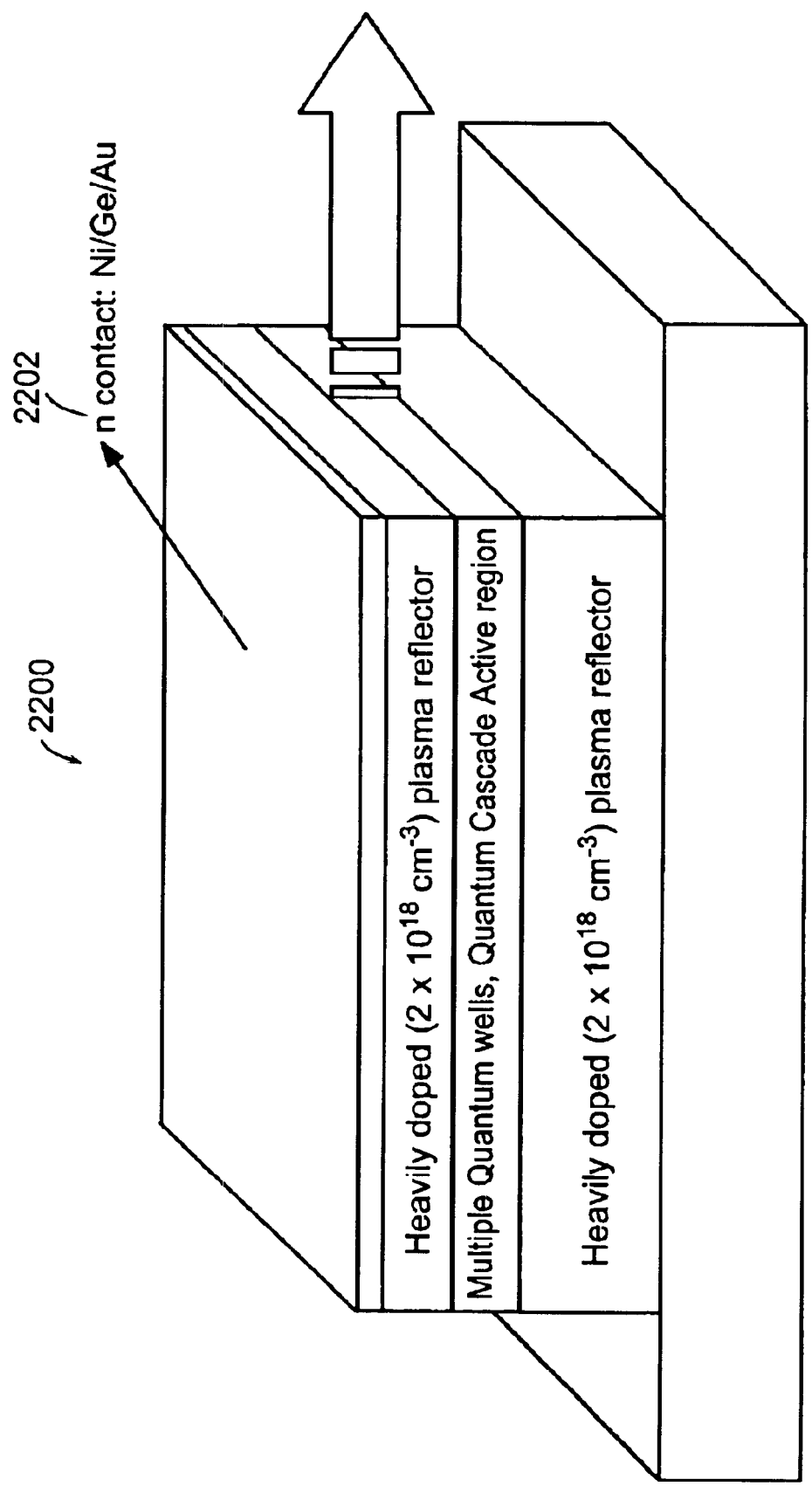
FIG. 65 illustrates a waveguide using plasma reflectors that assist in confinement of THz radiation in the vertical direction in accordance with a preferred embodiment of the present invention.

FIG. 65 illustrates a waveguide 2200 using plasma reflectors that assist in confinement of THz radiation in the vertical direction in accordance with a preferred embodiment of the present invention. In the preferred embodiment, the device is fabricated on a n$^+$GaAs substrate. The quantum cascade structure includes multiple quantum wells sandwiched between two heavily doped plasma reflectors that help in confinement of the THz radiation in the vertical direction. The radiation being primarily TM polarized, is guided along the active region and gets coupled out at the edge.

An alternate preferred embodiment of the present invention includes a compact phonon-mediated quantum-cascade terahertz (THz) laser for upper atmosphere, and exo-atmospheric high-resolution radar applications. The sensitive THz mixer technology provides a source that immediately permits the design of tracking, identification, and active seeker systems with an order-of-magnitude improvement in resolution when compared with even the highest frequency (W-band) radar systems currently available. For example, a 3 THz seeker achieves a resolution of better than 3 mm×3 mm (range and cross-range) with a modest 2% bandwidth, and only 0.25 degrees of required angular integration.

While atmospheric absorption (due primarily to water vapor) at THz frequencies severely restricts many ground-based and air-to-ground uses, upper atmosphere and exo-atmospheric applications are plentiful as space becomes an operational military arena. THz radar systems are important in space applications where targets are, for the most part, small, with fine details. For example, the free-space radar transmission equation can be used for a rough estimate of the potential for THz seekers in exo-atmospheric applications:

$$P_r/P_t = G_t G_r \sigma \lambda^2/(4\pi)^3 R^4 \tag{53}$$

where $P_r$=received signal power, $P_t$=transmitted signal power, σ=target radar cross section (RCS), $G_t$=transmitting antenna power gain, $G_r$=receiving antenna power gain, λ=wavelength and R=range to target.

For a 100 milliwatt CW coherent source at 3 THz, the equation predicts that a 1(meter)$^2$ RCS target can be detected at a range of 500 kilometers in several seconds of coherent signal integration using existing THz mixers. Depending on the trajectory of the seeker and target, an extremely high-resolution SAR-type image can be formed over the same time duration. This result assumes the seeker employs a 10-inch-diameter, transmitting/receiving antenna, with antenna gain $G_t=G_r=4\pi A/\lambda^2$.

While the THz seeker has considerable advantage in resolution, RCS amplitude of the treat target versus microwave-based seekers, it is also superior to active mid or near infrared seekers. The inherent bandwidth and ultimate sensitivity of THz Schottky diode mixers is greater than that of infrared mixers and, in the case of sensitivity, this is a fundamental limit.

The preferred embodiment includes fabrication devices that produce 20 to 100 mW of radiation at an operating temperature at or near 77K. Wavefunction engineered design is important in producing THz QCLs. The preferred embodiments dramatically reduce the size and cost of coherent THz sources.

Using the preferred embodiment for extending the lasing wavelength of CW, quantum cascade (QC) lasers from the near to the mid-infrared, to the THz region, region of the electromagnetic spectrum provides a type of compact semiconductor device that can be extended into the THz region with power levels sufficient for radar applications.

The claims should not be read as limited to the described order or elements unless stated to that effect. Therefore, all embodiments that come within the scope and spirit of the following claims and equivalents thereto are claimed as the invention.

What is claimed:

1. A semiconductor heterostructure laser, comprising:
a first cladding layer;
a second cladding layer parallel to, and opposing, the first cladding layer such that a cavity is formed therebetween;
a quantum cascade structure in the cavity comprising:
a first lasing level; and a second lasing level, having interface phonons associated therewith for facilitating depletion of the second lasing level.

2. The semiconductor device of claim 1 having a plurality of quantum well structures in a Fabry Perot cavity.

3. The semiconductor device of claim 1 having at least one emission at a wavelength of at least 30 µm.

4. The semiconductor device of claim 3 having a first emission having a first energy level and a second emission having a second energy level.

5. The semiconductor device of claim 1 further comprising a plurality of quantum cascade emitters embedded in a structure having photonic crystals.

6. The semiconductor device of claim 1 further comprising at least one plasma reflector to confine device emissions.

7. The semiconductor device of claim 1 comprising a preferred range of a threshold current being between 0.001 amps/cm$^2$ and 100,000 amps/cm$^2$.

8. The semiconductor device of claim 1 wherein the device is portable and weighs approximately less than five pounds.

9. The semiconductor device of claim 1 wherein the device is tunable with respect to wavelengths.

10. The semiconductor device of claim 1 having a plurality of quantum dot structures.

11. The semiconductor device of claim 1 having a plurality of mini-bands in a semiconductor superlattice structure.

12. The semiconductor device of claim 1 having a plurality of quantum wire structures.

13. A semiconductor laser device comprising:

an active layer comprising a quantum cascade structure having a plurality of quantum wells and barriers, the active layer further using interface phonons for depopulating at least one of the wells; and an upper cladding layer and a lower cladding layer sandwiching the active layer.

14. The semiconductor laser device of claim 13 wherein the plurality of quantum wells comprise of:

gallium arsenide such as one of at least 104Å, 62Å and 72 Å gallium arsenide.

15. The semiconductor laser device of claim 13 wherein the plurality of barriers comprises $Al_xGa_{1-x}As$.

16. The semiconductor laser device of claim 13 further comprising a grating disposed as a contact.

17. The semiconductor laser device of claim 16 wherein the grating comprises a metal such as, for example, nickel, germanium and gold.

18. The semiconductor laser device of claim 13 having at least a first emission having a first energy level and a second emission having a second energy level.

19. The semiconductor laser device of claim 13 further comprising at least one plasma reflector to confine device emissions.

20. The semiconductor laser device of claim 13 having at least one emission in a terahertz radiation region and in a far infrared region of an electromagnetic spectrum.

21. The semiconductor laser device of claim 13 further comprising the quantum cascade structure embedded in a structure having photonic crystals.

22. A semiconductor heterostructure light emitting device, comprising:

a quantum cascade structure;

a first lasing level associated with the quantum cascade structure; and a second lasing level associated with the quantum cascade structure, the second lasing level having interface phonons for depleting the second lasing level, a first emission associated with the quantum cascade structure and having a first wavelength, and a second emission associated with the quantum cascade structure and having a second wavelength.

23. The semiconductor device of claim 22 having a plurality of quantum well structures.

24. The semiconductor device of claim 22 having at least one emission at a wavelength of at least 30 µm.

25. The semiconductor device of claim 22 further comprising a plurality of quantum cascade emitters embedded in a structure having photonic crystals.

26. The semiconductor device of claim 22 further comprising at least one plasma reflector to confine device emissions.

27. The semiconductor device of claim 22 comprising a preferred range of a threshold current being between 0.001 amps/cm$^2$ and 100,000 amps/cm$^2$.

28. The semiconductor device of claim 22 wherein the device is portable and weighs approximately less than five pounds.

29. The semiconductor device of claim 22 wherein the device is tunable with respect to wavelengths.

30. The semiconductor device of claim 22 having a plurality of quantum dot structures.

31. The semiconductor device of claim 22 having a plurality of mini-bands in a semiconductor superlattice structure.

32. The semiconductor device of claim 22 having a plurality of quantum wire structures.

* * * * *